(12) United States Patent
Yamazaki et al.

(10) Patent No.: US 8,811,067 B2
(45) Date of Patent: Aug. 19, 2014

(54) SEMICONDUCTOR DEVICE

(71) Applicant: Semiconductor Energy Laboratory Co., Ltd., Atsugi (JP)

(72) Inventors: Shunpei Yamazaki, Tokyo (JP); Jun Koyama, Kanagawa (JP); Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/183,644

(22) Filed: Feb. 19, 2014

(65) Prior Publication Data

US 2014/0169072 A1  Jun. 19, 2014

Related U.S. Application Data

(63) Continuation of application No. 13/647,543, filed on Oct. 9, 2012, now Pat. No. 8,659,934, which is a continuation of application No. 12/917,557, filed on Nov. 2, 2010, now Pat. No. 8,289,753.

(30) Foreign Application Priority Data

Nov. 6, 2009 (JP) .................................. 2009-255448

(51) Int. Cl.
*G11C 11/24* (2006.01)
(52) U.S. Cl.
USPC ................. 365/149; 365/185.23; 365/189.09; 365/63; 365/189.07
(58) Field of Classification Search
CPC ...... G11C 11/5628; G11C 16/10; G11C 8/00; G11C 8/12
USPC ............. 365/149, 185.23, 189.09, 63, 189.07
See application file for complete search history.

(56) References Cited

U.S. PATENT DOCUMENTS

| 4,466,081 A | 8/1984 | Masuoka |
| 5,112,765 A | 5/1992 | Cederbaum et al. |
| 5,349,366 A | 9/1994 | Yamazaki |

(Continued)

FOREIGN PATENT DOCUMENTS

| CN | 100429702 C | 10/2008 |
| EP | 0469215 A | 2/1992 |

(Continued)

OTHER PUBLICATIONS

Nowatari, H et al., "60.2: Intermediate Connector With Suppressed Voltage Loss for White Tandem OLEDs,"SID Digest '09 : SID International Symposium Digest of Technical Papers, May 31, 2009, vol. 40, pp. 899-902.

(Continued)

*Primary Examiner* — Tuan T Nguyen
(74) *Attorney, Agent, or Firm* — Fish & Richardson, P.C.

(57) ABSTRACT

An object is to provide a semiconductor device having a novel structure. A first wiring; a second wiring; a third wiring, a fourth wiring; a first transistor including a first gate electrode, a first source electrode, and a first drain electrode; a second transistor including a second gate electrode, a second source electrode, and a second drain electrode are included. The first transistor is provided over a substrate including a semiconductor material and a second transistor includes an oxide semiconductor layer.

19 Claims, 34 Drawing Sheets

(56) References Cited

U.S. PATENT DOCUMENTS

| | | |
|---|---|---|
| 5,652,728 A | 7/1997 | Hosotani et al. |
| 5,731,856 A | 3/1998 | Kim |
| 5,744,864 A | 4/1998 | Cillessen |
| 5,748,538 A * | 5/1998 | Lee et al. ............... 365/185.06 |
| 6,127,702 A | 10/2000 | Yamazaki |
| 6,294,274 B1 | 9/2001 | Kawazoe |
| 6,307,788 B1 | 10/2001 | Tanaka |
| 6,317,365 B1 | 11/2001 | Tanaka |
| 6,563,174 B2 | 5/2003 | Kawasaki |
| 6,603,681 B2 * | 8/2003 | Micheloni et al. ....... 365/185.19 |
| 6,727,522 B1 | 4/2004 | Kawasaki |
| 6,798,006 B2 | 9/2004 | Amo |
| 6,831,866 B1 | 12/2004 | Kirihata |
| 7,049,190 B2 | 5/2006 | Takeda |
| 7,061,014 B2 | 6/2006 | Hosono |
| 7,064,346 B2 | 6/2006 | Kawasaki |
| 7,105,868 B2 | 9/2006 | Nause |
| 7,139,214 B2 | 11/2006 | Atwood et al. |
| 7,211,825 B2 | 5/2007 | Shih |
| 7,282,782 B2 | 10/2007 | Hoffman |
| 7,297,977 B2 | 11/2007 | Hoffman |
| 7,323,356 B2 | 1/2008 | Hosono |
| 7,339,235 B1 | 3/2008 | Yamazaki |
| 7,385,224 B2 | 6/2008 | Ishii |
| 7,391,667 B2 | 6/2008 | Atwood et al. |
| 7,402,506 B2 | 7/2008 | Levy |
| 7,411,209 B2 | 8/2008 | Endo |
| 7,453,065 B2 | 11/2008 | Saito |
| 7,453,087 B2 | 11/2008 | Iwasaki |
| 7,462,862 B2 | 12/2008 | Hoffman et al. |
| 7,468,304 B2 | 12/2008 | Kaji |
| 7,501,293 B2 | 3/2009 | Ito |
| 7,542,326 B2 | 6/2009 | Yoshimura |
| 7,674,650 B2 | 3/2010 | Akimoto |
| 7,732,819 B2 | 6/2010 | Akimoto |
| 7,791,074 B2 | 9/2010 | Iwasaki |
| 7,935,582 B2 | 5/2011 | Iwasaki |
| 7,956,361 B2 | 6/2011 | Iwasaki |
| 8,154,024 B2 | 4/2012 | Iwasaki |
| 8,202,365 B2 | 6/2012 | Umeda |
| 8,212,248 B2 | 7/2012 | Itagaki |
| 8,742,412 B2 | 6/2014 | Goyal et al. |
| 2001/0046027 A1 | 11/2001 | Tai |
| 2002/0056838 A1 | 5/2002 | Ogawa |
| 2002/0132454 A1 | 9/2002 | Ohtsu |
| 2003/0189401 A1 | 10/2003 | Kido |
| 2003/0218222 A1 | 11/2003 | Wager |
| 2004/0038446 A1 | 2/2004 | Takeda |
| 2004/0127038 A1 | 7/2004 | Carcia |
| 2004/0129963 A1 | 7/2004 | Amo |
| 2005/0017302 A1 | 1/2005 | Hoffman |
| 2005/0199959 A1 | 9/2005 | Chiang |
| 2006/0035452 A1 | 2/2006 | Carcia |
| 2006/0043377 A1 | 3/2006 | Hoffman |
| 2006/0091793 A1 | 5/2006 | Baude |
| 2006/0108529 A1 | 5/2006 | Saito |
| 2006/0108636 A1 | 5/2006 | Sano |
| 2006/0110867 A1 | 5/2006 | Yabuta |
| 2006/0113536 A1 | 6/2006 | Kumomi |
| 2006/0113539 A1 | 6/2006 | Sano |
| 2006/0113549 A1 | 6/2006 | Den |
| 2006/0113565 A1 | 6/2006 | Abe |
| 2006/0169973 A1 | 8/2006 | Isa |
| 2006/0170111 A1 | 8/2006 | Isa |
| 2006/0197092 A1 | 9/2006 | Hoffman |
| 2006/0208977 A1 | 9/2006 | Kimura |
| 2006/0228974 A1 | 10/2006 | Thelss |
| 2006/0231882 A1 | 10/2006 | Kim |
| 2006/0238135 A1 | 10/2006 | Kimura |
| 2006/0244107 A1 | 11/2006 | Sugihara |
| 2006/0284171 A1 | 12/2006 | Levy |
| 2006/0284172 A1 | 12/2006 | Ishii |
| 2006/0292777 A1 | 12/2006 | Dunbar |
| 2007/0024187 A1 | 2/2007 | Shin |
| 2007/0046191 A1 | 3/2007 | Saito |
| 2007/0052025 A1 | 3/2007 | Yabuta |
| 2007/0054507 A1 | 3/2007 | Kaji |
| 2007/0090365 A1 | 4/2007 | Hayashi |
| 2007/0108446 A1 | 5/2007 | Akimoto |
| 2007/0152217 A1 | 7/2007 | Lai |
| 2007/0172591 A1 | 7/2007 | Seo |
| 2007/0187678 A1 | 8/2007 | Hirao |
| 2007/0187760 A1 | 8/2007 | Furuta |
| 2007/0194379 A1 | 8/2007 | Hosono |
| 2007/0252928 A1 | 11/2007 | Ito |
| 2007/0272922 A1 | 11/2007 | Kim |
| 2007/0287296 A1 | 12/2007 | Chang |
| 2008/0006877 A1 | 1/2008 | Mardilovich |
| 2008/0038882 A1 | 2/2008 | Takechi |
| 2008/0038929 A1 | 2/2008 | Chang |
| 2008/0049487 A1 | 2/2008 | Yoshimura |
| 2008/0050595 A1 | 2/2008 | Nakagawara |
| 2008/0073653 A1 | 3/2008 | Iwasaki |
| 2008/0083950 A1 | 4/2008 | Pan |
| 2008/0106191 A1 | 5/2008 | Kawase |
| 2008/0119018 A1 | 5/2008 | Toyota |
| 2008/0128689 A1 | 6/2008 | Lee |
| 2008/0129195 A1 | 6/2008 | Ishizaki |
| 2008/0166834 A1 | 7/2008 | Kim |
| 2008/0182358 A1 | 7/2008 | Cowdery-Corvan |
| 2008/0224133 A1 | 9/2008 | Park |
| 2008/0254569 A1 | 10/2008 | Hoffman |
| 2008/0258139 A1 | 10/2008 | Ito |
| 2008/0258140 A1 | 10/2008 | Lee |
| 2008/0258141 A1 | 10/2008 | Park |
| 2008/0258143 A1 | 10/2008 | Kim |
| 2008/0296568 A1 | 12/2008 | Ryu |
| 2008/0315193 A1 | 12/2008 | Kim |
| 2009/0002590 A1 | 1/2009 | Kimura |
| 2009/0008638 A1 | 1/2009 | Kang |
| 2009/0045397 A1 | 2/2009 | Iwasaki |
| 2009/0068773 A1 | 3/2009 | Lai |
| 2009/0073325 A1 | 3/2009 | Kuwabara |
| 2009/0114910 A1 | 5/2009 | Chang |
| 2009/0134399 A1 | 5/2009 | Sakakura |
| 2009/0152506 A1 | 6/2009 | Umeda |
| 2009/0152541 A1 | 6/2009 | Maekawa |
| 2009/0278122 A1 | 11/2009 | Hosono |
| 2009/0280600 A1 | 11/2009 | Hosono |
| 2010/0065844 A1 | 3/2010 | Tokunaga |
| 2010/0092800 A1 | 4/2010 | Itagaki |
| 2010/0097838 A1 | 4/2010 | Tanaka |
| 2010/0097845 A1 * | 4/2010 | Sakimura et al. ............. 365/158 |
| 2010/0103726 A1 * | 4/2010 | Bae et al. ...................... 365/163 |
| 2010/0109002 A1 | 5/2010 | Itagaki |
| 2010/0193785 A1 | 8/2010 | Kimura |
| 2010/0276685 A1 | 11/2010 | Itagaki |
| 2010/0276689 A1 | 11/2010 | Iwasaki |
| 2010/0279462 A1 | 11/2010 | Iwasaki |
| 2012/0075917 A1 * | 3/2012 | Takemura .................... 365/149 |
| 2012/0295399 A1 | 11/2012 | Kim |

FOREIGN PATENT DOCUMENTS

| | | |
|---|---|---|
| EP | 1 737 044 A1 | 12/2006 |
| EP | 2 226 847 A2 | 9/2010 |
| EP | 2 339 639 A2 | 6/2011 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 63-268184 A | 11/1988 |
| JP | 05-119298 A | 5/1993 |
| JP | 05-251705 A | 9/1993 |
| JP | 06-013576 A | 1/1994 |
| JP | 08-147968 A | 6/1996 |
| JP | 08-264794 A | 10/1996 |
| JP | 10-093100 A | 4/1998 |
| JP | 11-016344 A | 1/1999 |
| JP | 11-505377 T | 5/1999 |

(56) References Cited

FOREIGN PATENT DOCUMENTS

| | | |
|---|---|---|
| JP | 2000-012704 A | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-214512 A | 7/2004 |
| JP | 2004-273614 A | 9/2004 |
| JP | 2004-273732 A | 9/2004 |
| JP | 2005-243059 A | 9/2005 |
| JP | 2006-165532 A | 6/2006 |
| JP | 2007-103918 A | 4/2007 |
| JP | 2008-129314 A | 6/2008 |
| JP | 2009-004787 A | 1/2009 |
| JP | 2009-016844 A | 1/2009 |
| JP | 2009-033145 A | 2/2009 |
| JP | 2009-164393 A | 7/2009 |
| JP | 2009-167087 A | 7/2009 |
| JP | 2009-182194 A | 8/2009 |
| JP | 2009-206508 A | 9/2009 |
| WO | WO 2004/114391 A1 | 12/2004 |
| WO | WO-2005/089086 | 9/2005 |
| WO | WO 2007/029844 A1 | 3/2007 |
| WO | WO 2009/087943 A1 | 7/2009 |
| WO | WO-2009/096608 | 8/2009 |

OTHER PUBLICATIONS

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Atwood, B et al., "SESO Memory: A CMOS compatible high density embedded memory technology for mobile applications," 2002 Symposium on VLSI Circuits Digest of Technical Papers, 2002, pp. 154-155.

Ishii, T et al., "SESO Memory: A 3T Gain Cell Solution Using Ultra Thin Silicon Film for Dense and Low Power Embedded Memories," IEEE 2004 Custom Integrated Circuits Conference, pp. 457-463.

International Search Report, PCT Application No. PCT/JP2010/069120, dated Feb. 8, 2011, 3 pages.

Written Opinion, PCT Application No. PCT/JP2010/069120, dated Feb. 8, 2011, 5 pages.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

(56) References Cited

OTHER PUBLICATIONS

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the In2O3 and SC2O3-A2O3-BO Systems [a; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=in,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Chinese Office Action (Application No. 201080049931.0) Dated Feb. 8, 2014.

* cited by examiner

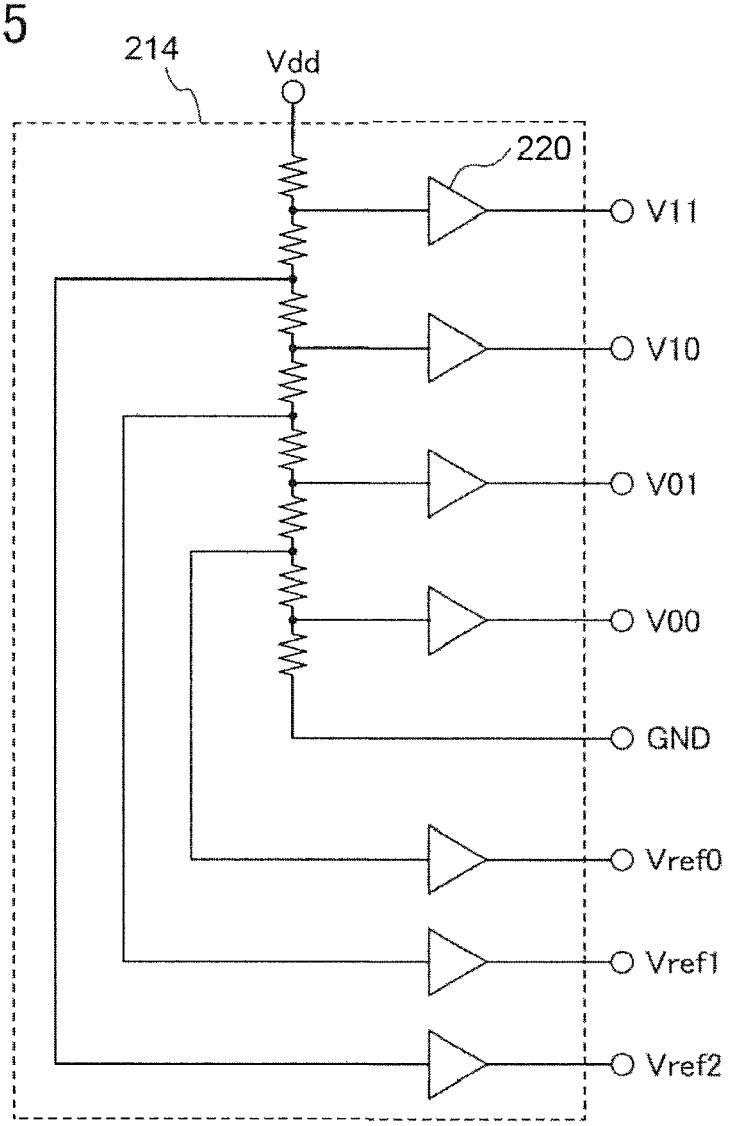

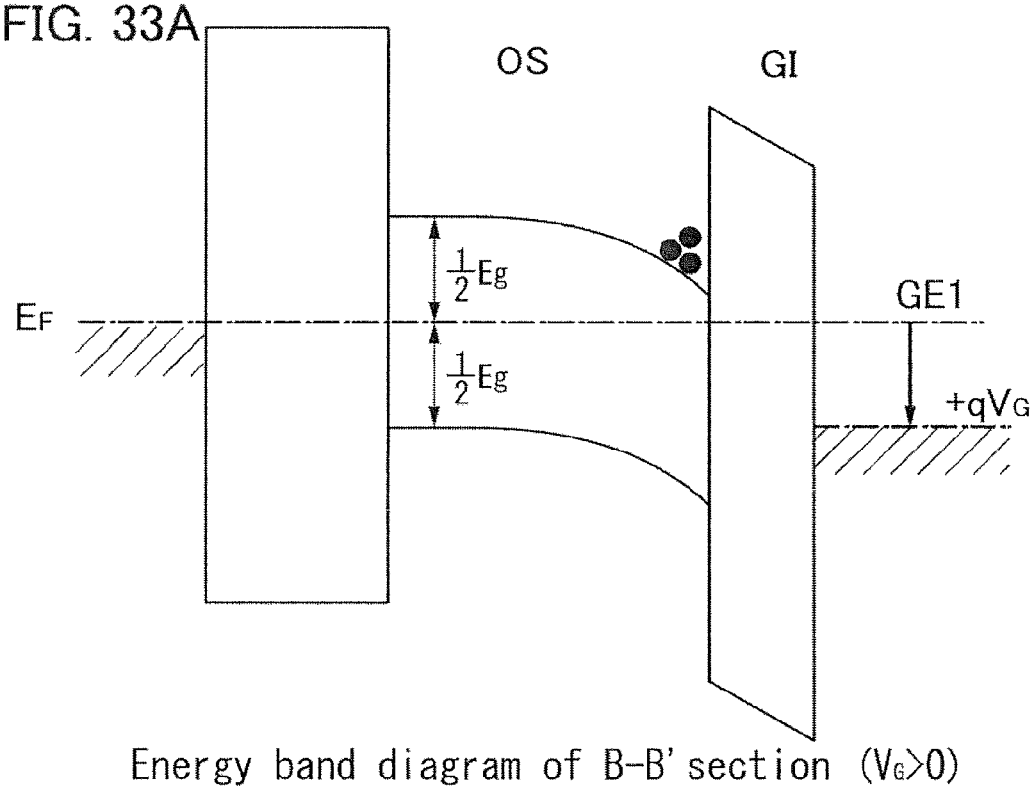
Energy band diagram of B-B' section ($V_G > 0$)
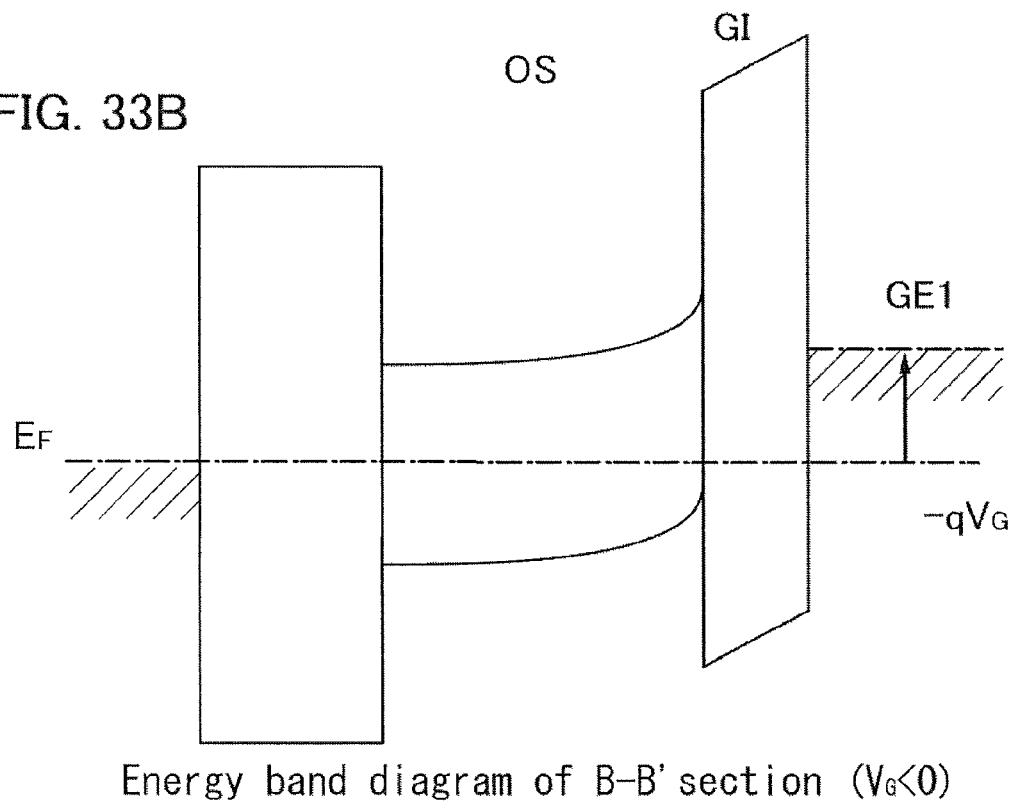
Energy band diagram of B-B' section ($V_G < 0$)

SEMICONDUCTOR DEVICE

CROSS-REFERENCE TO RELATED APPLICATIONS

This application is a continuation of U.S. application Ser. No. 13/647,543, filed Oct. 9, 2012, now allowed, which is a continuation of U.S. application Ser. No. 12/917,557, filed Nov. 2, 2010, now U.S. Pat. No. 8,289,753, which claims the benefit of a foreign priority application filed in Japan as Serial No. 2009-255448 on Nov. 6, 2009, all of which are incorporated by reference.

TECHNICAL FIELD

The present invention relates to a semiconductor device using semiconductor elements and a manufacturing method thereof

BACKGROUND ART

Memory devices using semiconductor elements are roughly classified into volatile memory devices that lose their stored contents when power supply is stopped and non-volatile memory devices that can retain their stored contents even when power supply is stopped.

As a typical example of a volatile memory device, a dynamic random access memory (DRAM) is given. In a DRAM, a transistor included in a memory element is selected and a charge is accumulated in a capacitor, so that data is stored.

Owing to the above-described principle, charge in a capacitor is lost when data is read out in a DRAM; thus, it is necessary to perform writing again so that data is stored again after reading data. In addition, there is leakage current in a transistor included in a memory element and charge stored, in the capacitor flows or a charge flows into the capacitor even if the transistor is not selected, whereby data retention period is short. Therefore, it is necessary to perform writing again in a predetermined cycle (refresh operation) and it is difficult to reduce power consumption sufficiently. Further, since memory content is lost when the power is not supplied to a DRAM, another memory device using a magnetic material or an optical material is needed to stored memory for a long period.

As another example of a volatile memory device, a static random access memory (SRAM) is given. In an SRAM, stored contents are retained using a circuit such as a flip flop, so that refresh operation is not needed. In view of this point, an SRAM is more advantageous than a DRAM. However, there is a problem in that a cost per storage capacity becomes high because a circuit such as a flip flop is used. Further, in view of the point that stored contents are lost when the power is not supplied, an SRAM is not superior to a DRAM.

As a typical example of a non-volatile memory device, a flash memory is given. A flash memory includes a floating gate between a gate electrode and a channel formation region in a transistor. A flash memory stores memory by retaining charge in the floating gate, so that a data retention period is extremely long (semi-permanent), and thus, has an advantage that refresh operation, which is necessary in a volatile memory device, is not needed (for example, see Patent Document 1).

However, in a flash memory, there is a problem in that a memory element does not function after performing writing a predetermined number of times because a gate insulating layer included in the memory element is deteriorated due to tunnel current which occurs when performing writing. In order to relieve an effect of this problem, for example, a method of equalizing the number of writing operations for memory elements is employed, for example. However, a complicated peripheral circuit is needed to realize the method. Even if such a method is employed, the basic problem of lifetime is not resolved. That is, a flash memory is unsuitable for application in which data is written with high frequency.

Further, high voltage is required to retain charge in the floating gate or to remove the charge in the floating gate. Furthermore, a relatively long time is required for retaining or removing a charge and the speed of writing and erasing cannot easily be increased,

REFERENCE

Patent Document

[Patent Document 1]
Japanese Published Patent Application No. S57-105889

DISCLOSURE OF INVENTION

In view of the above problem, an object of an embodiment of the present invention is to provide a semiconductor device which has a novel structure being capable of retaining stored contents in the state where power is not supplied and having no limitation on the number of times of writing.

An embodiment of the present invention is a semiconductor device having a stack including a transistor using an oxide semiconductor and a transistor using a material other than an oxide semiconductor. For example, the semiconductor device can employ the following structures.

An embodiment of the present invention is a semiconductor device including a source line, a bit line, a first signal line, a plurality of second signal lines, a plurality of word lines, a plurality of memory cells connected to each other in parallel between the source line and the bit line, a driver circuit for the second signal lines and the word lines to which an address signal is input, and which drives the plurality of second signal lines and the plurality of word lines so that a memory cell specified by the address signal is selected from the plurality of memory cells, a driver circuit for the first signal line which selects and outputs any of a plurality of writing potentials to the first signal line, a reading circuit to which a potential of the bit line and a plurality of reference potentials are input and which compares the potential of the bit line and the plurality of reference potentials to read data out, and a potential generating circuit which generates and supplies the plurality of writing potentials and the plurality of reference potentials to the driver circuit for the first signal line and the reading circuit. One of the plurality of memory cells includes a first transistor including a first gate electrode, a first source electrode, and a first drain electrode; a second transistor including a second gate electrode, a second source electrode, and a second drain electrode; and a third transistor including a third gate electrode, a third source electrode, and a third drain electrode. The first transistor is provided on a substrate including a semiconductor material. The second transistor includes an oxide semiconductor layer. The first gate electrode and one of the second source electrode and the second drain electrode are electrically connected to each other. The source line and the first source electrode are electrically connected to each other. The first drain electrode and the third source electrode are electrically connected to each other. The bit line and the third drain electrode are electrically connected to each other. The first signal line and the other of the second source electrode and the second drain electrode are electrically connected to each other. One of the plurality of second signal lines and the second gate electrode are electrically connected to each other. One of the plurality of word lines and the third gate electrode are electrically connected to each other.

In addition, in the above structure, the semiconductor device further including a capacitor electrically connected to the first gate electrode and the one of the second source electrode and the second drain electrode.

An embodiment of the present invention is a semiconductor device including a source line, a bit line, a first signal line, a plurality of second signal lines, a plurality of word lines, a plurality of memory cells connected to each other in parallel between the source line and the bit line, a driver circuit for the second signal lines and the word lines to which an address signal is input, and which drives the plurality of second signal lines and the plurality of word lines so that a memory cell specified by the address signal is selected from the plurality of memory cells, a driver circuit for the first signal line which selects and outputs any of a plurality of writing potentials to the first signal line, a reading circuit to which a potential of the bit line and a plurality of reference potentials are input, which includes a reference memory cell and which compares conductance of the specified memory cell and conductance of the reference memory cell to read data out, and a potential generating circuit which generates and supplies the plurality of writing potentials and the plurality of reference potentials to the driver circuit for the first signal line and the reading circuit. One of the plurality of memory cells includes a first transistor including a first gate electrode, a first source electrode, and a first drain electrode; a second transistor including a second gate electrode, a second source electrode, and a second drain electrode; and a third transistor including a third gate electrode, a third source electrode, and a third drain electrode. The first transistor is provided on a substrate including a semiconductor material. The second transistor includes an oxide semiconductor layer. The first gate electrode and one of the second source electrode and the second drain electrode are electrically connected to each other. The source line and the first source electrode are electrically connected to each other. The first drain electrode and the third source electrode are electrically connected to each other. The bit line and the third drain electrode are electrically connected to each other. The first signal line and the other of the second source electrode and the second drain electrode are electrically connected to each other. One of the plurality of second signal lines and the second gate electrode are electrically connected to each other. One of the plurality of word lines and the third gate electrode are electrically connected to each other.

An embodiment of the present invention is a semiconductor device including a source line, a bit line, a first signal line, a plurality of second signal lines, a plurality of word lines, a plurality of memory cells connected to each other in parallel between the source line and the bit line, a driver circuit for the second signal lines and the word lines to which an address signal and a plurality of reference potentials are input, which drives the plurality of second signal lines and the plurality of word lines so that a memory cell specified by the address signal is selected from the plurality of memory cells, and which selects and outputs any of the plurality of reference potentials to one selected from the word lines, a driver circuit for the first signal line which selects and outputs any of a plurality of writing potentials to the first signal line, a reading circuit connected to the bit line and reading out data by reading out conductance of the specified memory cell, and a potential generating circuit which generates and supplies the plurality of writing potentials and the plurality of reference potentials to the driver circuit for the first signal line and the reading circuit. One of the plurality of memory cells includes a first transistor including a first gate electrode, a first source electrode, and a first drain electrode; a second transistor including a second gate electrode, a second source electrode, and a second drain electrode; and a capacitor. The first transistor is provided on a substrate including a semiconductor material. The second transistor includes an oxide semiconductor layer. The first gate electrode, one of the second source electrode and the second drain electrode, and one electrode of the capacitor are electrically connected to each other. The source line and the first source electrode are electrically connected to each other. The bit line and the first drain electrode are electrically connected to each other. The first signal line and the other of the second source electrode and the second drain electrode are electrically connected to each other. One of the plurality of second signal lines and the second gate electrode are electrically connected to each other. One of the plurality of word lines and the other electrode of the capacitor are electrically connected to each other.

In the above structure, the first transistor includes a channel formation region provided on the substrate including the semiconductor material, impurity regions between which the channel formation region is provided, a first gate insulating layer over the channel formation region, a first gate electrode over the first gate insulating layer, and a first source electrode and a first drain electrode which are electrically connected to the impurity regions, respectively.

In addition, in the above structure, the second transistor includes a second gate electrode over the substrate including the semiconductor material, a second gate insulating layer over the second gate electrode, an oxide semiconductor layer over the second gate insulating layer, and a second source electrode and a second drain electrode which are electrically connected to the oxide semiconductor layer.

Furthermore, in the above structure, the third transistor includes a channel formation region provided on the substrate including the semiconductor material, impurity regions between which the channel formation region is provided, a third gate insulating layer over the channel formation region, a third gate electrode over the third gate insulating layer, and a third source electrode and a third drain electrode which are electrically connected to the impurity regions, respectively.

Further, in the above structure, as the substrate including the semiconductor material, a single crystal semiconductor substrate is preferably used. In particular, the semiconductor material is preferably silicon. In addition, an SOI substrate may be used as the substrate including the semiconductor material.

Further, in the above structure, the oxide semiconductor layer preferably includes an In—Ga—Zn—O-based oxide semiconductor material. In particular, the oxide semiconductor layer preferably includes a crystal of $In_2Ga_2ZnO_7$. In addition, a hydrogen concentration of the oxide semiconductor layer is preferably less than or equal to $5\times10^{19}$ atoms/cm$^3$. Further, off current of the second transistor is preferably less than or equal to $1\times10^{-13}$ A.

In addition, in the above structure, the second transistor can be provided in a region overlapping with the first transistor.

Note that in this specification and the like, "over" and "below" do not necessarily mean "directly on" and "directly under", respectively, in the description of a physical relationship between components. For example, the expression of "a first gate electrode over a gate insulating layer" may refer to the case where another component is interposed between the gate insulating layer and the first gate electrode. In addition, the terms "over" and "below" are just used for convenience of explanations and they can be interchanged unless otherwise specified.

In this specification and the like, the term "electrode" or "wiring" does not limit the function of components. For example, an "electrode" can be used as part of "wiring", and the "wiring" can be used as part of the "electrode". In addition, the term "electrode" or "wiring" can also mean a combination of a plurality of "electrodes" and "wirings", for example.

Further, functions of a "source" and a "drain" are switched in some cases when transistors having different polarities are employed or a direction of current flow is changed in circuit operation, for example. Therefore, the terms "source" and "drain" can be switched in this specification.

Note that in this specification, the expression of "electrically connected" includes the case of electrical connection through "an object having any electrical function". Here, there is no particular limitation on "an object having any electrical function" as long as the object enables transmission and reception of an electrical signal between components which the object connects.

For example, in "an object having any electrical function", a switching element such as a transistor, a resistor, an inductor, a capacitor, and other elements having several functions, are included, as well as electrodes and wirings.

In general, the term "SOI substrate" means a substrate having a silicon semiconductor layer over an insulating surface. In this specification and the like, the term "SOI substrate" also means a substrate having a semiconductor layer using a material other than silicon over an insulating surface. That is, a semiconductor layer included in the "SOI substrate" is not limited to a silicon semiconductor layer. Additionally, a substrate in an "SOI substrate" is not limited to a semiconductor substrate such as a silicon wafer, and may be a non-semiconductor substrate such as a glass substrate, a quartz substrate, a sapphire substrate, and a metal substrate. That is, an "SOI substrate" also includes a conductive substrate and an insulating substrate over which a layer is formed using a semiconductor material. In addition, in this specification and the like, a "semiconductor substrate" means a substrate of only a semiconductor material and also a general substrate of a material including a semiconductor material. In other words, in this specification and the like, an "SOI substrate" is also included in the broad category of a "semiconductor substrate".

One embodiment of the present invention provides a semiconductor device including a transistor using a material other than an oxide semiconductor in its lower portion, and a transistor using an oxide semiconductor in its upper portion.

A transistor using an oxide semiconductor has extremely low off-state current; therefore, by using the transistor, stored contents can be retained for extremely a long time. That is, refresh operation can become unnecessary or frequency of refresh operation can be reduced considerably, so that power consumption can be reduced sufficiently. Further, even in the case where power is not supplied, stored contents can be retained for a long time.

In addition, high voltage is not needed for writing data and there is no problem of deterioration of elements. Further, writing of data is performed depending on an on state and an off state of the transistor, so that high-speed operation can be easily realized. Additionally, there is an advantage that operation for erasing former data is not needed when rewriting of data is performed.

Further, the transistor using a material other than an oxide semiconductor can operate at sufficiently high speed, whereby stored contents can be read out at high speed.

Accordingly, a semiconductor device having an unprecedented feature can be realized by being provided with a combination of a transistor using a material other than an oxide semiconductor material and a transistor using an oxide semiconductor.

BRIEF DESCRIPTION OF DRAWINGS

In the accompanying drawings:

FIG. 15 is a circuit diagram for explaining a driver circuit;

FIG. 33A is a diagram showing a state where a positive voltage ($+V_G>0$) is applied to a gate (GE1), and FIG. 33B is a diagram showing a state where a negative voltage ($-V_G<0$) is applied to the gate (GE1).

BEST MODE FOR CARRYING OUT THE INVENTION

Figure 1:
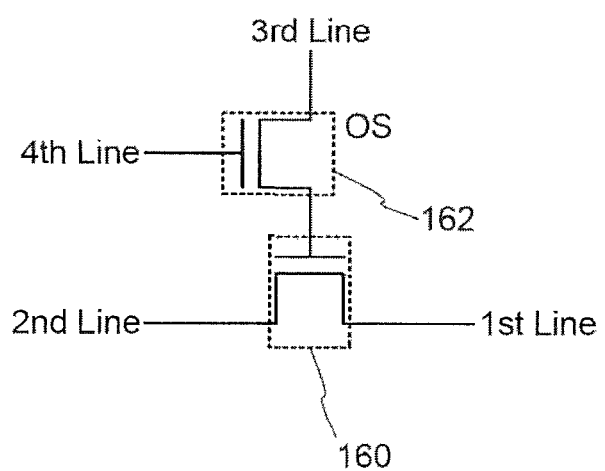
FIG. 1 is a circuit diagram for explaining a semiconductor device.

Hereinafter, an example of embodiments of the present invention will be described with reference to the drawings. Note that the present invention is not limited to the following description and it will be readily appreciated by those skilled in the art that modes and details can be modified in various ways without departing from the spirit and the scope of the present invention. Therefore, the invention should not be interpreted as being limited to the description of the following embodiments.

Note that for the easy understanding, the position, size, range and the like of each component illustrated in the drawings and the like are not actual ones in some cases. Therefore, the present invention is not limited to the position, size, and range and the like disclosed in the drawings and the like.

Note that in this specification and the like, ordinal numbers such as "first", "second", and "third" are used in order to avoid confusion among components, and the terms do not limit the components numerically.

Embodiment 1

In this embodiment, structures and manufacturing methods of semiconductor devices according to one embodiment of the disclosed invention are described with reference to FIG. 1, FIGS. 2A and 2B, FIGS. 3A to 3H, FIGS. 4A to 4G, FIGS. 5A to 5D, FIG. 6, FIGS. 7A and 7B, FIGS. 8A and 8B, and FIGS. 9A and 9B.

<Circuit Structure of Semiconductor Device>

FIG. 1 illustrates an example of a circuit configuration of a semiconductor device. The semiconductor device includes a transistor 160 formed using a material other than an oxide semiconductor and a transistor 162 formed using an oxide semiconductor. Note that a mark "OS" is added to the transistor 162 in FIG. 1 to show that the transistor 162 is formed using an oxide semiconductor (OS).

Here, a gate electrode of the transistor 160 is electrically connected to one of a source electrode and a drain electrode of the transistor 162. A first wiring (which is denoted as "1st Line" and also called a source line) and a second wiring (which is denoted as "2nd Line" and also called a bit line) are electrically connected to a source electrode of the transistor 160 and a drain electrode of the transistor 160, respectively. Further, a third wiring (which is denoted as "3rd Line" and also called a first signal line) and a fourth wiring (which is denoted as "4th Line" and also called a second signal line) are electrically connected to the other of the source electrode and the drain electrode of the transistor 162 and a gate electrode of the transistor 162, respectively.

The transistor 160 formed using a material other than an oxide semiconductor can operate at high speed. Therefore, with the use of the transistor 160, high-speed reading of stored contents and the like can be possible. In addition, off current is extremely small in the transistor 162 formed using an oxide semiconductor. Therefore, when the transistor 162 is turned off, a potential of the gate electrode of the transistor 160 can be retained for an extremely long time. Further, in the transistor 162 formed using an oxide semiconductor, a short channel effect is not likely to be caused, which is advantageous.

The advantage that the potential of the gate electrode can be retained for an extremely long time enables writing, retention, and reading of data to be performed as described below.

Description is made on writing and retention of data first. First, a potential of the fourth wiring is set to a potential at which the transistor 162 is turned on, whereby the transistor 162 is made to be in an on state. Accordingly, a potential of the third wiring is applied to the gate electrode of the transistor 160 (writing of data). After that, the potential of the fourth wiring is set to a potential at which the transistor 162 is turned off, whereby the transistor 162 is made to be in an off state; accordingly, the potential of the gate electrode of the transistor 160 is retained (retention of the data).

Since the off current of the transistor 162 is extremely small, the potential of the gate electrode of the transistor 160 is retained for a long time. For example, when the potential of the gate electrode of the transistor 160 is a potential at which the transistor 160 is turned on, an on state of the transistor 160 is retained for a long time. When the potential of the gate electrode of the transistor 160 is a potential at which the transistor 160 is turned off, an off state of the transistor 160 is retained for a long time.

Next, description is made on reading of data. When an on state or an off state of the transistor 160 is kept as described above and a given potential (a low potential) is applied to the first wiring, a value of a potential of the second wiring varies depending on a state of the transistor 160 which is an on state or an off state. For example, when the transistor 160 is in an on state, the potential of the second wiring is lowered by being affected by the potential of the first wiring. On the other hand, when the transistor 160 is in an off state, the potential of the second wiring is not changed.

In this manner, by comparing the potential of the first wiring with the potential of the second wiring in a state where data is retained, the data can be read out.

Then, description is made on rewriting of data. Rewriting of data is performed in a manner similar to that of the writing and retention of data which are described above. That is, the potential of the fourth wiring is set to be a potential at which the transistor 162 is turned on, whereby the transistor 162 is made to be in an on state. Accordingly, the potential of the third wiring (a potential relating to new data) is applied to the gate electrode of the transistor 160. After that, the potential of the fourth wiring is set to be a potential at which the transistor 162 is turned off, whereby the transistor 162 is made to be in an off state: accordingly, the new data is retained.

As described above, in the semiconductor device according to one embodiment of the disclosed invention, data can be directly rewritten by performing writing of data again. Erasing operation which is necessary in a flash memory and the like is thus not needed; therefore, reduction in operation speed due to erasing operation can be suppressed. In other words, high-speed operation of a semiconductor device is realized.

Note that, in the above description, an n-type transistor (an n-channel transistor) using electrons as carriers is used; however, a p-channel transistor using holes as carriers, needless to say, can be used instead of an n-channel transistor.

<Plan Structure and Cross-Sectional Structure of Semiconductor Device>

Figure 2A:
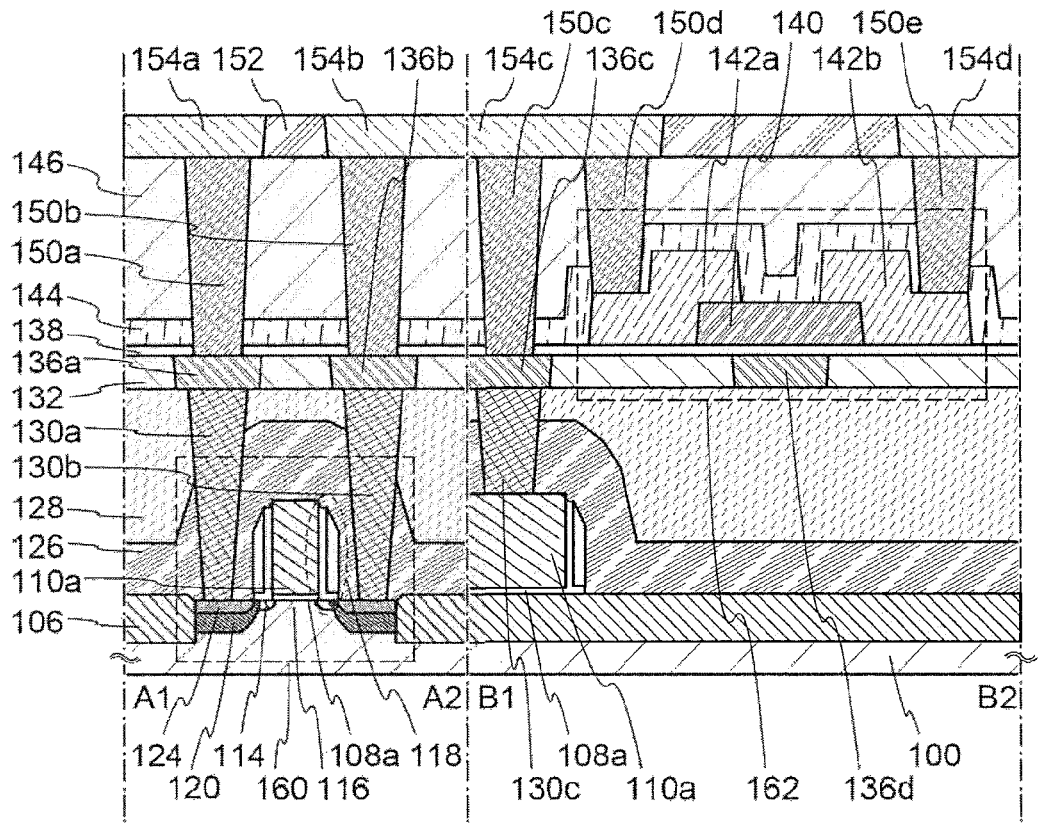
FIGS. 2A and 2B are a cross-sectional view and a plan view for explaining a semiconductor device, respectively.
Figure 2B:
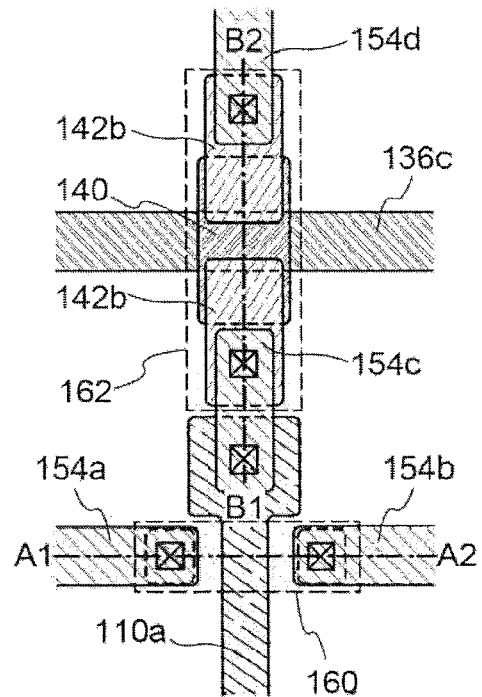

An example of a structure of the above semiconductor device is illustrated in FIGS. 2A and 2B. FIGS. 2A and 2B are a cross-sectional view of the semiconductor device and a plan view thereof, respectively. Here, FIG. 2A corresponds to a cross-section taken along line A1-A2 and line B1-B2 of FIG. 2B. The semiconductor device illustrated in FIGS. 2A and 2B includes the transistor 160 formed using a material other than an oxide semiconductor in a lower portion and the transistor 162 formed using an oxide semiconductor in an upper portion. Note that although n-channel transistors are described as the transistors 160 and 162, p-channel transistors may be employed. A p-channel transistor can be used as the transistor 160, in particular.

The transistor 160 includes: a channel formation region 116 which is provided for a substrate 100 containing a semiconductor material; impurity regions 114 between which the channel formation region 116 is sandwiched and high-concentration impurity regions 120 between which the channel formation region 116 is sandwiched (which are also collectively called impurity regions); a gate insulating layer 108*a* provided over the channel formation region 116: a gate electrode 110*a* provided over the gate insulating layer 108*a*; and a source or drain electrode 130*a* and a source or drain electrode 130*b* which are electrically connected to the impurity regions 114.

Here, sidewall insulating layers 118 are provided for side surfaces of the gate electrode 110*a*. Further, in regions of the substrate 100 which do not overlap with the sidewall insulating layers 118 when seen in a plan view, the high-concentration impurity regions 120 are provided, and further metal compound regions 124 are provided over the high-concentration impurity regions 120. On the substrate 100, an element isolation insulating layer 106 is provided so as to surround the transistor 160, and an interlayer insulating layer 126 and an interlayer insulating layer 128 are provided so as to cover the transistor 160. The source or drain electrode 130*a* and the source or drain electrode 130*b* are electrically connected to the metal compound regions 124 through openings formed in the interlayer insulating layers 126 and 128. In other words, the source or drain electrode 130*a* and the source or drain electrode 130*b* are electrically connected to the high-concentration impurity regions 120 and the impurity regions 114 via the metal compound regions 124. Further, the gate electrode 110*a* is electrically connected to an electrode 130*e* which is provided in a similar manner to the source or drain electrode 130*a* and the source or drain electrode 130*b*.

The transistor 162 includes a gate electrode 136*d* provided over the interlayer insulating layer 128; a gate insulating layer 138 provided over the gate electrode 136*d*; an oxide semiconductor layer 140 provided over the gate insulating layer 138; and a source or drain electrode 142*a* and a source or drain electrode 142*b* which are provided over and electrically connected to the oxide semiconductor layer 140.

Here, the gate electrode 136*d* is provided so as to be embedded in an insulating layer 132 which is formed over the interlayer insulating layer 128. Furthermore, similarly to the gate electrode 136*d*, an electrode 136*a*, an electrode 136*b*, and an electrode 136*c* are formed in contact with the source or drain electrode 130*a*, the source or drain electrode 130*b*, and the electrode 130*c*, respectively.

Over the transistor 162, a protective insulating layer 144 is provided in contact with part of the oxide semiconductor layer 140. An interlayer insulating layer 146 is provided over the protective insulating layer 144. Here, in the protective insulating layer 144 and the interlayer insulating layer 146, openings reaching the source or drain electrode 142*a* and the source or drain electrode 142*b* are formed. In the openings, an electrode 150*d* and an electrode 150*e* are formed to be in contact with the source or drain electrode layer 142*a* and the source or drain electrode 142*b*, respectively. Similarly to the electrodes 150*d* and 150*e*, an electrode 150*a*, an electrode 150*b*, and an electrode 150*c* are formed to be in contact with the electrode 136*a*, the electrode 136*b*, and the electrode 136*e*, respectively, in openings provided in the gate insulating layer 138, the protective insulating layer 144, and the interlayer insulating layer 146.

Here, the oxide semiconductor layer 140 is preferably an oxide semiconductor layer which is highly purified by removing an impurity such as hydrogen. Specifically, hydrogen concentration in the oxide semiconductor layer 140 is less than or equal to $5 \times 10^{19}$ atoms/cm$^3$, preferably, less than or equal to $5 \times 10^{18}$ atoms/cm$^3$, or more preferably, less than or equal to $5 \times 10^{17}$ atoms/cm$^3$. In the oxide semiconductor layer 140 which is highly purified by sufficiently reducing the hydrogen concentration, the carrier concentration is less than or equal to $5 \times 10^{14}$/cm$^3$, preferably, less than or equal to $5 \times 10^{12}$/cm$^3$. In this manner, by using an oxide semiconductor which is highly purified by sufficiently reducing hydrogen concentration and made to be an i-type oxide semiconductor or a substantially i-type oxide semiconductor, the transistor 162 which has extremely favorable off current characteristics can be obtained. For example, when a drain voltage $V_d$ is +1 V or +10 V and a gate voltage $V_g$ ranges from −5 V to −20 V, off current is less than or equal to $1 \times 10^{-13}$ A. When the oxide semiconductor layer 140 which is highly purified by sufficiently reducing the hydrogen concentration is used and off current of the transistor 162 is reduced, a semiconductor device having a novel structure can be realized. Note that the hydrogen concentration in the oxide semiconductor layer 140 was measured by secondary ion mass spectroscopy (SIMS).

Furthermore, an insulating layer 152 is provided over the interlayer insulating layer 146. An electrode 154*a*, an electrode 154*b*, an electrode 154*c*, and an electrode 154*d* are provided so as to be embedded in the insulating layer 152. Here, the electrode 154*a* is in contact with the electrode 150*a*; the electrode 154*b*, the electrode 150*b*; the electrode 154*c*, the electrodes 150*c* and 150*d*; and the electrode 154*d*, the electrode 150*e*.

That is, in the semiconductor device illustrated in FIGS. 2A and 2B, the gate electrode 110*a* of the transistor 160 is electrically connected to the source or drain electrode 142*a* of the transistor 162 via the electrodes 130*c*, 136*c*, 150*c*, 154*c*, and 150*d*.

<Method for Manufacturing Semiconductor Device>

Next, an example of a method for manufacturing the above-described semiconductor device will be described. First, a method for manufacturing the transistor 160 in the lower portion will be described with reference to FIGS. 3A to 3H and then, a method for manufacturing the transistor 162 in the upper portion will be described with reference to FIGS. 4A to 4G and FIGS. 5A to 5D.

<Method for Manufacturing Transistor in Lower Portion>

Figure 3A:
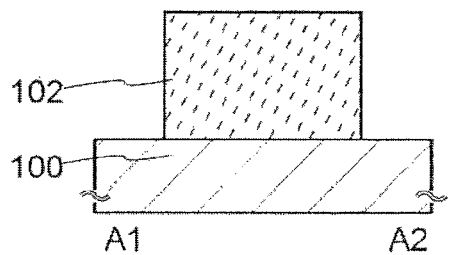
FIGS. 3A to 3H are cross-sectional views for explaining a semiconductor device.
Figure 3E:
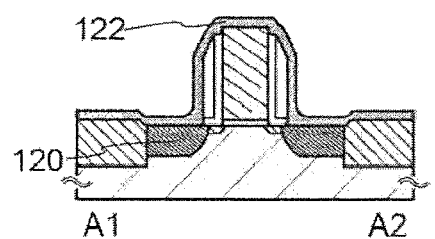

First, the substrate 100 which contains a semiconductor material is prepared (see FIG. 3A). As the substrate 100 which contains a semiconductor material, a single crystal semiconductor substrate or a polycrystalline semiconductor substrate containing silicon, silicon carbide, or the like, a compound semiconductor substrate containing silicon germanium or the like, an SOI substrate, or the like can be used. Here, an example in which a single crystal silicon substrate is used as the substrate 100 which contains a semiconductor material is described. Note that in general, the term "SOI substrate" means a semiconductor substrate having a silicon semiconductor layer over its insulating surface. In this specification, the term "SOI substrate" also means a substrate having a semiconductor layer using a material other than silicon over its insulating surface. In other words, a semiconductor layer included in the "SOI substrate" is not limited to a silicon semiconductor layer. Examples of the SOI substrate include a substrate which has a semiconductor layer over its insulating substrate such as a glass substrate, with an insulating layer between the semiconductor layer and the insulating substrate.

Over the substrate 100, a protective layer 102 which functions as a mask for forming an element isolation insulating layer (see FIG. 3A). As the protective layer 102, for example, an insulating layer formed using silicon oxide, silicon nitride, silicon nitride oxide, or the like can be used. Note that an impurity element giving n-type conductivity or an impurity element giving p-type conductivity may be added to the substrate 100 before or after the above step so that the threshold voltage of the transistor is controlled. As the impurity giving n-type conductivity phosphorus, arsenic, or the like can be used when the semiconductor material contained in the substrate 100 is silicon. As the impurity giving p-type conductivity, boron, aluminum, gallium, or the like can be used, for example.

Next, with the use of the above protective layer 102 as a mask, part of the substrate 100 in a region which is not covered with the protective layer 102 (an exposed region) is removed by etching. Thus, a semiconductor region 104 which is separated is formed (see FIG. 3B). For the etching, dry etching is preferably performed, but wet etching can be performed. An etching gas and an etchant can be selected as appropriate depending on a material of the object to be etched.

Figure 3B:
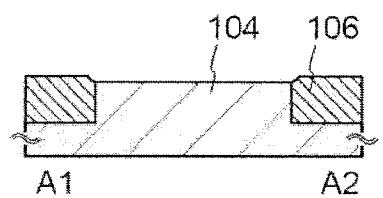
Figure 3F:
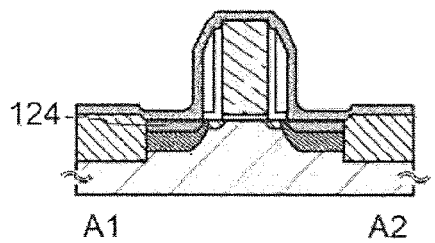

Next, an insulating layer is formed so as to cover the semiconductor region 104 and is selectively removed in a region which overlaps with the semiconductor region 104, whereby the element isolation insulating layer 106 is formed (see FIG. 3B). The insulating layer is formed using silicon oxide, silicon nitride, silicon nitride oxide, or the like. As a method for removing the insulating layer, there are etching and polishing treatment such as CMP, and any of them can be employed. Note that the protective layer 102 is removed either after the semiconductor region 104 is formed or after the element isolation insulating layer 106 is formed.

Then, an insulating layer is formed over the semiconductor region 104 and a layer containing a conductive material is formed over the insulating layer.

The insulating layer serves as a gate insulating layer later and preferably has a single-layer structure or a stacked-layer structure using a film containing silicon oxide, silicon nitride oxide, silicon nitride, hafnium oxide, aluminum oxide, tantalum oxide, or the like which is obtained by a CVD method, a sputtering method, or the like. Alternatively, the above insulating layer may be obtained by oxidizing or nitriding a surface of the semiconductor region 104 by high-density plasma treatment or thermal oxidation treatment. The high-density plasma treatment can be performed using, for example, a mixed gas of a combination of a rare gas such as He, Ar, Kr, or Xe and oxygen, nitrogen oxide, ammonia, nitrogen, hydrogen, or the like. There is no particular limitation on the thickness of the insulating layer, but the thickness can be greater than or equal to 1 nm and less than or equal to 100 nm, for example.

The layer containing a conductive material can be formed using a metal material such as aluminum, copper, titanium, tantalum, or tungsten. Alternatively, the layer containing a conductive material may be formed using a semiconductor material such as polycrystalline silicon containing a conductive material. There is also no particular limitation on a method for forming the layer containing a conductive material, and any of a variety of film formation methods such as an evaporation method, a CVD method, a sputtering method, and a spin coating method is applicable. Note that in this embodiment, an example of the case where the layer containing a conductive material is formed using a metal material is described.

Figure 3C:
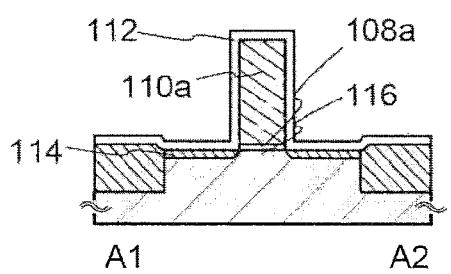

After that, by selectively etching the insulating layer and the layer containing a conductive material, the gate insulating layer 108a and the gate electrode 110a are formed (see FIG. 3C).

Next, an insulating layer 112 which covers the gate electrode 110a is formed (see FIG. 3C). Phosphorus (P), arsenic (As), or the like is then added to the semiconductor region 104, whereby the impurity regions 114 with a shallow junction depth are at a shallow region are formed (see FIG. 3C). Note that although phosphorus or arsenic is added here so that an n-channel transistor is formed, an impurity element such as boron (B) or aluminum (Al) may be added in the case of forming a p-channel transistor. Note also that the channel formation region 116 is formed in the semiconductor region 104 under the gate insulating layer 108a by formation of the impurity regions 114 (see FIG. 3C). Here, the concentration of the added impurity can be set as appropriate; in the case where a semiconductor element is highly miniaturized, the concentration is preferably set to be high. Further, a process in which the insulating layer 112 is formed after formation of the impurity regions 114 may be employed instead of the process employed here in which the impurity regions 114 are formed after formation of the insulating layer 112.

Figure 3G:
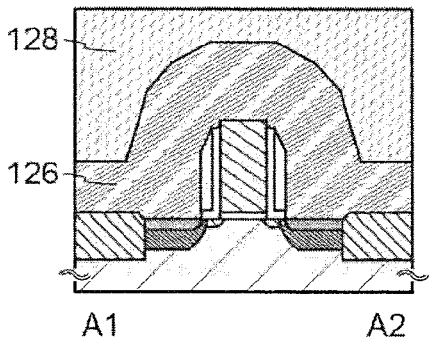
Figure 3D:
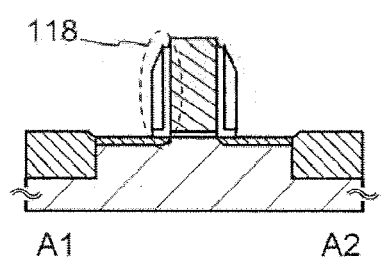

Then, the sidewall insulating layers 118 are formed (see FIG. 3D). An insulating layer is formed so as to cover the insulating layer 112 and then is subjected to highly anisotropic etching, whereby the sidewall insulating layers 118 can be formed in a self-aligned manner. It is preferable that the insulating layer 112 be partly etched at this time so that a top surface of the gate electrode 110a and top surfaces of the impurity regions 114 are exposed.

After that, an insulating layer is formed so as to cover the gate electrode 110a, the impurity regions 114, the side wall insulating layers 118, and the like. Phosphorus (P), arsenic (As), or the like is then added to regions of the impurity regions 114 which are in contact with the insulating layer, whereby the high-concentration impurity regions 120 are formed (see FIG. 3E). Next, the above insulating layer is removed and a metal layer 122 is formed so as to cover the gate electrode 110a, the sidewall insulating layers 118, the high-concentration impurity regions 120, and the like (see FIG. 3E). Any of a variety of methods such as a vacuum evaporation method, a sputtering method, and a spin coating method is applicable to formation of the metal layer 122. It is preferable that the metal layer 122 be formed using a metal material that reacts with a semiconductor material contained in the semiconductor region 104 so as to form a metal compound having low resistance. Examples of such a metal material include titanium, tantalum, tungsten, nickel, cobalt, and platinum.

Next, heat treatment is performed, whereby the metal layer 122 reacts with the semiconductor material. Accordingly, the metal compound regions 124 which are in contact with the high-concentration impurity regions 120 are formed (see FIG. 3F). Note that, in the case of using polycrystalline silicon for the gate electrode 110a, a portion of the gate electrode 110a which is in contact with the metal layer 122 also has the metal compound region.

As the heat treatment, irradiation with a flash lamp can be employed. Although it is needless to say that another heat treatment method may be used, a method by which heat treatment for an extremely short time can be achieved is preferably used in order to improve the controllability of chemical reaction in formation of the metal compound. Note that the above metal compound regions are formed through reaction of the metal material with the semiconductor material and have conductivity which is sufficiently increased. By formation of the metal compound regions, electric resistance can be sufficiently reduced and element characteristics can be improved. The metal layer 122 is removed after formation of the metal compound regions 124.

The interlayer insulating layers 126 and 128 are formed so as to cover the components formed in the above steps (see FIG. 3G). The interlayer insulating layers 126 and 128 can be formed using a material containing an inorganic insulating material such as silicon oxide, silicon nitride oxide, silicon nitride, hafnium oxide, aluminum oxide, or tantalum oxide. Alternatively, an organic insulating material such as polyimide or acrylic can be used. Note that although the interlayer insulating layer 126 and the interlayer insulating layer 128 form a two-layer structure here, the structure of the interlayer insulating layers is not limited to this. Note also that a surface of the interlayer insulating layer 128 is preferably subjected to CMP treatment, etching, or the like so as to be flattened after the interlayer insulating layer 128 is formed.

Figure 3H:
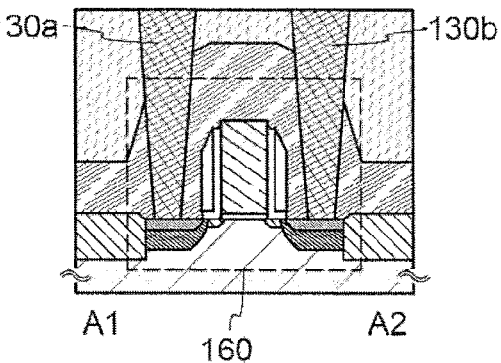

After that, openings reaching the metal compound regions 124 are formed in the interlayer insulating layers, and then the source or drain electrode 130a and the source or drain electrode 130b are formed in the openings (see FIG. 3H). For example, the source or drain electrode 130a and the source or drain electrode 130b can be formed as follows: a conductive layer is formed in a region including the openings by a PVD method, a CVD method, or the like; and then, part of the conductive layer is removed by etching, CMP treatment, or the like.

Note that in the case of forming the source or drain electrode 130a and the source or drain electrode 130b by removing part of the conductive layer, surfaces thereof are preferably processed to be flat. For example, in the case where a titanium film, a titanium nitride film, or the like is formed to have a small thickness in the region including the openings and a tungsten film is then formed so as to be embedded in the openings, CMP which is performed after that can remove an unnecessary portion of the tungsten film, titanium film, titanium nitride film, or the like, and improve the flatness of the surfaces. By flattening surfaces including the surfaces of the source or drain electrode 130a and the source or drain electrode 130b as described above, favorable electrodes, wirings, insulating layers, semiconductor layers, or the like can be formed in a later step.

Note that although only the source or drain electrode 130a and the source or drain electrode 130b which are in contact with the metal compound regions 124 are described, an electrode which is in contact with the gate electrode 110a (e.g., the electrode 130c of FIG. 2A) and the like can be formed in the same step. There is no particular limitation on a material used for the source or drain electrode 130a and the source or drain electrode 130b and any of a variety of conductive materials can be used. For example, a conductive material such as molybdenum, titanium, chromium, tantalum, tungsten, aluminum, copper, neodymium, or scandium can be used.

Through the above process, the transistor 160 formed using the substrate 100 containing a semiconductor material is formed. Note that additional electrodes, wirings, insulating layers, or the like may be formed as well after the above process is performed. When a multilayer wiring structure in which an interlayer insulating layer and a conductive layer are stacked is employed as a wiring structure, a highly-integrated semiconductor device can be provided.

<Method for Manufacturing Transistor in Upper Portion>

Then, a process through which the transistor 162 is manufactured over the interlayer insulating layer 128 is described with reference to FIGS. 4A to 4G and FIGS. 5A to 5D. Note that the transistor 160 and the like below the transistor 162 are omitted in FIGS. 4A to 4G and FIGS. 5A to 3D, which illustrate a manufacturing process of a variety of electrodes, the transistor 162, and the like over the interlayer insulating layer 128.

Figure 4A:
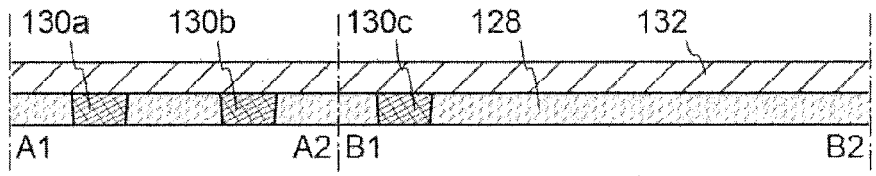
FIGS. 4A to 4G are cross-sectional views for explaining manufacturing steps of a semiconductor device.
Figure 4B:
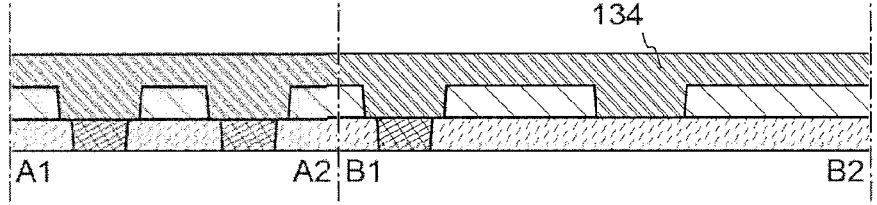

First, the insulating layer 132 is formed over the interlayer insulating layer 128, the source or drain electrode 130a, the source or drain electrode 130b, and the electrode 130c (see FIG. 4A). The insulating layer 132 can be formed by a PVD method, a CVD method, or the like. A material containing an inorganic insulating material such as silicon oxide, silicon nitride oxide, silicon nitride, hafnium oxide, aluminum oxide, or tantalum oxide can be used for the insulating layer 132.

Next, openings reaching the source or drain electrode 130a, the source or drain electrode 130b, and the electrode 130c are formed in the insulating layer 132. At this time, another opening is formed in a region where the gate electrode 136d is to be formed. A conductive layer 134 is formed so as to be embedded in the openings (see FIG. 4B). The above openings can be formed by etching with the use of a mask, for example. The mask can be formed by exposure using a photomask, for example. For the etching, either wet etching or dry etching may be performed but dry etching is preferable in view of the fine patterning. The conductive layer 134 can be formed by a deposition method such as a PVD method or a CVD method. Examples of a material for the conductive layer 134 include a conductive material such as molybdenum, titanium, chromium, tantalum, tungsten, aluminum, copper, neodymium, and scandium, an alloy of any of these, and a compound containing any of these (e.g., nitride of any of these).

Specifically, for example, the conductive layer 134 can be formed as follows: a titanium film is formed to have a small thickness by a PVD method in a region including the openings and a titanium nitride film is then formed to have a small thickness by a CVD method; and then, a tungsten film is formed so as to be embedded in the openings. Here, the titanium film formed by a PVD method has a function of reducing an oxide film at an interface and reducing contact resistance with a lower electrode (here, the source or drain electrode 130a, the source or drain electrode 130b, the electrode 130c, or the like). In addition, the subsequently formed titanium nitride film has a barrier property such that diffusion of a conductive material is prevented. Alternatively, after a barrier film is formed using titanium, titanium nitride, or the like, a copper film may be formed by a plating method.

Figure 4C:
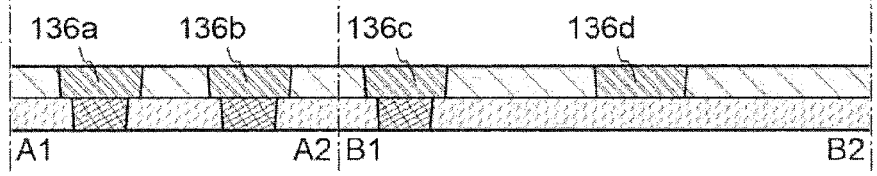

After the conductive layer 134 is formed, part of the conductive layer 134 is removed by etching, CMP treatment, or the like so that the insulating layer 132 is exposed and the electrodes 136a, 136b, and 136e, and the gate electrode 136d are formed (see FIG. 4C). Note that when the electrodes 136a, 136b, and 136c, and the gate electrode 136d are formed by removing part of the above conductive layer 134, processing is preferably performed so that flattened surfaces are obtained. By flattening surfaces of the insulating layer 132, the electrodes 136a, 136b, and 136c, and the gate electrode 136d, favorable electrodes, wirings, insulating layers, semiconductor layers or the like can be formed in a later step.

Figure 4D:
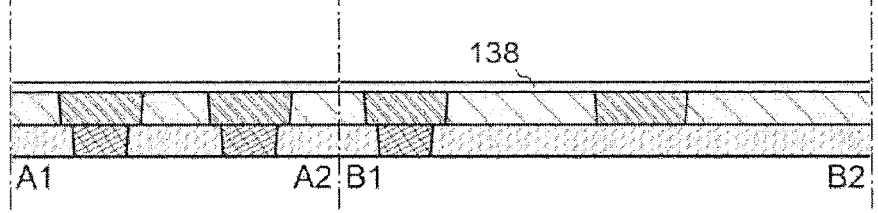

After that, the gate insulating layer 138 is formed so as to cover the insulating layer 132, the electrodes 136a, 136b, and 136c, and the gate electrode 136d (see FIG. 4D). The gate insulating layer 138 can be formed by a sputtering method, a CVD method, or the like. The gate insulating layer 138 preferably contains silicon oxide, silicon nitride, silicon oxynitride, silicon nitride oxide, aluminum oxide, hafnium oxide, tantalum oxide, or the like. Note that the gate insulating layer 138 may have a single-layer structure or a stacked-layer structure. For example, the gate insulating layer 138 of silicon oxynitride can be formed by a plasma CVD method using silane ($SiH_4$), oxygen, and nitrogen as source gases. There is no particular limitation on the thickness of the gate insulating layer 138, but the thickness can be greater than or equal to 10 nm and less than or equal to 500 nm, for example. When a stacked-layer structure is employed, the gate insulating layer 138 is preferably formed by stacking a first gate insulating layer with a thickness greater than or equal to 50 nm and less than or equal to 200 nm and a second gate insulating layer with a thickness greater than or equal to 5 nm and less than or equal to 300 nm over the first gate insulating layer.

Note that an oxide semiconductor which is made to be an i-type oxide semiconductor or a substantially i-type oxide semiconductor by removing an impurity (an oxide semiconductor which is highly purified) is extremely sensitive to an interface state or interface electric charge; therefore, when such an oxide semiconductor is used for an oxide semiconductor layer, an interface between the oxide semiconductor layer and a gate insulating layer is important. In other words, the gate insulating layer 138 which is to be in contact with the highly purified oxide semiconductor layer needs to have high quality.

For example, a high-density plasma CVD method using microwave (2.45 GHz) is favorable because the dense and high-quality gate insulating layer 138 having high withstand voltage can be formed thereby. This is because an interface state can be reduced and interface characteristics can be favorable when the highly purified oxide semiconductor layer and the high quality gate insulating layer are in contact with each other.

Needless to say, even when such a highly purified oxide semiconductor layer is used, another method such as a sputtering method or a plasma CVD method can be employed as long as an insulating layer having good quality can be formed as the gate insulating layer. Alternatively, an insulating layer whose film quality and interface characteristics are modified by heat treatment after being formed may be applied. In any case, a layer is acceptable which is of good quality as the gate insulating layer 138, and which reduces interface state density between the gate insulating layer and the oxide semiconductor layer so that a good interface is formed.

Moreover, when an impurity is contained in an oxide semiconductor, in the bias temperature test (the BT test) at 85° C. for 12 hours with electric field strength of $2 \times 10^6$ V/cm, a combination between the impurity and the main component of the oxide semiconductor is cut by a strong electric field (B: bias) and a high temperature (T: temperature), and a generated dangling bond leads to a drift in the threshold voltage ($V_{th}$).

On the other hand, according to one embodiment of the disclosed invention, a transistor which is stable even in the BT test can be provided by removing an impurity in the oxide semiconductor, especially hydrogen or water, and realizing good interface characteristics between the gate insulating layer and the oxide semiconductor layer as described above.

Figure 4E:
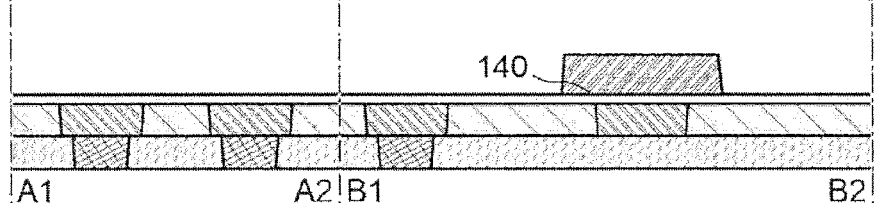

Then, an oxide semiconductor layer is formed over the gate insulating layer 138 and processed by a method such as etching using a mask so that the oxide semiconductor layer 140 having an island-shape is formed (see FIG. 4E).

As the oxide semiconductor layer, an oxide semiconductor layer formed using any of the following materials can be applied: four-component metal oxide such as In—Sn—Ga—Zn—O; three-component metal oxide such as In—Ga—Zn—O, In—Sn—Zn—U, In—Al—Zn—O, Sn—Ga—Zn—O, Al—Ga—Zn—O, and Sn—Al—Zn—O; two-component metal oxide such as In—Zn—O, Sn—Zn—O, Al—Zn—O, Zn—Mg—O, Sn—Mg—O, and In—Mg—O; single-component metal oxide such as In—O, Sn—O, and Zn—O; and the like. In addition, the above oxide semiconductor materials may contain $SiO_2$.

As the oxide semiconductor layer, a thin film represented by $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like. An oxide semiconductor film which represented by $InMO_3(ZnO)_m$ (m>0), which includes Ga as M, is referred to as an In—Ga—Zn—U-based oxide semiconductor, and a thin film of the In—Ga—Zn—O-based oxide semiconductor is referred to as an In—Ga—Zn—O-based oxide semiconductor film (an In—Ga—Zn—O-based amorphous film).

In this embodiment, as the oxide semiconductor layer, an amorphous oxide semiconductor layer is formed by a sputtering method with the use of an In—Ga—Zn—O-based oxide semiconductor target for deposition. Note that by adding silicon to the amorphous oxide semiconductor layer, crystallization can be suppressed; therefore, the oxide semiconductor layer may be formed using a target which contains $SiO_2$ at greater than or equal to 2 wt. % and less than or equal to 10 wt. %.

As a target for forming the oxide semiconductor layer by a sputtering method, for example, a metal oxide target containing zinc oxide as its main component can be used. Moreover, an oxide semiconductor target for deposition containing In, Ga, and Zn (a composition ratio of $In_2O_3:Ga_2O_3:ZnO=1:1:1$ [molar ratio]), or the like can be used, for example. Furthermore, an oxide semiconductor target for deposition containing In, Ga, and Zn (a composition ratio of $In_2O_3:Ga_2O_3:ZnO=1:1:2$ [molar ratio] or a composition ratio of $InzO_3:Ga_2O:ZnO=1:1:4$ [molar ratio]) may be used. The filling rate of an oxide semiconductor target for deposition is 90% to 100% inclusive, preferably greater than or equal to 95% (e.g., 99.9%). A dense oxide semiconductor layer is formed using an oxide semiconductor target for deposition with a high filling rate.

An atmosphere for formation of the oxide semiconductor layer is preferably a rare gas (typically argon) atmosphere, an oxygen atmosphere, or a mixed atmosphere of a rare gas (typically argon) and oxygen. Specifically, a high-purity gas is preferable in which the concentration of impurities such as hydrogen, water, hydroxyl, and hydride is reduced to approximately several parts per million (preferably several parts per billion).

At the time of forming the oxide semiconductor layer, the substrate is fixed in a treatment chamber which is kept in a reduced-pressure state and the substrate temperature is higher than or equal to 100° C. and lower than or equal to 600° C., preferably, higher than or equal to 200° C. and lower than or equal to 400° C. When the oxide semiconductor layer is formed while the substrate is heated, the concentration of impurities contained in the oxide semiconductor layer can be reduced. In addition, damage due to sputtering is reduced. While moisture remaining in the treatment chamber is removed, a sputtering gas from which hydrogen and moisture are removed is introduced, and the oxide semiconductor layer is formed with use of metal oxide as a target. In order to remove remaining moisture in the treatment chamber, an entrapment vacuum pump is preferably used. For example, a cryopump, an ion pump, or a titanium sublimation pump can be used. The evacuation unit may be a turbo pump provided with a cold trap. A hydrogen atom, a compound containing a hydrogen atom, such as water ($H_2O$), (preferably a compound containing a carbon atom), or the like is removed from the deposition chamber which is evacuated with the cryopump, thereby reducing the concentration of impurities contained in the oxide semiconductor layer formed in the deposition chamber.

For example, the deposition conditions can be set as follows: the distance between a substrate and a target is 100 mm; the pressure is 0.6 Pa; the direct-current (DC) power is 0.5 kW; and the atmosphere is an oxygen atmosphere (the proportion of the oxygen flow rate is 100%). It is preferable that a pulsed direct-current (DC) power supply be used because powder substances (also referred to as particles or dust) can be reduced and the film thickness can be uniform. The thickness of the oxide semiconductor layer is greater than or equal to 2 nm and less than or equal to 200 nm, preferably greater than or equal to 5 nm and less than or equal to 30 nm. Note that an appropriate thickness depends on an applied oxide semiconductor material, and the thickness of the oxide semiconductor layer may be set as appropriate depending on the material.

Note that before the oxide semiconductor layer is formed by a sputtering method, dust attached to a surface of the gate insulating layer 138 is preferably removed by reverse sputtering in which an argon gas is introduced and plasma is generated. Here, the reverse sputtering means a method for improving the quality of a surface of the object to be processed by ions striking on the surface, while general sputtering is achieved by ions striking on a sputtering target. Methods for making ions strike the surface of the object to be processed include a method in which a high frequency voltage is applied on the surface in an argon atmosphere and plasma is generated in the vicinity of the substrate. Note that a nitrogen atmosphere, a helium atmosphere, an oxygen atmosphere, or the like may be used instead of the argon atmosphere.

For the etching of the oxide semiconductor layer either dry etching or wet etching may be used. Needless to say, a combination of dry etching and wet etching may be employed. The etching conditions (an etching gas, etching solution, etching time, temperature, or the like) are set as appropriate, depending on the material, so that the oxide semiconductor layer can be etched into a desired shape.

Examples of the etching gas for dry etching are a gas containing chlorine (a chlorine-based gas such as chlorine ($Cl_2$), triboron chloride ($BCl_3$), tetrasilicon chloride ($SiCl_4$), or carbon tetrachloride ($CCl_4$)) and the like. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like may be used.

As a dry etching method a parallel plate reactive ion etching (RIE) method or an inductively coupled plasma (ICP) etching method can be used. In order to etch the layer into a desired shape, the etching conditions (the amount of electric power applied to a coil-shaped electrode, the amount of electric power applied to an electrode on a substrate side, the temperature of the electrode on the substrate side, or the like) are set as appropriate.

As an etchant used for wet etching, a mixed solution of phosphoric acid, acetic acid, and nitric acid, an ammonia peroxide mixture (hydrogen peroxide solution of 31 wt %: ammonia solution of 28 wt %: water=5:2:2), or the like can be used. Alternatively, an etchant such as ITO07N (by Kanto Chemical Co., Inc.) or the like may be used.

Then, the oxide semiconductor layer is preferably subjected to first heat treatment. By this first heat treatment, the oxide semiconductor layer can be dehydrated or dehydrogenated. The first heat treatment is performed at a temperature higher than or equal to 3000° C. and lower than or equal to 750° C., preferably, higher than or equal to 400° C. and lower than the strain point of the substrate. For example, the substrate is introduced into an electric furnace in which a resistance heating element or the like is used and the oxide semiconductor layer 140 is subjected to heat treatment in a nitrogen atmosphere at a temperature of 450° C. for one hour. At this time, the oxide semiconductor layer 140 is prevented from being exposed to the air so that entry of water or hydrogen is prevented.

Note that a heat treatment apparatus is not limited to an electrical furnace, and may include a device for heating an object to be processed by heat conduction or heat radiation given by a medium such as a heated gas or the like. For example, a rapid thermal anneal (RTA) apparatus such as a gas rapid thermal anneal (GRTA) apparatus or a lamp rapid thermal anneal (LRTA) apparatus can be used. A GRTA apparatus is an apparatus for heat treatment using a high-temperature gas. As the gas, an inert gas which does not react with an object to be processed due to heat treatment, such as nitrogen or a rare gas such as argon is used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp.

For example, as the first heat treatment, GRTA may be performed as follows. The substrate is placed in an inert gas which has been heated to a high temperature of 650° C. to 700° C., heated for several minutes, and taken out from the inert gas. GRTA enables high-temperature heat treatment for a short time. In addition, such heat treatment is applicable even when a temperature exceeds the strain point of the substrate because it takes only short time.

Note that the first heat treatment is preferably performed in an atmosphere which contains nitrogen or a rare gas (e.g., helium, neon, or argon) as its main component and does not contain water, hydrogen, or the like. For example, the purity of nitrogen or a rare gas (e.g., helium, neon, or argon) introduced into the heat treatment apparatus is greater than or equal to 6 N (99.9999%), preferably greater than or equal to 7 N (99.99999%) (that is, the concentration of impurities is less than or equal to 1 ppm, preferably less than or equal to 0.1 ppm).

In some cases, the oxide semiconductor layer might be crystallized to be a microcrystalline layer or a polycrystalline layer depending on the condition of the first heat treatment or the material of the oxide semiconductor layer. For example, the oxide semiconductor layer may be crystallized to become a microcrystalline oxide semiconductor layer having a degree of crystallization of greater than or equal to 90%, or greater than or equal to 80%. Further, depending on the condition of the first heat treatment or the material of the oxide semiconductor layer, the oxide semiconductor layer may become an amorphous oxide semiconductor layer containing no crystalline component.

The oxide semiconductor layer might become an oxide semiconductor layer in which a microcrystal (with a grain diameter greater than or equal to 1 nm and less than or equal to 20 nm, typically greater than or equal to 2 nm and less than or equal to 4 an) is mixed in an amorphous oxide semiconductor (e.g. a surface of the oxide semiconductor layer).

In addition, electric characteristics of the oxide semiconductor layer can be changed by arranging the microcrystal in the amorphous oxide semiconductor. For example, in the case of forming the oxide semiconductor layer with the use of an In—Ga—Zn—O-based oxide semiconductor target for deposition, the electric characteristics of the oxide semiconductor layer can be changed by forming a microcrystal portion in which a crystal grain represented by $In_2Ga_2ZnO_7$ which has electrical anisotropy is aligned.

More specifically, for example, by aligning c-axis of $In_2Ga_2ZnO_7$ to be oriented in a direction perpendicular to a surface of the oxide semiconductor layer, conductivity in a direction parallel to the surface of the oxide semiconductor layer is improved, whereby an insulating property in the direction perpendicular to the surface of the oxide semiconductor layer can be increased. Further, such a microcrystal portion has a function of suppressing entry of an impurity such as water or hydrogen to the oxide semiconductor layer.

Note that the above oxide semiconductor layer which includes the microcrystal portion can be formed by heating a surface of the oxide semiconductor layer by GRTA. When a sputtering target in which the amount of Zn is smaller than that of In or Ga is used, more favorable formation can be achieved.

The first heat treatment performed on the oxide semiconductor layer 140 can be performed on the oxide semiconductor layer 140 which has not yet been processed into the island-shaped layer. In that case, after the first heat treatment, the substrate is taken out of the heating apparatus and a photolithography step is performed.

Note that the above heat treatment can dehydrate or dehydrogenate the oxide semiconductor layer 140 and thus can be called dehydration treatment or dehydrogenation treatment. It is possible to perform such dehydration treatment or dehydrogenation treatment at any timing, for example, after the oxide semiconductor layer is formed, after the source and drain electrodes are stacked over the oxide semiconductor layer 140, or after a protective insulating layer is formed over the source and drain electrodes. Such dehydration treatment or dehydrogenation treatment may be performed more than once.

Figure 4F:
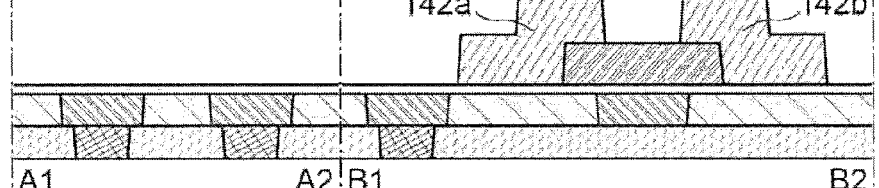

Next, the source or drain electrode 142a and the source or drain electrode 142b are formed in contact with the oxide semiconductor layer 140 (see FIG. 4F). The source or drain electrode 142a and the source or drain electrode 142b can be formed in such a manner that a conductive layer is formed so as to cover the oxide semiconductor layer 140 and then selectively etched.

The conductive layer can be formed by a PVD method such as a sputtering method, a CVD method such as a plasma CVD method. As a material of the conductive layer, an element selected from aluminum, chromium, copper, tantalum, titanium, molybdenum, and tungsten, an alloy containing any of the above elements as its component, or the like can be used. Further, a material containing one or more elements selected from manganese, magnesium, zirconium, beryllium, and thorium may be used. A material in which aluminum and one or more elements selected from titanium, tantalum, tungsten, molybdenum, chromium, neodymium, and scandium are combined is also applicable to the material of the conductive layer.

Alternatively, the conductive layer may be formed using conductive metal oxide. As conductive metal oxide, indium oxide ($In_2O_3$), tin oxide ($SnO_2$), zinc oxide (ZnO), indium oxide-tin oxide alloy ($In_2O_3$—$SnO_2$, which is abbreviated to ITO in some cases), indium oxide-zinc oxide alloy ($In_2O_3$—ZnO), or any of the metal oxide materials in which silicon or silicon oxide is contained can be used.

The conductive layer may have either a single-layer structure or a stacked-layer structure of two or more layers. For example, a single-layer structure of an aluminum film containing silicon, a two-layer structure of an aluminum film and a titanium film stacked thereover, a three-layer structure in which a titanium film, an aluminum film, and a titanium film are stacked in this order, and the like can be given.

Here, ultraviolet rays, a KrF laser beam, or an ArF laser beam is preferably used for exposure for forming an etching mask.

The channel length (L) of the transistor is determined by a distance between a lower edge portion of the source or drain electrode 142a and a lower edge portion of the source or drain electrode 142b. In the case where exposure for a pattern in which the channel length (L) is less than 25 nm is performed, exposure for making a mask is performed in the extreme ultraviolet range of several nanometers to several tens of nanometers which is extremely short wavelength. In the exposure using extreme ultraviolet light, the resolution is high and the focus depth is large. Therefore, the channel length (L) of the transistor to be formed later can be greater than or equal to 10 nm and less than or equal to 1000 nm, whereby operation speed of a circuit can be increased. Further, off-state current of the transistor is extremely small, which prevents increase in power consumption.

Materials of the layers and etching conditions are adjusted as appropriate so that the oxide semiconductor layer 140 is not removed in etching of the conductive layer. Note that the oxide semiconductor layer 140 is partly etched in this step so as to be an oxide semiconductor layer having a groove (a depressed portion) in some cases depending on the materials and etching conditions.

An oxide conductive layer may be formed between the oxide semiconductor layer 140 and the source or drain electrode layer 142a, and between the oxide semiconductor layer 140 and the source or drain electrode layer 142b. An oxide conductive layer and the conductive layer for forming the source or drain electrode layer 142a and the source or drain electrode 142b can be successively formed (successive deposition). The oxide conductive layer can function as a source region or a drain region. By providing such an oxide conductive layer, resistance of the source and drain regions can be reduced and high-speed operation of the transistor can be realized.

In order to reduce the number of the masks and steps, etching may be performed with the use of a resist mask formed using a multi-tone mask which is a light-exposure mask through which light is transmitted so as to have a plurality of intensities. A resist mask formed with the use of a multi-tone mask has a shape with a plurality of thicknesses (a step-like shape) and further can be changed in shape by ashing; therefore, the resist mask can be used in a plurality of etching steps for processing into different patterns. That is, a resist mask corresponding to at least two or more kinds of different patterns can be formed by one multi-tone mask. Thus, the number of light-exposure masks can be reduced and the number of corresponding photolithography steps can be also reduced, whereby simplification of a process can be realized.

Note that plasma treatment using a gas such as $N_2O$, $N_2$, or Ar is preferably performed after the above step. By this plasma treatment, water attached to a surface of the oxide semiconductor layer which is exposed is removed. Alternatively, plasma treatment may be performed using a mixed gas of oxygen and argon.

Figure 4G:
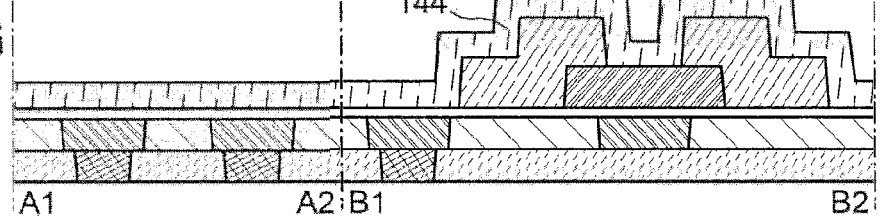

After that, the protective insulating layer 144 which is in contact with part of the oxide semiconductor layer 140 is formed without exposure to the air (see FIG. 4G).

The protective insulating layer 144 can be formed by appropriately employing a method such as a sputtering method, by which an impurity such as water or hydrogen is prevented from entering the protective insulating layer 144. The protective insulating layer 144 is formed to a thickness greater than or equal to 1 nm. As a material which can be used for the protective insulating layer 144, there are silicon oxide, silicon nitride, silicon oxynitride, silicon nitride oxide, and the like. The protective insulating layer 144 may have a single-layer structure or a stacked-layer structure. The substrate temperature for formation of the protective insulating layer 144 is preferably higher than or equal to room temperature and lower than or equal to 300° C. The atmosphere for formation of the protective insulating layer 144 is preferably a rare gas (typically argon) atmosphere, an oxygen atmosphere, or a mixed atmosphere of a rare gas (typically argon) and oxygen.

If hydrogen is contained in the protective insulating layer 144, entry of the hydrogen to the oxide semiconductor layer, extraction of oxygen in the oxide semiconductor layer by the hydrogen, or the like is caused, and the resistance of the backchannel side of the oxide semiconductor layer is made low, which may form a parasitic channel. Therefore, it is important that a formation method in which hydrogen is used as less as possible is employed so that the protective insulating layer 144 contains hydrogen as less as possible.

In addition, it is preferable that the protective insulating layer 144 be formed while remaining moisture in the treatment chamber is removed. This is for preventing hydrogen, hydroxyl, or moisture from being contained in the oxide semiconductor layer 140 and the protective insulating layer 144.

In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. A hydrogen atom, a compound containing a hydrogen atom, such as water ($H_2O$), or the like is removed from the deposition chamber which is evacuated with the cryopump, thereby reducing the concentration of impurities contained in the protective insulating layer 144 formed in the deposition chamber.

As a sputtering gas used in formation of the protective insulating layer 144, a high-purity gas from which an impurity such as hydrogen, water, hydroxyl, or hydride is reduced to approximately several parts per million (preferably several parts per billion) is preferably used.

Then, second heat treatment (preferably at a temperature higher than or equal to 200° C. and lower than or equal to 400° C., for example, higher than or equal to 2500° C. and lower than or equal to 350° C.) in an inert gas atmosphere or an oxygen atmosphere is preferably performed. For example, the second heat treatment is performed in a nitrogen atmosphere at 250° C. for one hour. The second heat treatment can reduce variation in the electric characteristics of the thin film transistor.

Further, heat treatment may be performed at a temperature higher than or equal to 100° C. and lower than or equal to 200° C. for greater than or equal to one hour and less than or equal to 30 hours in the air. This heat treatment may be performed at a fixed heating temperature. Alternatively, the following temperature cycle may be applied plural times repeatedly: the temperature is increased from room temperature to a temperature higher than or equal to 100° C. and lower than or equal to 200° C. and then decreased to room temperature. Further, this heat treatment may be performed under a reduced pressure before formation of the protective insulating layer. The reduced pressure enables the heat treatment time to be short. Note that this heat treatment may be performed instead of the second heat treatment; alternatively, this heat treatment may be performed in addition to the second heat treatment before or after the second heat treatment.

Figure 5A:
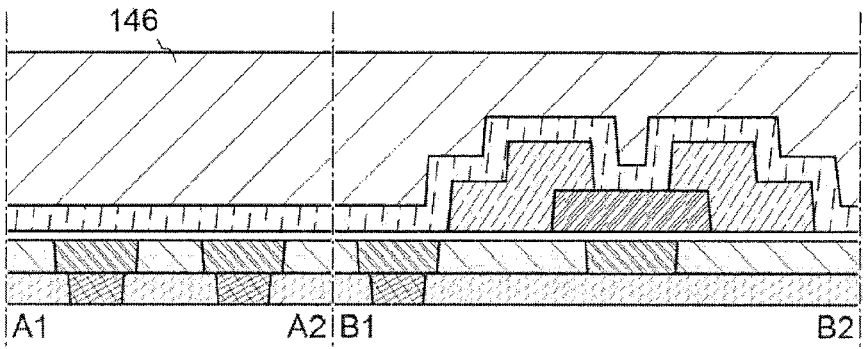
FIGS. 5A to 5D are cross-sectional views for explaining manufacturing steps of the semiconductor device.

Then, the interlayer insulating layer 146 is formed over the protective insulating layer 144 (see FIG. 5A). The interlayer insulating layer 146 can be formed by a PVD method, a CVD method, or the like. A material containing an inorganic insulating material such as silicon oxide, silicon nitride oxide, silicon nitride, hafnium oxide, aluminum oxide, or tantalum oxide can be used for the interlayer insulating layer 146. Further, a surface of the interlayer insulating layer 146 is preferably subjected to CMP treatment, etching treatment, or the like so as to be flattened after the interlayer insulating layer 146 is formed.

Figure 5B:
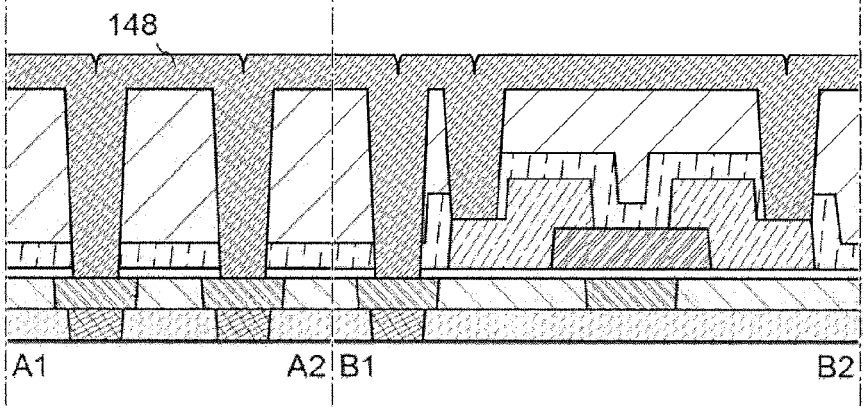

Next, openings reaching the electrodes 136a, 136b, and 136c, the source or drain electrode 142a, and the source or drain electrode 142b are formed in the interlayer insulating layer 146, the protective insulating layer 144, and the gate insulating layer 138; then, a conductive layer 148 is formed so as to be embedded in the openings (see FIG. 5B). The above openings can be formed by etching with the use of a mask, for example. The mask can be formed by exposure using a photomask, for example. For the etching, either wet etching or dry etching may be performed but dry etching is preferable in view of the fine patterning. The conductive layer 148 can be formed by a deposition method such as a PVD method or a CVD method. Examples of a material for the conductive layer 148 include a conductive material such as molybdenum, titanium, chromium, tantalum, tungsten, aluminum, copper, neodymium, and scandium, an alloy of any of these, and a compound containing any of these (e.g., nitride of any of these).

Specifically, for example, the conductive layer 148 can be formed as follows: a titanium film is formed to have a small thickness by a PVD method in a region including the openings and a titanium nitride film is then formed to have a small thickness by a CVD method; and then, a tungsten film is formed so as to be embedded in the openings. Here, the titanium film formed by a PVD method has a function of reducing an oxide film at an interface and reducing contact resistance with a lower electrode (here, the electrodes 136a, 136b, and 136c, the source or drain electrode 142a, the source or drain electrode 142b, or the like). In addition, the subsequently formed titanium nitride has a barrier property such that diffusion of a conductive material is prevented. Alternatively, after a barrier film is formed using titanium, titanium nitride, or the like, a copper film may be formed by a plating method.

Figure 5C:
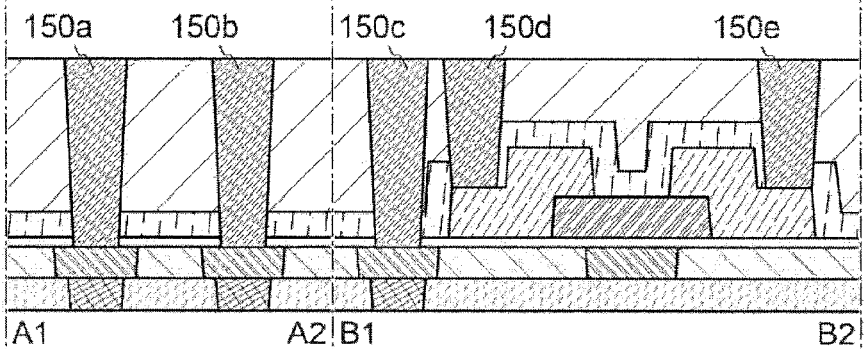
Figure 5D:
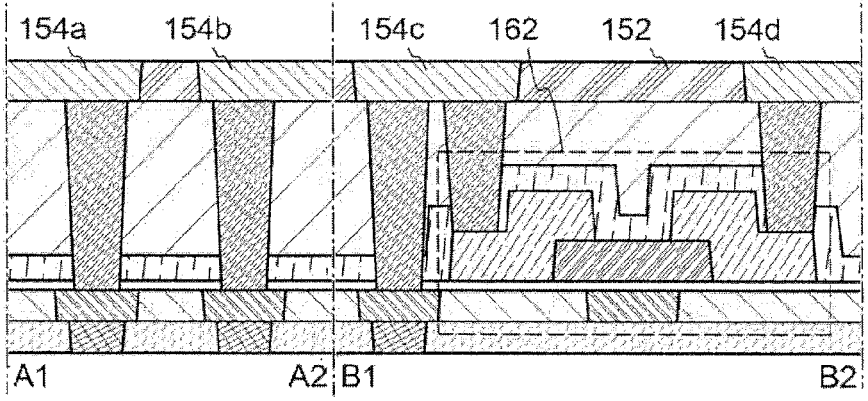

After the conductive layer 148 is formed, part of the conductive layer 148 is removed by etching treatment, CMP treatment, or the like so that the interlayer insulating layer 146 is exposed and the electrodes 150a, 150b, 150c, 150d and 150e are formed (see FIG. 5C). Note that when the electrodes 150a, 150b, 150c, 150d and 150e are formed by removing part of the above conductive layer 148, processing is preferably performed so that flattened surfaces are obtained. By flattening surfaces of the interlayer insulating layer 146 and the electrodes 150*a*, 150*b*, 150*c*, 150*d* and 150*e*, favorable electrodes, wirings, insulating layers, or the like can be formed in a later step.

Further, the insulating layer 152 is formed and openings reaching the electrodes 150*a*, 150*b*, 150*c*, 150*d* and 150*e* are formed in the insulating layer 152; then, a conductive layer is formed so as to be embedded in the openings. After that, part of the conductive layer is removed by etching, CMP, or the like so that the insulating layer 152 is exposed and the electrodes 154*a*, 154*b*, 154*c*, and 154*d* are formed (see FIG. 5D). This step is similar to that of forming the electrode 150*a* and the like; therefore, detailed description is omitted here.

When the transistor 162 is manufactured in the above-described manner, the hydrogen concentration of the oxide semiconductor layer 140 is less than or equal to $5 \times 10^{19}$ atoms/cm$^3$ and off-state current of the transistor 162 is less than or equal to $1 \times 10^{-13}$ A. Thus, the transistor 162 having excellent characteristics can be obtained by employing the highly purified oxide semiconductor layer 140 in which the hydrogen concentration is sufficiently reduced and defects resulted from oxygen deficiency are reduced. In addition, a semiconductor device having excellent characteristics which includes the transistor 160 formed using a material other than an oxide semiconductor in a lower portion and the transistor 162 formed using an oxide semiconductor in an upper portion can be manufactured.

Note that silicon carbide (e.g., 4H—SiC) is a semiconductor material that is compared with an oxide semiconductor. An oxide semiconductor and 4H—SiC have some things in common. One example is carrier density. Using the Femi-Dirac distribution at room temperature, the density of minority carriers in the oxide semiconductor is estimated to be approximately $10^{-7}$/cm$^3$, which is as extremely low as $6.7 \times 10^{-11}$/cm$^3$ of 4H—SiC. When the minority carrier density of the oxide semiconductor is compared with the intrinsic carrier density of silicon (approximately $1.4 \times 10^{10}$/cm$^3$), it is easy to understand that the minority carrier density of the oxide semiconductor is significantly low.

In addition, the energy band gap of the oxide semiconductor is 3.0 eV to 3.5 eV and that of 4H—SiC is 3.26 eV, which means that both the oxide semiconductor and silicon carbide are wide-gap semiconductors.

In contrast, there is a large difference between the oxide semiconductor and silicon carbide, that is, the process temperature. Heat treatment for activation at 1500° C. to 2000° C. is usually needed in a semiconductor process using silicon carbide, so that it is difficult to form a stack of silicon carbide and a semiconductor element formed using a semiconductor material other than silicon carbide. This is because a semiconductor substrate, a semiconductor element, and the like are damaged by such high temperature. On the other hand, the oxide semiconductor can be formed with heat treatment at 300° C. to 500° C. (at a temperature lower than or equal to the glass transition temperature, approximately 700° C. at the maximum): therefore, a semiconductor element can be formed using an oxide semiconductor after an integrated circuit is formed using another semiconductor material.

The oxide semiconductor has an advantage over silicon carbide in that a low heat-resistant substrate such as a glass substrate can be used. Moreover, the oxide semiconductor also has an advantage in that energy costs can be sufficiently reduced as compared to silicon carbide because heat temperature at high temperature is not necessary.

Note that although many researches on a physical property such as density of state (DOS) of an oxide semiconductor are conducted, they do not suggest an idea of sufficiently reducing localized states in an energy gap. In one embodiment of the disclosed invention, water or hydrogen which can induce a localized level is removed from an oxide semiconductor, whereby a highly purified oxide semiconductor is manufactured. This is based on an idea of sufficiently reducing localized states and realizes manufacture of excellent industrial products.

Note that when hydrogen, water, or the like is removed, oxygen is also removed in some cases. Therefore, it is favorable that the oxide semiconductor be further purified (made to be an i-type oxide semiconductor) by supplying oxygen to dangling bonds of metal which are generated by oxygen deficiency so that localized states resulted from oxygen deficiency are reduced. For example, localized states resulted from oxygen deficiency can be reduced in the following manner: an oxide film having excessive oxygen is formed in a close contact with a channel formation region; and heat treatment at 200° C. to 400° C., typically, approximately 250° C., is performed so that oxygen is supplied to an oxide semiconductor from the oxide film.

Further, oxygen can be supplied to an oxide semiconductor in a temperature decreasing step which is performed in an atmosphere from which hydrogen, water, or the like is sufficiently reduced or an oxygen atmosphere, and follows the second heat treatment.

It can be considered that a factor of defects of an oxide semiconductor is a shallow level due to excessive hydrogen at 0.1 eV to 0.2 eV below the conduction band, a deep level resulted from oxygen deficiency, or the like. A technical idea of thoroughly removing hydrogen and sufficiently supplying oxygen in order to remove these defects ought to be valid.

Note that although an oxide semiconductor generally has an n-type conductivity, in one embodiment of the disclosed invention, an oxide semiconductor is made to be an i-type oxide semiconductor by removing an impurity such as water or hydrogen and supplying oxygen that is a component of an oxide semiconductor. From this aspect, different from the case of silicon which is made to be an i-type silicon by adding an impurity, one embodiment of the disclosed invention includes a novel technical idea.

Note that the transistor 162 formed using an oxide semiconductor is a bottom-gate transistor in this embodiment; however, an embodiment of the present invention is not limited thereto. The transistor 162 may be a bottom-gate transistor, a top-gate transistor, or a dual-gate transistor. A dual-gate transistor refers to a transistor in which two gate electrode layers are provided over and under a channel region with a gate insulating layer provided therebetween.

<Electrical Conduction Mechanism of Transistor Using Oxide Semiconductor>

An electrical conduction mechanism of a transistor including an oxide semiconductor will be described with reference to FIG. 31, FIG. 32, FIGS. 33A and 33B, and FIG. 34. Note that the following description is based on the assumption of an ideal situation for easy understanding and does not necessarily reflect a real situation. Note also that the following description is just a consideration and does not affect the validity of the invention.

Figure 31:
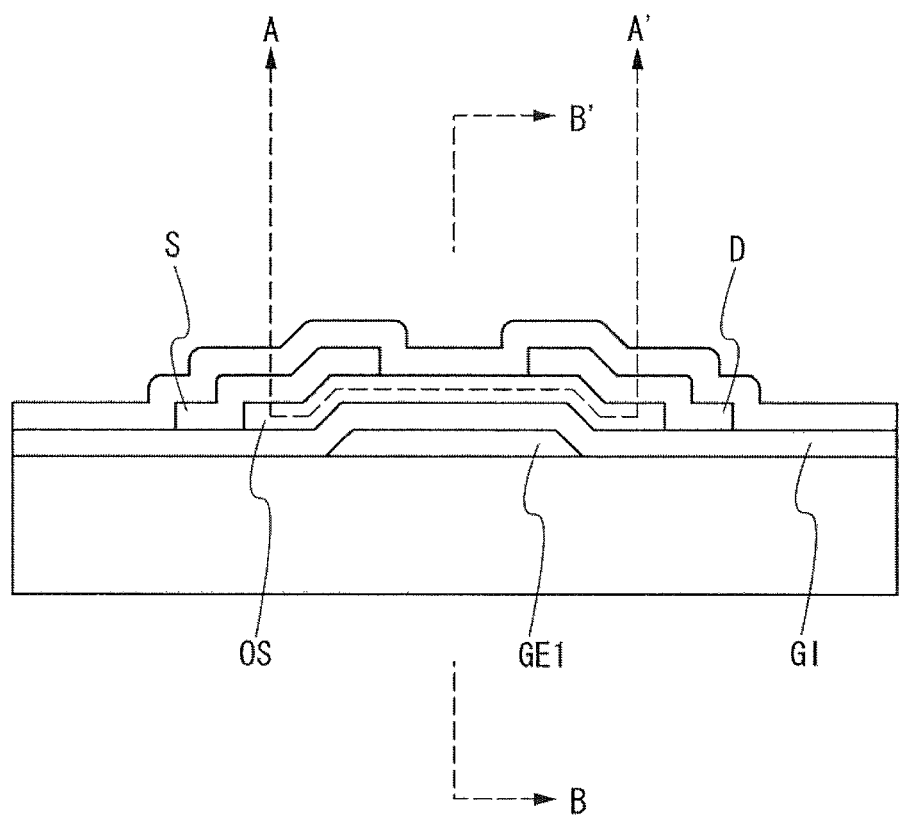
FIG. 31 is a cross-sectional view of a transistor including an oxide semiconductor.

FIG. 31 is a cross-sectional view of a transistor (thin film transistor) including an oxide semiconductor. An oxide semiconductor layer (OS) is provided over a gate electrode (GE1) with a gate insulating layer (GI) interposed therebetween, and a source electrode (S) and a drain electrode (D) are provided thereover. An insulating layer is provided so as to cover the source electrode (S) and the drain electrode (D).

Figure 32:
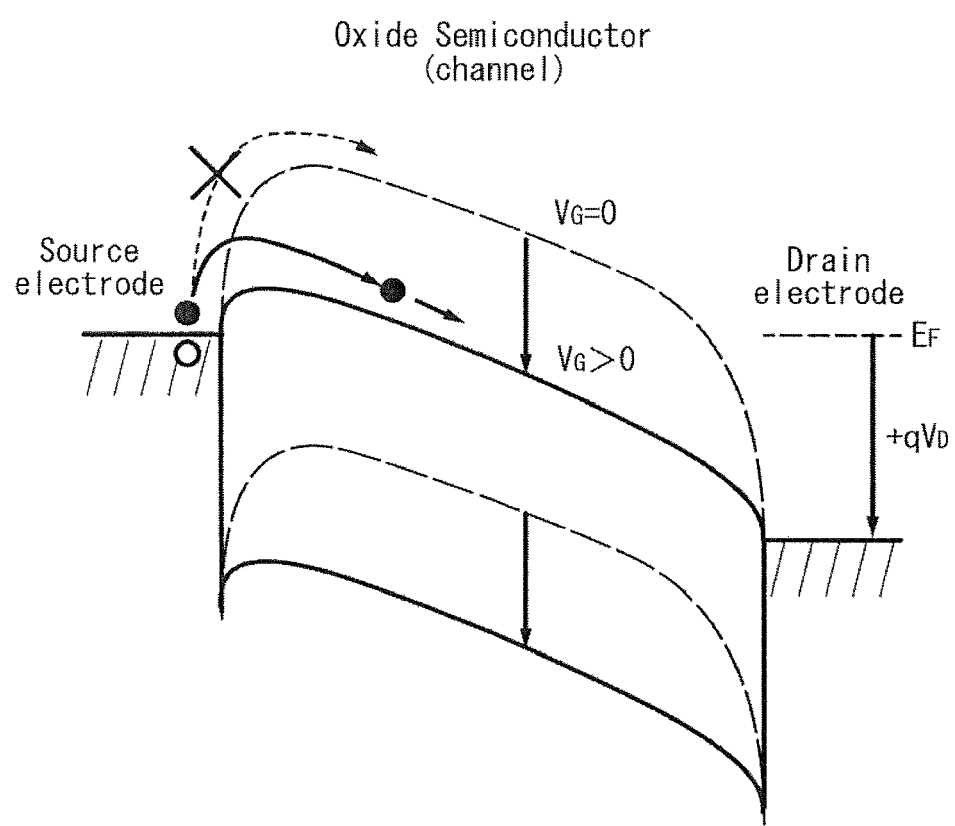
FIG. 32 is an energy band diagram (schematic diagram) taken along line A-A' of FIG. 31.

FIG. 32 is an energy band diagram (schematic diagram) of the A-A' section in FIG. 31. In FIG. 32, a black circle (●) and a white circle (○) represent an electron and a hole and have electric charges (−q, +q), respectively. With a positive voltage ($V_D$>0) applied to the drain electrode, the dashed line shows the case where no voltage is applied to the gate electrode ($V_G$=0) and the solid line shows the case where a positive voltage is applied to the gate electrode (V>0). In the case where no voltage is applied to the gate electrode, carriers (electrons) are not injected to the oxide semiconductor side from an electrode because of high potential barrier, so that a current does not flow, which means an off state. On the other hand, when a positive voltage is applied to the gate electrode, potential barrier is lowered, and thus a current flows, which means an on state.

FIGS. 33A and 33B are energy band diagrams (schematic diagrams) of the B-B' section in FIG. 31. FIG. 33A illustrates an on state in which a positive voltage ($V_G$>0) is applied to the gate electrode (GE1) and carriers (electrons) flow between the source electrode and the drain electrode. FIG. 33B illustrates an off state in which a negative voltage ($V_G$<0) is applied to the gate electrode (GE1) and minority carriers do not flow.

Figure 34:
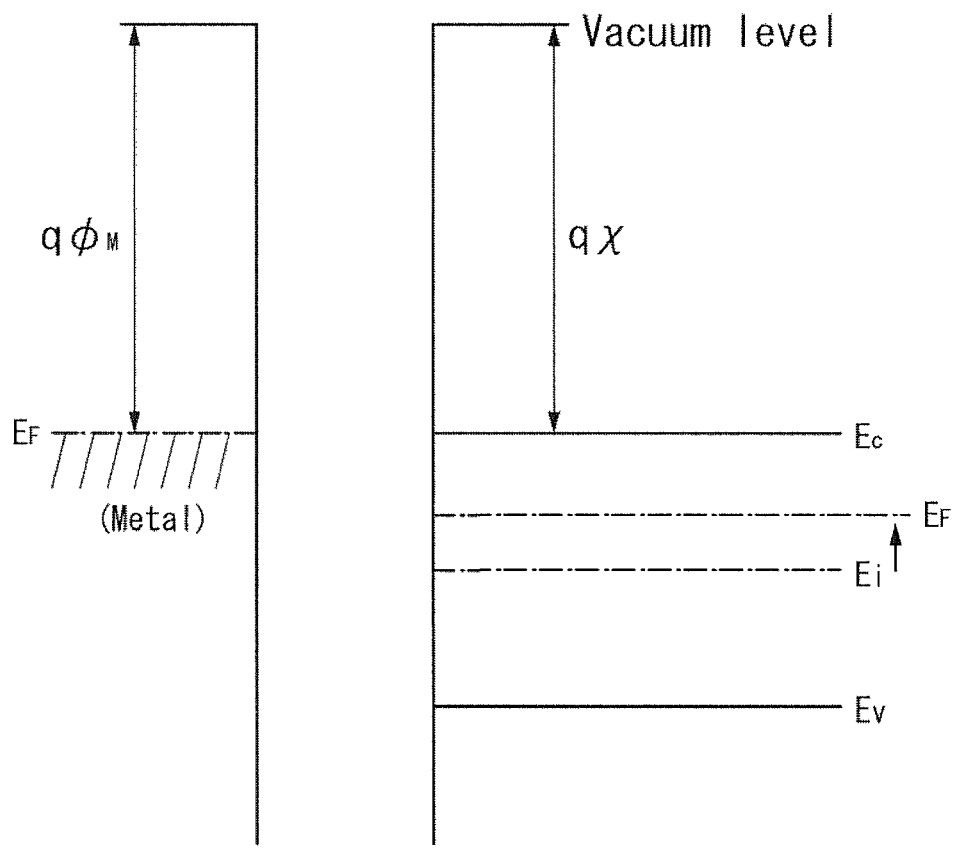
FIG. 34 shows a relation between the vacuum level and the work function of a metal ($\phi_M$), and a relation between the vacuum level and the electron affinity ($\chi$) of an oxide semiconductor.

FIG. 34 illustrates the relationships between the vacuum level and the work function of a metal ($\phi_M$) and between the vacuum level and the electron affinity ($\chi$) of an oxide semiconductor.

At normal temperature, electrons in the metal are degenerated and the Fermi level is located in the conduction band. On the other hand, a conventional oxide semiconductor is an n-type semiconductor, in which the Fermi level ($E_F$) is away from the intrinsic Fermi level ($E_i$) located in the middle of a band gap and is located closer to the conduction band. Note that it is known that part of hydrogen is a donor in an oxide semiconductor and is one factor causing an oxide semiconductor to be an n-type semiconductor.

On the other hand, an oxide semiconductor according to one embodiment of the disclosed invention is made to be an intrinsic (i-type) or substantially intrinsic oxide semiconductor by removal of hydrogen that is one factor which makes the oxide semiconductor have n-type conductivity so as to be highly purified in such a manner that elements (impurity elements) that are not main components thereof are contained as little as possible. In other words, the oxide semiconductor according to one embodiment of the disclosed invention is not an oxide semiconductor which is made to be an i-type oxide semiconductor by adding an impurity element but an i-type (intrinsic) or almost i-type oxide semiconductor which is highly purified by removing an impurity such as hydrogen or water as much as possible. In this manner, the Fermi level ($E_F$) can be extremely close to the intrinsic Fermi level ($E_i$).

It is said that the band gap ($E_g$) of an oxide semiconductor is 3.15 eV and the electron affinity ($\chi$) is 4.3 V. The work function of titanium (Ti) included in the source electrode and the drain electrode is substantially equal to the electron affinity ($\chi$) of the oxide semiconductor. In that case, a Schottky barrier for electrons is not formed at an interface between the metal and the oxide semiconductor.

At that time, the electron moves in the vicinity of the interface between the gate insulating layer and the purified oxide semiconductor (the lowest portion of the oxide semiconductor which is stable in terms of energy) as illustrated in FIG. 33A.

In addition, as illustrated in FIG. 33B, when a negative potential is applied to the gate electrode (GE1), the value of current is extremely close to zero because holes that are minority carriers are substantially zero.

In such a manner, an intrinsic (i-type) or substantially intrinsic oxide semiconductor is obtained by being purified such that an element other than its main element (i.e., an impurity element) is contained as little as possible. Thus, characteristics of the interface between the oxide semiconductor and the gate insulating layer become obvious. For that reason, the gate insulating layer needs to be able to form a favorable interface with the oxide semiconductor. Specifically, it is preferable to use, for example, an insulating layer formed by a CVD method using high-density plasma generated with a power supply frequency in the range of the VHF band to the microwave band, an insulating layer formed by a sputtering method, or the like.

When the oxide semiconductor is purified and the interface between the oxide semiconductor and the gate insulating layer is made favorable, in the case where the transistor has a channel width (W) of $1\times10^4$ μm and a channel length (L) of 3 μm, for example, it is possible to realize an off-state current of $10^{-13}$ A or less and a subthreshold swing (S value) of 0.1 V/dec (with a 1.00-nm-thick gate insulating layer).

The oxide semiconductor is purified as described above so as to contain an element other than its main element (i.e., an impurity element) as little as possible, so that the thin film transistor can operate in a favorable manner.

Modification Example

Modification examples of a structure of a semiconductor device are described with reference to FIG. 6, FIGS. 7A and 7B, FIGS. 8A and 8B, and FIGS. 9A and 9B. Note that in the following modification examples, the structure of the transistor 162 is different from that already described. In other words, the structure of the transistor 160 is similar to that already described.

Figure 6:
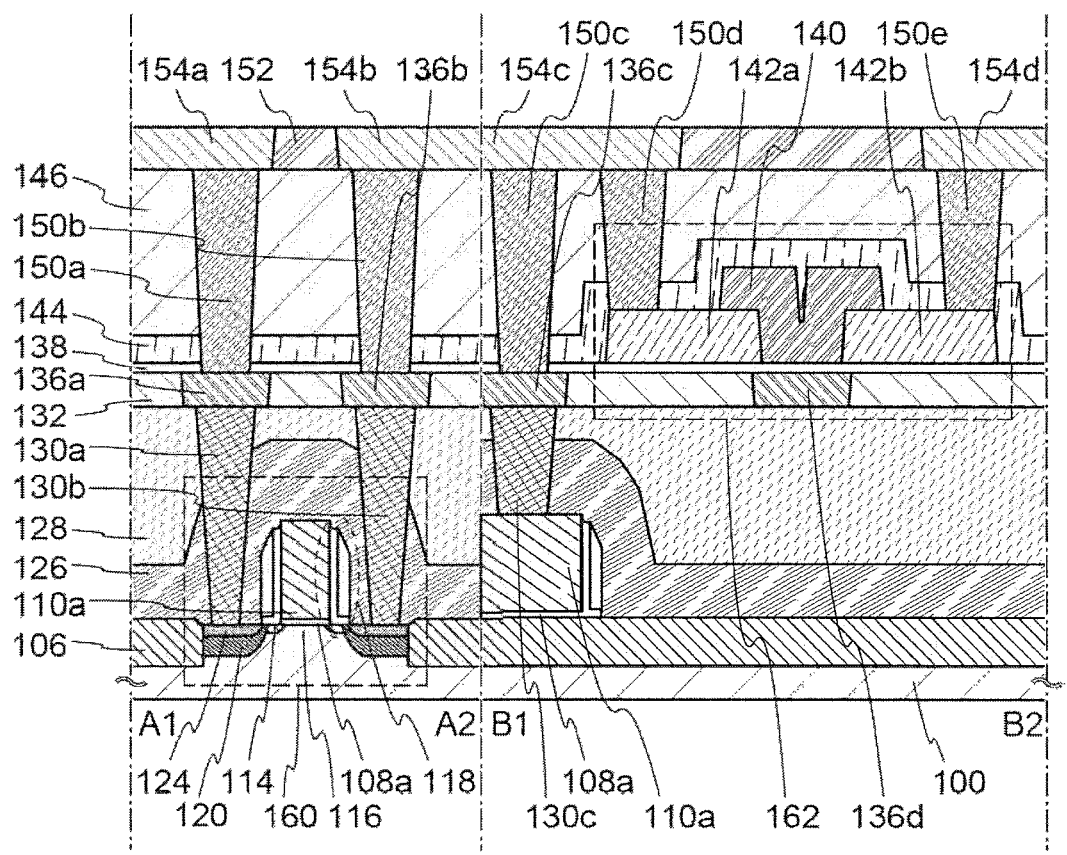
FIG. 6 is a cross-sectional view for explaining a semiconductor device.

In an example illustrated in FIG. 6, the transistor 162 includes the gate electrode 136d under the oxide semiconductor layer 140 and the source or drain electrode 142a and the source or drain electrode 142b which are in contact with the oxide semiconductor layer 140 at a bottom surface of the oxide semiconductor layer 140. Since a plan structure may be appropriately changed corresponding to a cross-sectional structure, only the cross-sectional structure is described here.

As a large difference between the structure illustrated in FIG. 6 and that illustrated in FIGS. 2A and 2B, there are connection positions where the source or drain electrode 142a and the source or drain electrode 142b are connected to the oxide semiconductor layer 140. That is, in the structure illustrated in FIGS. 2A and 2B, the source or drain electrode 142a and the source or drain electrode 142b are in contact with the oxide semiconductor layer 140 at a top surface of the oxide semiconductor layer 140; on the other hand, in the structure illustrated in FIG. 6, the source or drain electrode 142a and the source or drain electrode 142b are in contact with the oxide semiconductor layer 140 at the bottom surface of the oxide semiconductor layer 140. In addition, resulting from this difference in contact, a position of another electrode, another insulating layer, or the like is changed. As for details of each component, FIGS. 2A and 2B can be referred to.

Specifically, the semiconductor device includes the gate electrode 136d provided over the interlayer insulating layer 128, the gate insulating layer 138 provided over the gate electrode 136d, the source or drain electrode 142a and the source or drain electrode 142b which are provided over the gate insulating layer 138, and the oxide semiconductor layer 140 in contact with top surfaces of the source or drain electrode 142a and the source or drain electrode 142b.

Here, the gate electrode 136d is provided so as to be embedded in the insulating layer 132 which is formed over the interlayer insulating layer 128. Furthermore, similarly to the gate electrode 136d, an electrode 136a, an electrode 136b, and an electrode 136c are formed in contact with the source or drain electrode 130a, the source or drain electrode 130b, and the electrode 130c, respectively.

Over the transistor 162, a protective insulating layer 144 is provided in contact with part of the oxide semiconductor layer 140. An interlayer insulating layer 146 is provided over the protective insulating layer 144. Here, in the protective insulating layer 144 and the interlayer insulating layer 146, openings reaching the source or drain electrode 142a and the source or drain electrode 142b are formed. In the openings, the electrode 150d and the electrode 150e are formed to be in contact with the source or drain electrode layer 142a and the source or drain electrode 142b, respectively. Similarly to the electrodes 150d and 150e, the electrode 150a, the electrode 150b, and the electrode 150c are formed to be in contact with the electrode 136a, the electrode 136b, and the electrode 136c, respectively, in openings provided in the gate insulating layer 138, the protective insulating layer 144, and the interlayer insulating layer 146.

Furthermore, the insulating layer 152 is provided over the interlayer insulating layer 146. The electrode 154a, the electrode 154b, the electrode 154c, and the electrode 154d are provided so as to be embedded in the insulating layer 152. Here, the electrode 154a is in contact with the electrode 150a; the electrode 154b, the electrode 150b; the electrode 154c, the electrodes 50c and 150d; and the electrode 154d, the electrode 150c.

Figure 7A:
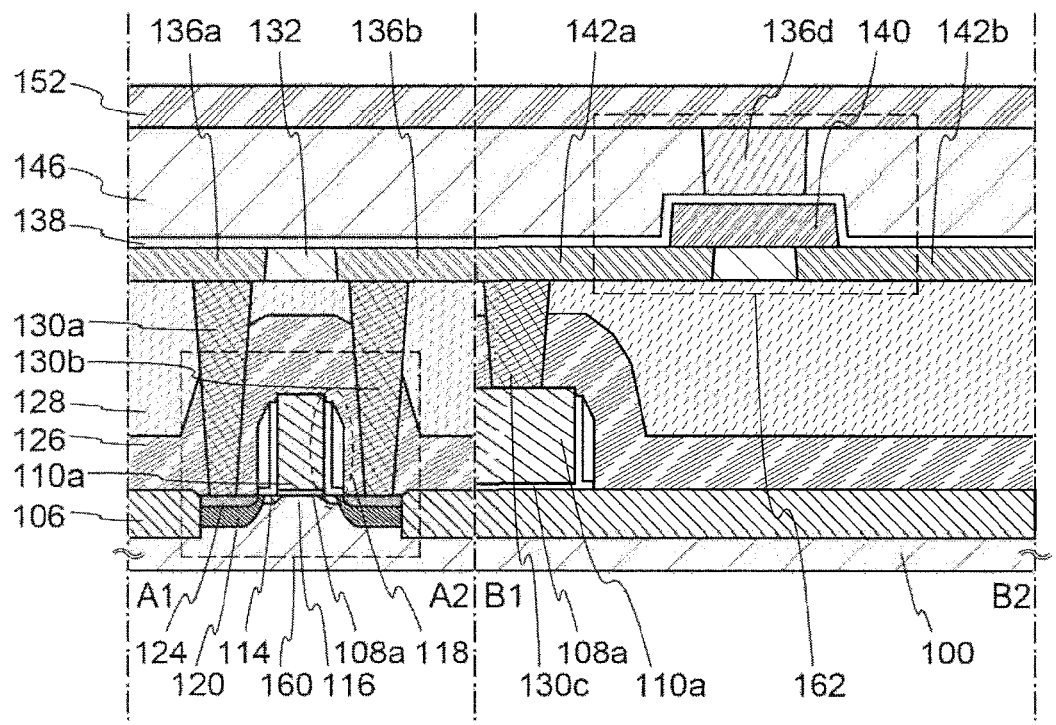
FIGS. 7A and 7B are cross-sectional views for explaining semiconductor devices.
Figure 7B:
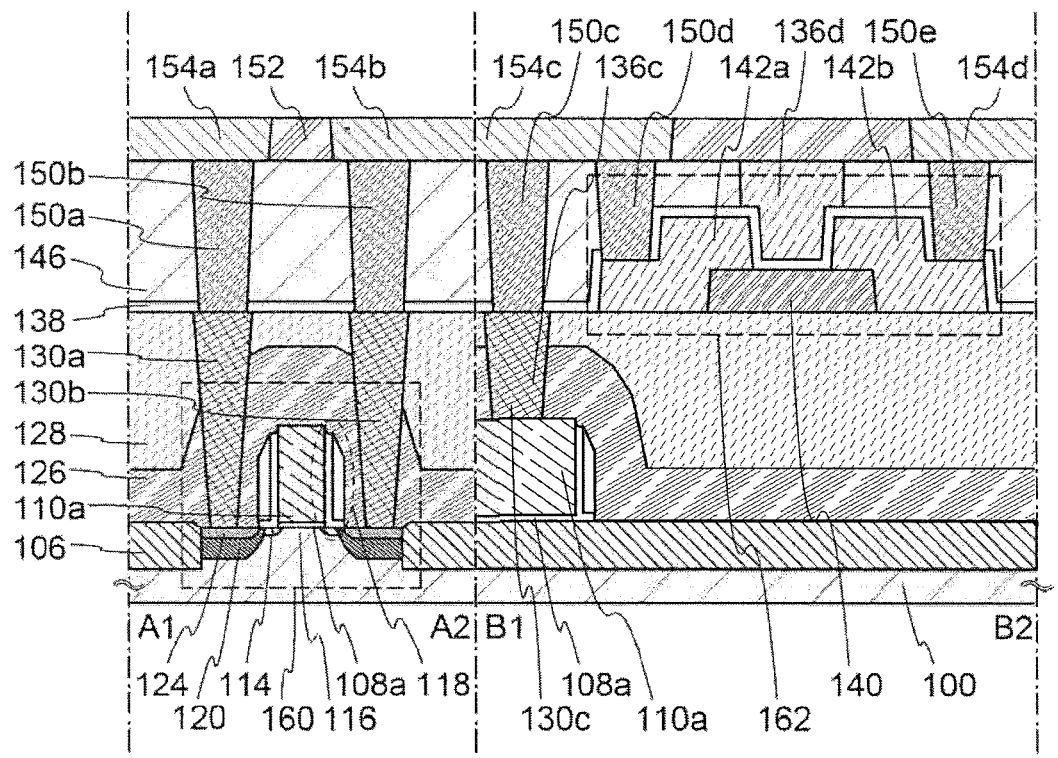

FIGS. 7A and 7B each illustrate an example in which the gate electrode 136d is provided over the oxide semiconductor layer 140. Here, FIG. 7A illustrates an example in which the source or drain electrode 142a and the source or drain electrode 142b are in contact with the oxide semiconductor layer 140 at the bottom surface of the oxide semiconductor layer 140; and FIG. 7B illustrates an example in which the source or drain electrode 142a and the source or drain electrode 142b are in contact with the oxide semiconductor layer 140 at the top surface of the oxide semiconductor layer 140.

The structures of FIGS. 7A and 7B are largely different from those of FIGS. 2A and 2B and FIG. 6 in that the gate electrode 136d is provided over the oxide semiconductor layer 140. In addition, a large difference between the structure illustrated in FIG. 7B and that illustrated in FIG. 7A is the surface at which the source or drain electrode 142a and the source or drain electrode 142b are in contact with the oxide semiconductor layer 140, which is either the top surface or the bottom surface of the oxide semiconductor layer 140. In addition, resulting from these differences, a position of another electrode, another insulating layer, or the like is changed. As for details of each component, the structure illustrated in FIGS. 2A and 2B or other drawings can be referred to.

Specifically, in FIG. 7A, the semiconductor device includes the source or drain electrode 142a and the source or drain electrode 142b which are provided over the interlayer insulating layer 128, the oxide semiconductor layer 140 which is in contact with the top surfaces of the source or drain electrode 142a and the source or drain electrode 142b, the gate insulating layer 138 provided over the oxide semiconductor layer 140, and the gate electrode 136d over the gate insulating layer 138 which is in a region overlapping with the oxide semiconductor layer 140.

In FIG. 7B, the semiconductor device includes the oxide semiconductor layer 140 provided over the interlayer insulating layer 128; the source or drain electrode 142a and the source or drain electrode 142b which are provided in contact with the top surface of the oxide semiconductor layer 140; the gate insulating layer 138 provided over the oxide semiconductor layer 140, the source or drain electrode 142a, and the source or drain electrode 142b; and the gate electrode 136d over the gate insulating layer 138 which is provided in a region overlapping with the oxide semiconductor layer 140.

Note that in the structures illustrated in FIGS. 7A and 7B, a component (e.g., the electrode 150a, the electrode 154a, or the like) which the structure illustrated in FIGS. 2A and 2B or the like has can be omitted in some cases. In such a case, simplification of the manufacturing process can be achieved secondarily. Needless to say, a component which is not essential can be omitted also in the structure illustrated in FIGS. 2A and 2B or the like.

Figure 8A:
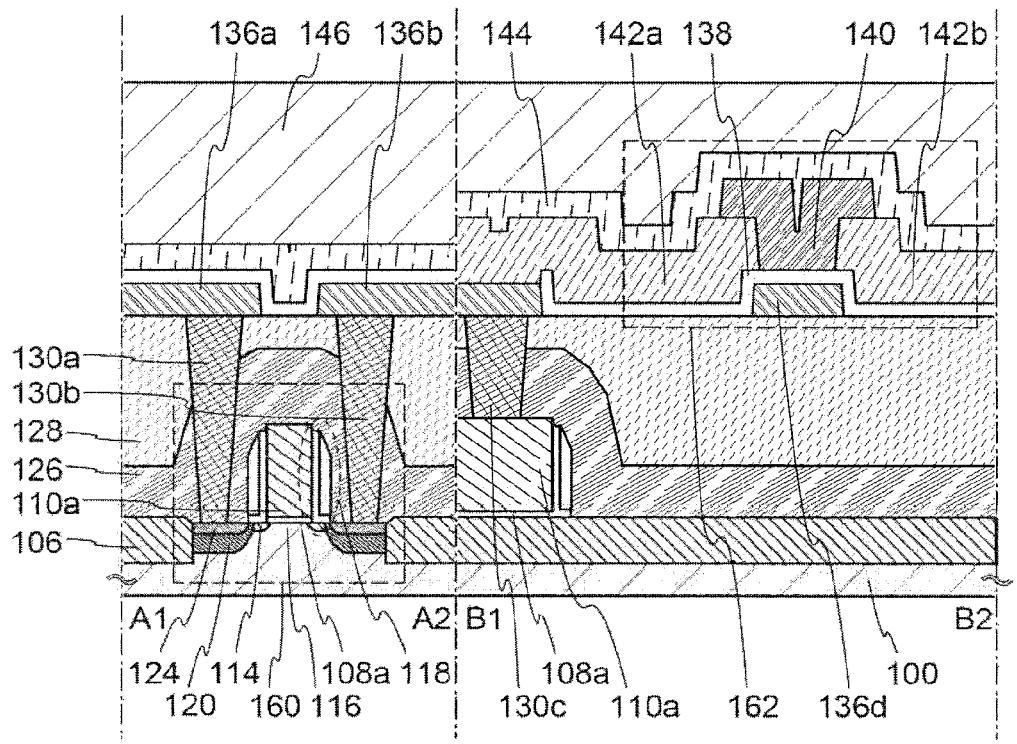
FIGS. 8A and 8B are cross-sectional views for explaining semiconductor devices.
Figure 8B:
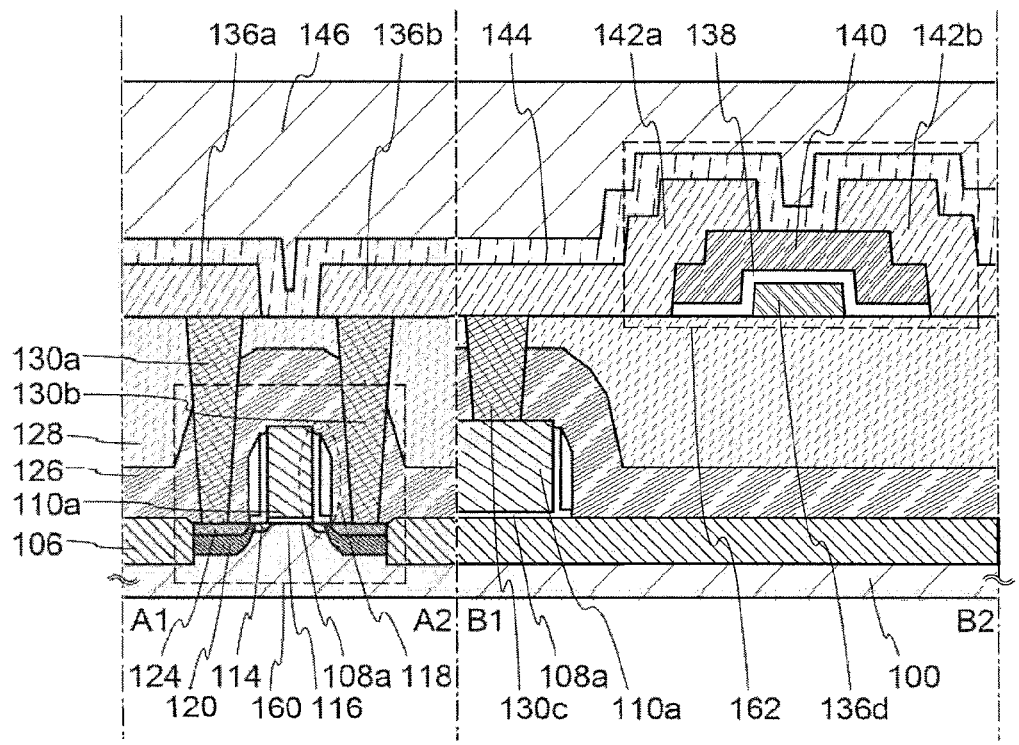

FIGS. 8A and 8B each illustrate an example of a structure in which the element has a relatively large size and the gate electrode 136d is provided under the oxide semiconductor layer 140. In this case, a wiring, an electrode, or the like does not need to be formed so as to be embedded in the insulating layer because flatness or coverage of a surface is not needed to be extremely high. For example, the gate electrode 136d and the like can be formed in such a manner that a conductive layer is formed and then patterned. Note that although not illustrated, the transistor 160 can be manufactured similarly.

A large difference between the structure illustrated in FIG. 8A and that illustrated in FIG. 8B is the surface at which the source or drain electrode 142a and the source or drain electrode 142b are in contact with the oxide semiconductor layer 140, which is either the top surface or the bottom surface of the oxide semiconductor layer 140. In addition, resulting from this difference, a position of another electrode; another insulating layer, or the like is changed. As for details of each component, the structure illustrated in FIGS. 2A and 2B or other drawings can be referred to.

Specifically, in the structure illustrated in FIG. 8A, the semiconductor device includes the gate electrode 136d provided over the interlayer insulating layer 128, the gate insulating layer 138 provided over the gate electrode 136d, the source or drain electrode 142a and the source or drain electrode 142b which are provided over the gate insulating layer 138, and the oxide semiconductor layer 140 in contact with the top surfaces of the source or drain electrode 142a and the source or drain electrode 142b.

In the structure illustrated in FIG. 8B, the semiconductor device includes the gate electrode 136d provided over the interlayer insulating layer 128, the gate insulating layer 138 provided over the gate electrode 136d, the oxide semiconductor layer 140 provided over the gate insulating layer 138 so as to overlap with the gate electrode 136d, and the source or drain electrode 142a and the source or drain electrode 142b which are provided in contact with the top surface of the oxide semiconductor layer 140.

Note that a component which the structure illustrated in FIGS. 2A and 2B or the like has can be omitted in some cases also in the structures illustrated in FIGS. 8A and 8B. Also in this case, simplification of the manufacturing process can be achieved.

Figure 9A:
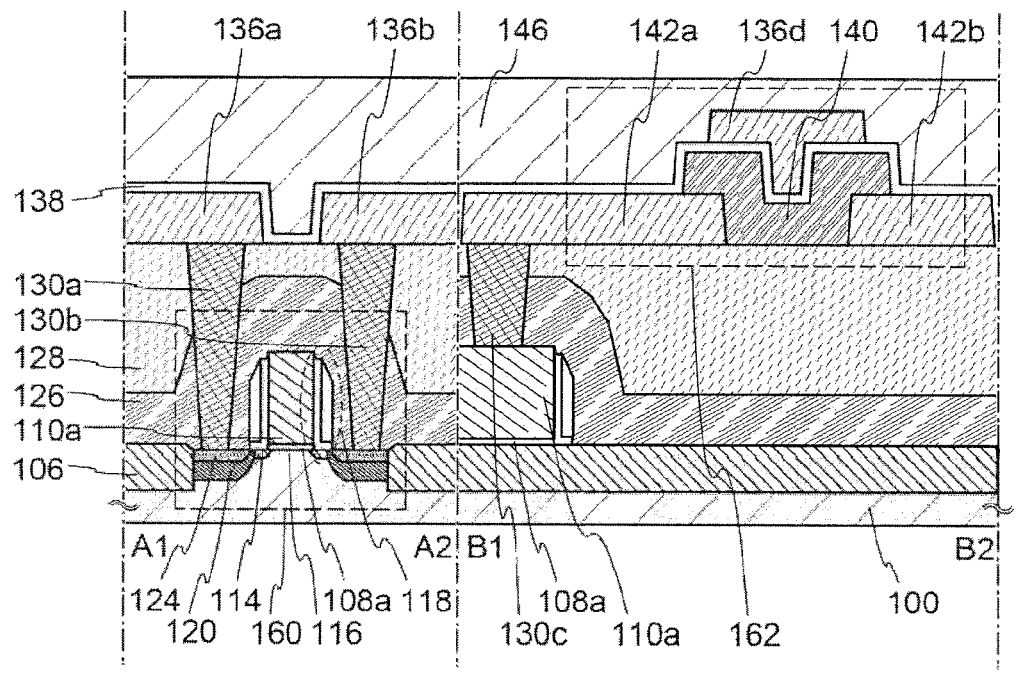
FIGS. 9A and 9B are cross-sectional views for explaining semiconductor devices.
Figure 9B:
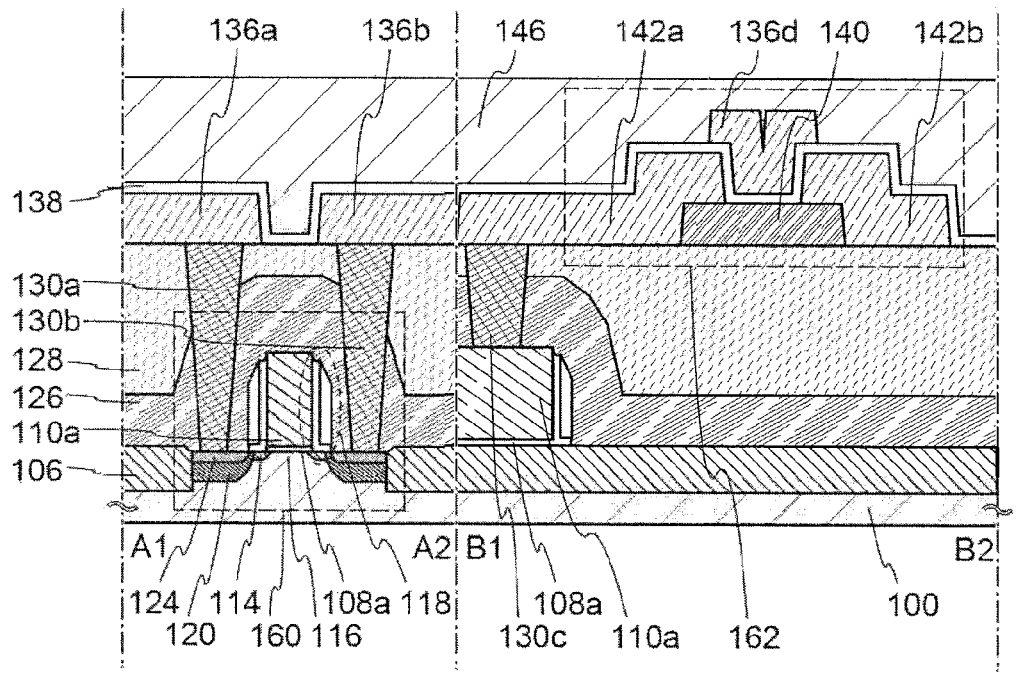

FIGS. 9A and 9B each illustrate an example of a structure in which the element has a relatively large size and the gate electrode 136d is provided over the oxide semiconductor layer 140. Also in this case, a wiring, an electrode, or the like does not need to be formed so as to be embedded in the insulating layer because flatness or coverage of a surface is not needed to be extremely high. For example, the gate electrode 136d and the like can be formed in such a manner that a conductive layer is formed and then patterned. Note that although not illustrated, the transistor 160 can be manufactured similarly.

A large difference between the structure illustrated in FIG. 9A and that illustrated in FIG. 9B is the surface at which the source or drain electrode 142a and the source or drain electrode 142b are in contact with the oxide semiconductor layer 140, which is either the top surface or the bottom surface of the oxide semiconductor layer 140. In addition, resulting from this difference, a position of another electrode, another insulating layer, or the like is changed. As for details of each component, the structure illustrated in FIGS. 2A and 2B or other drawings can be referred to.

Specifically, in FIG. 9A, the semiconductor device includes the source or drain electrode 142a and the source or drain electrode 142b which are provided over the interlayer insulating layer 128; the oxide semiconductor layer 140 which is in contact with the top surfaces of the source or drain electrode 142a and the source or drain electrode 142b; the gate insulating layer 138 provided over the source or drain electrode 142a, the source or drain electrode 142b, and the oxide semiconductor layer 140; and the gate electrode 136d over the gate insulating layer 138 which is provided in a region overlapping with the oxide semiconductor layer 140.

In FIG. 9B, the semiconductor device includes the oxide semiconductor layer 140 provided over the interlayer insulating layer 128; the source or drain electrode 142a and the source or drain electrode 142b which are provided in contact with the top surface of the oxide semiconductor layer 140; the gate insulating layer 138 provided over the source or drain electrode layer 142a, the source or drain electrode layer 142b, and the oxide semiconductor layer 140; and the gate electrode 136d over the gate insulating layer 138 which is provided in a region overlapping with the oxide semiconductor layer 140.

Note that a component which the structure illustrated in FIGS. 2A and 2B or the like has can be omitted in some cases also in the structures illustrated in FIGS. 9A and 9B. Also in this case, simplification of the manufacturing process can be achieved.

As described above, according to one embodiment of the disclosed invention, a semiconductor device having a novel structure is realized. Although the transistor 160 and the transistor 162 are stacked in this embodiment, the structure of the semiconductor device is not limited thereto. Further, although an example in which the channel length direction of the transistor 160 and that of the transistor 162 are perpendicular to each other is described, the positions of the transistors 160 and 162 are not limited to this. In addition, the transistors 160 and 162 may be provided to overlap with each other.

Note that although in this embodiment a semiconductor device per minimum storage unit (one bit) is described for easy understanding, the structure of the semiconductor device is not limited to this. A more developed semiconductor device can be formed by appropriately connecting a plurality of semiconductor devices. For example, it is possible to make a NAND-type or NOR-type semiconductor device by using a plurality of semiconductor devices. The structure of the wiring is not limited to that illustrated in FIG. 1 and can be changed as appropriate.

In the semiconductor device according to this embodiment, the small off-state current characteristic of the transistor 162 enables data to be held for an extremely long time. In other words, refresh operation, which is needed in a DRAM or the like, is not necessary; thus, power consumption can be suppressed. In addition, the semiconductor device can be substantially used as a nonvolatile semiconductor device.

Since data is written by switching operation of the transistor 162, high voltage is not needed and an element is not deteriorated in the semiconductor device. Further, the semiconductor device can easily operate at high speed because data is written or erased by turning the transistor on or off. In addition, there is an advantage that erasing operation for erasing data, which is necessary operation in a flash memory or the like, is not needed.

Furthermore, a transistor formed using a material other than an oxide semiconductor can operate at a speed much higher than that of a transistor formed using an oxide semiconductor, and thus realizes high-speed reading of stored contents.

The structures, methods, or the like described in this embodiment can be combined with those in any of the other embodiments as appropriate.

Embodiment 2

In this embodiment, a circuit configuration and operation of a semiconductor device according to an embodiment of the present invention are described.

Figure 10:
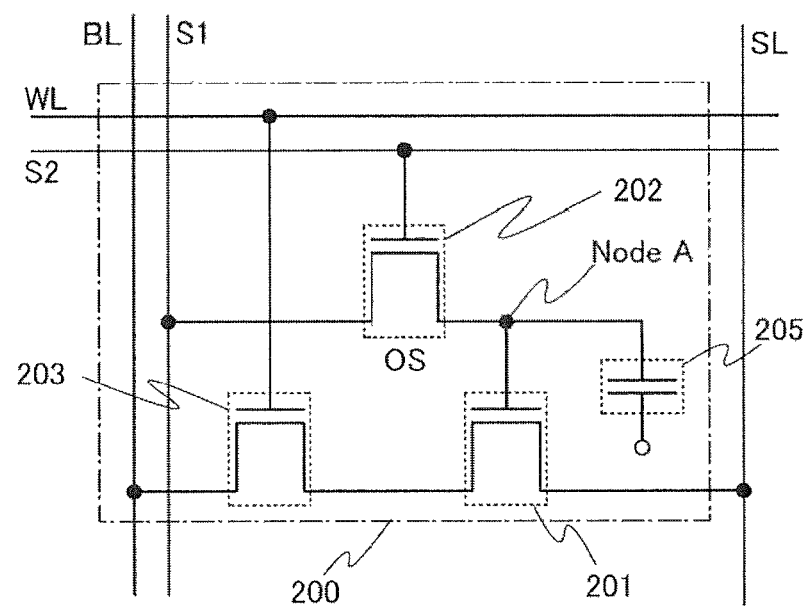
FIG. 10 is a circuit diagram for explaining a memory element.

An example of a circuit diagram of a memory element (hereinafter also referred to as a memory cell) included in the semiconductor device is illustrated in FIG. 10. A memory cell 200 illustrated in FIG. 10 is a multivalued memory cell and includes a source line SL, a bit line BL, a first signal line S1, a second signal line S2, a word line WL, a transistor 201, a transistor 202, a transistor 203, and a capacitor 205. The transistors 201 and 203 are formed using a material other than an oxide semiconductor, and the transistor 202 is formed using an oxide semiconductor.

Here, a gate electrode of the transistor 201 is electrically connected to one of a source electrode and a drain electrode of the transistor 202. In addition, the source line SL is electrically connected to a source electrode of the transistor 201, and a source electrode of the transistor 203 is electrically connected to a drain electrode of the transistor 201. The bit line BL is electrically connected to a drain electrode of the transistor 203, and the first signal line S1 is electrically connected to the other of the source electrode and the drain electrode of the transistor 202. The second signal line S2 is electrically connected to a gate electrode of the transistor 202, and the word line WL is electrically connected to a gate electrode of the transistor 203. Additionally, one electrode of the capacitor 205 is electrically connected to the gate electrode of the transistor 201 and the one of the source electrode and the drain electrode of the transistor 202. The other electrode of the capacitor 205 is supplied with the predetermined potential, for example, GND.

Next, operation of the memory cell 200 illustrated in FIG. 10 is described. In the case where the memory cell 200 is a four-valued memory cell is described. Four states of the memory cell 200 are data "00b", "01b", "10b", and "11b", and potentials of a node A in the four states are $V_{00}$, $V_{01}$, $V_{10}$, and $V_{11}$ ($V_{00} < V_{01} < V_{10} < V_{11}$), respectively.

When writing is performed to the memory cell 200, the source line SL is set to 0 [V], the word line WL is set to 0 [V], the bit line BL is set to 0 [V], and the second signal line S2 is set to 2 [V]. When writing of the data "00b" is performed, the first signal line S is set to o [V]. When writing of the data "01b" is performed, the first signal line S1 is set to $V_{01}$ [V]. When writing of the data "10b" is performed, the first signal line S1 is set to $V_{10}$ [V]. When writing of the data "11b" is performed, the first signal line S1 is set to $V_{11}$ [V]. At this time, the transistor 203 is in an off state and the transistor 202 is an on state. Note that at the end of the writing, the second signal line S2 is set to 0 [V] before the potential of the first signal line S1 is changed, so that the transistor 202 is turned off.

As a result, after writing the data "00b", "01b", "10b", or "11b", the potential of a node connected to the gate electrode of the transistor 201 (hereinafter referred to as the node A) is approximately $V_{00}$ [V], $V_{01}$ [V], $V_{10}$ [V], or $V_{11}$ [V], respectively. Charge is accumulated in the node A in accordance with the potential of the first signal line S1, and since off current of the transistor 202 is extremely small or substantially 0, the potential of the gate electrode of the transistor 201 is retained for a long time.

When reading of the memory cell 200 is performed, first, the bit line BL is precharged to $V_{pc}$ [V]. Then, the source line SL is set to $V_{s\_read}$ [V], the word line WL is set to 2 V, the second signal line S2 is set to 0 V, and the first signal line S1 is set to 0 [V]. At this time, the transistor 203 is in an on state and the transistor 202 is in an off state.

As a result, current flows from the source line SL to the bit line BL, and the bit line is charged to a potential represented by (the potential of the node A)−(the threshold voltage Vth of the transistor 201). Consequently, the potentials of the bit line BL becomes $V_{00}-V_{th}$, $V_{01}-V_{th}$, $V_{10}-V_{th}$, and $V_{11}-V_{th}$ corresponding to the data "00b", "01b", "10b", and "11b", respectively. Since the potentials of the bit lines corresponding to the data are different from each other, a reading circuit connected to the bit line BL can read out the data "00b", "01b", "10b", and "11b".

Figure 11:
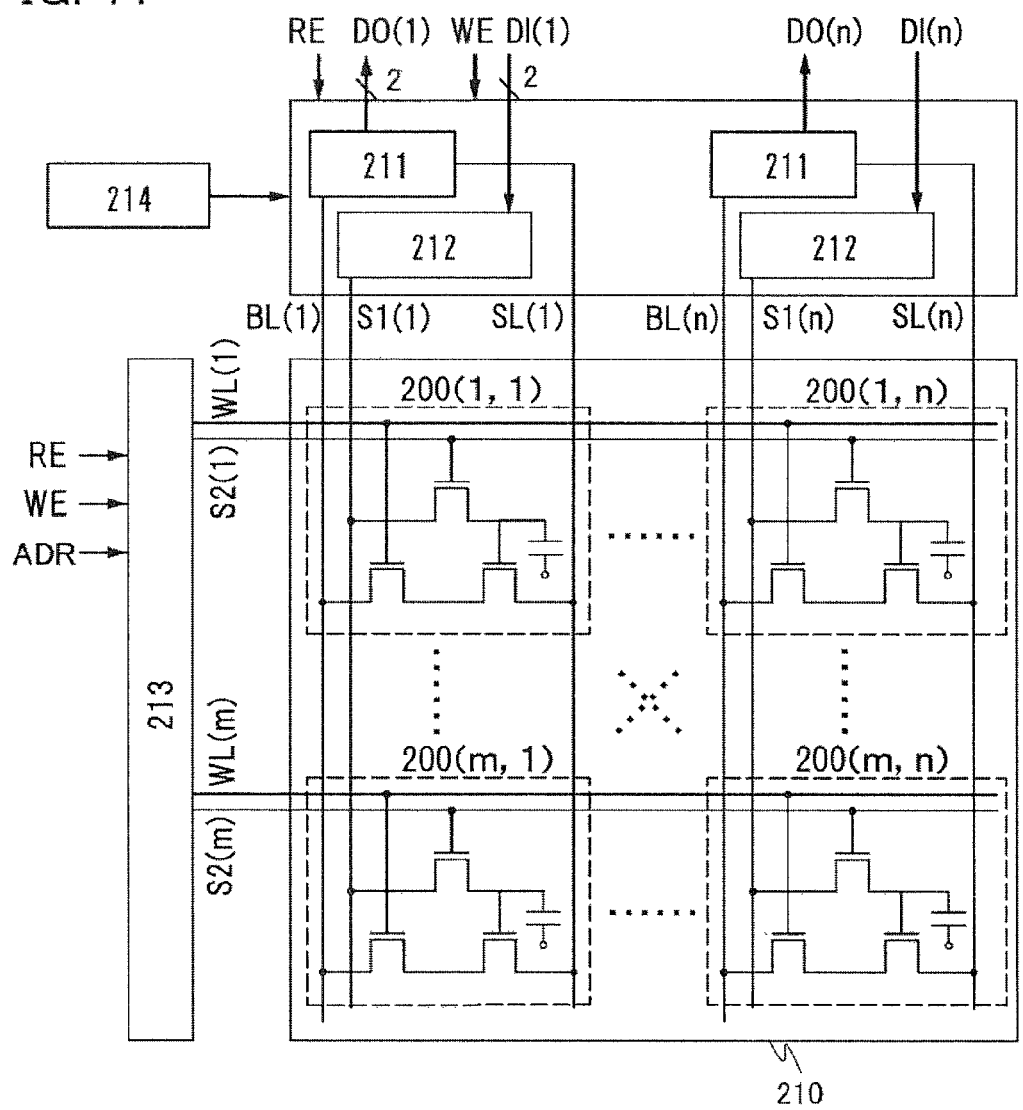
FIG. 11 is a circuit diagram for explaining a semiconductor device.

A block circuit diagram of a semiconductor device according to an embodiment of the present invention, which includes storage capacity of m×n bits is illustrated in FIG. 11.

The semiconductor device according to an embodiment of the present invention includes m word lines WL, m second signal lines S2, n bit lines BL, n first signal lines S1, n source lines SL, a memory cell array 210 including a plurality of memory cells 200(1,1) to 200(m,n) arranged in a matrix of m cells (rows) by n cells (columns) (both in and n are natural numbers), and peripheral circuits such as reading circuits 211, first signal line driver circuits 212, a driver circuit 213 for the second signal lines and word lines, and a potential generating circuit 214. As another peripheral circuit, a refresh circuit and the like may be provided.

Each of the memory cells, for example, a memory cell 200(i,j) is considered (here, i is integer of greater than or equal to 1 and less than or equal to m, and j is integer of greater than or equal to 1 and less than or equal to n). The a memory cell 200(i,j) is connected to the bit line BL (j), the first signal line S1 (j), the source line SL (j), the word line WL (i), and the second signal line S2(i). In addition, the bit lines BL(1) to BL (n) and the source lines SL (1) to SL (a) are connected to the reading circuits 211. The first signal lines S1 (1) to S1 (n) are connected to the first signal line driver circuits 212. The word lines WL (1) to WL (m) and the second signal lines S2 (1) to S2 (m) are connected to the driver circuit 213 for the second signal lines and the word lines.

Figure 12:
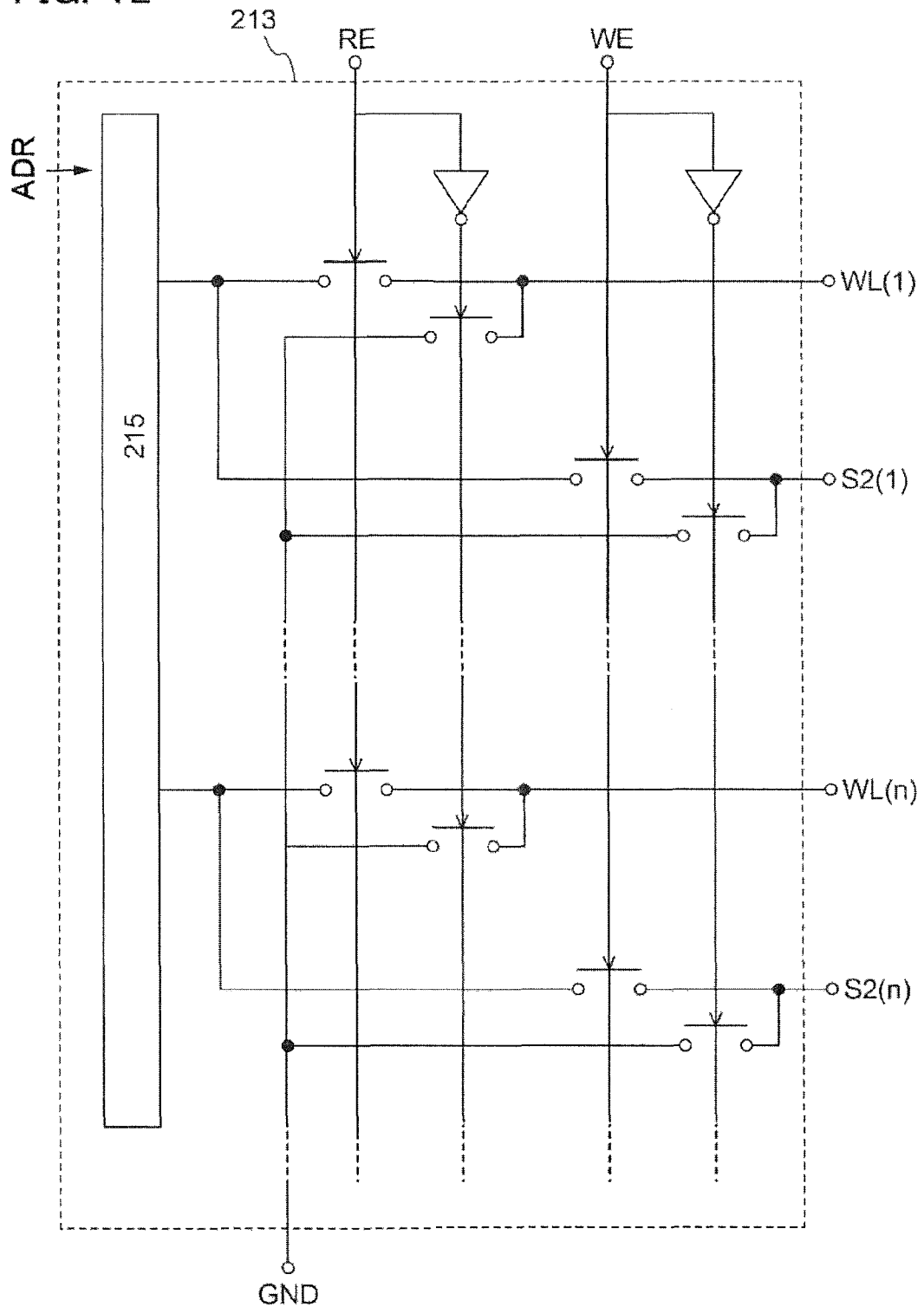
FIG. 12 is a circuit diagram for explaining a driver circuit.

An example of the driver circuit 213 for the second signal lines and the word lines is illustrated in FIG. 12. The driver circuit 213 for the second signal lines and the word lines includes a decoder 215. The decoder 215 is connected to the second signal lines S2 and the word lines WL via switches. Further, the second signal lines S2 and the word lines WL are connected to GND (a ground potential) via the switches. The switches are controlled by a read enable signal (an RE signal) or a write enable signal (a WE signal). An address signal ADR is input to the decoder 215 from the external.

When the address signal ADR is input to the driver circuit 213 for the second signal lines and the word lines, rows specified by the address (hereinafter also referred to as selected rows) are asserted (activation) and the other rows (hereinafter also referred to as non-selected rows) are de-asserted (inactivation). Further, when the RE signal is asserted, the word line WL is connected to an output of the decoder 215, and when the RE signal is de-asserted, the word line WL is connected to the GND. When the WE signal is asserted, the second signal line S2 is connected to the output of the decoder 215, and when the WE signal is de-asserted, the second signal line S2 is connected to the GND.

Figure 13:
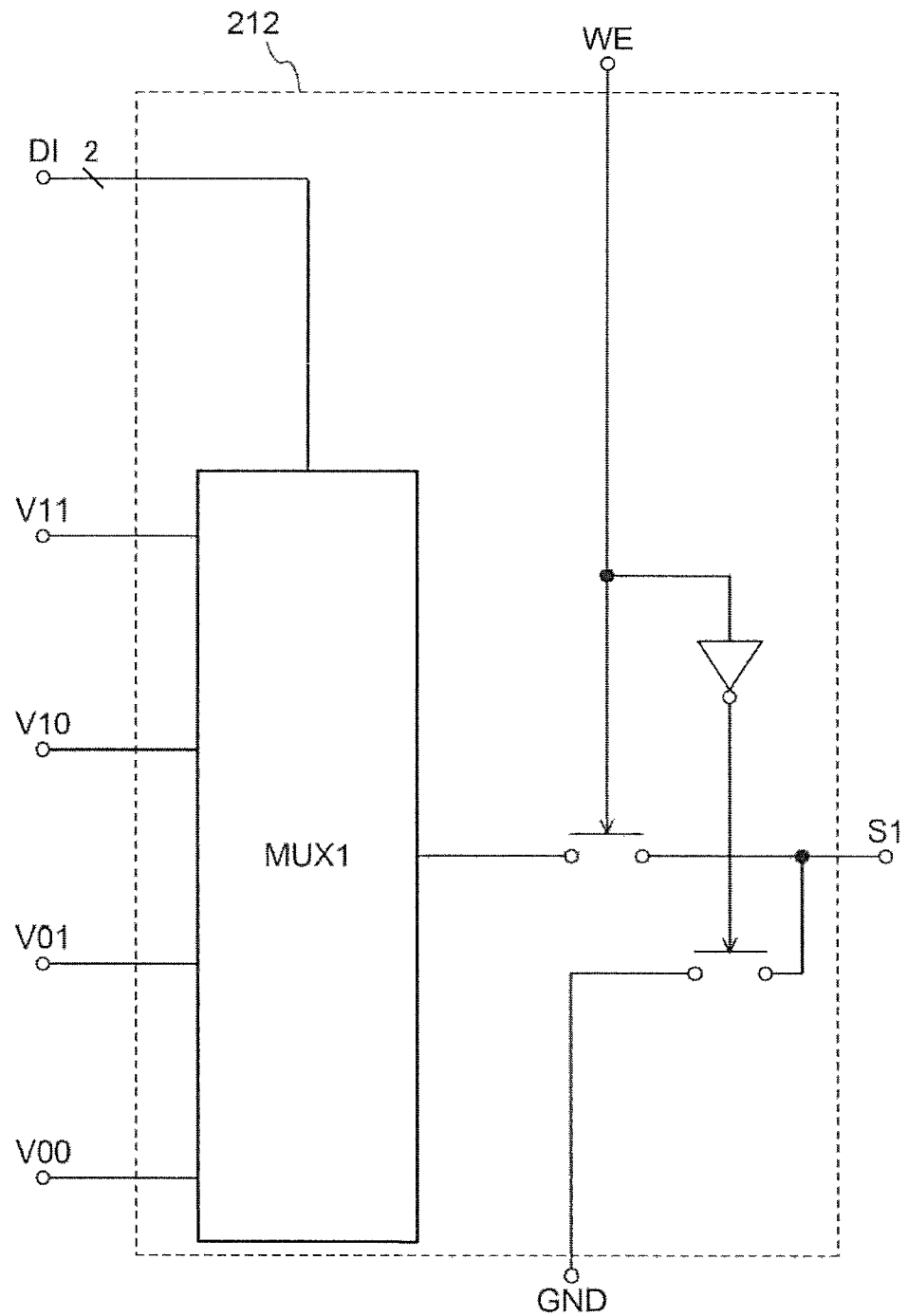
FIG. 13 is a circuit diagram for explaining a driver circuit.

An example of the first signal line driver circuit 212 is illustrated in FIG. 13. The first signal line driver circuit 212 includes a multiplexer (MUX1). DI and the writing potentials $V_{00}$, $V_{01}$, $V_{10}$, and $V_{11}$ are input to the multiplexer (MUX1). An output terminal of the multiplexer is connected to the first signal line S1 via a switch. Additionally, the first signal line S1 is connected to GND via a switch. The switches are controlled by a write enable signal (a WE signal).

When DI is input to the first signal line driver circuit 212, the multiplexer (MUX1) selects a writing potential $V_w$, in accordance with the value of DI from the writing potentials $V_{00}$, $V_{01}$, $V_{10}$, and $V_{11}$. The behavior of the multiplexer (MUX1) is shown in Table 1. When the WE signal is asserted, the selected writing potential $V_w$ is applied to the first signal line S1. When the WE signal is de-asserted, 0 V is applied to the first signal line S1 (the first signal line S1 is connected to the GND).

TABLE 1

| DI[1] | DI[0] | MUX1 output |
|---|---|---|
| 0 | 0 | corresponding to $V_{00}$ |
| 0 | 1 | corresponding to $V_{01}$ |
| 1 | 0 | corresponding to $V_{10}$ |
| 1 | 1 | corresponding to $V_{11}$ |

Figure 14:
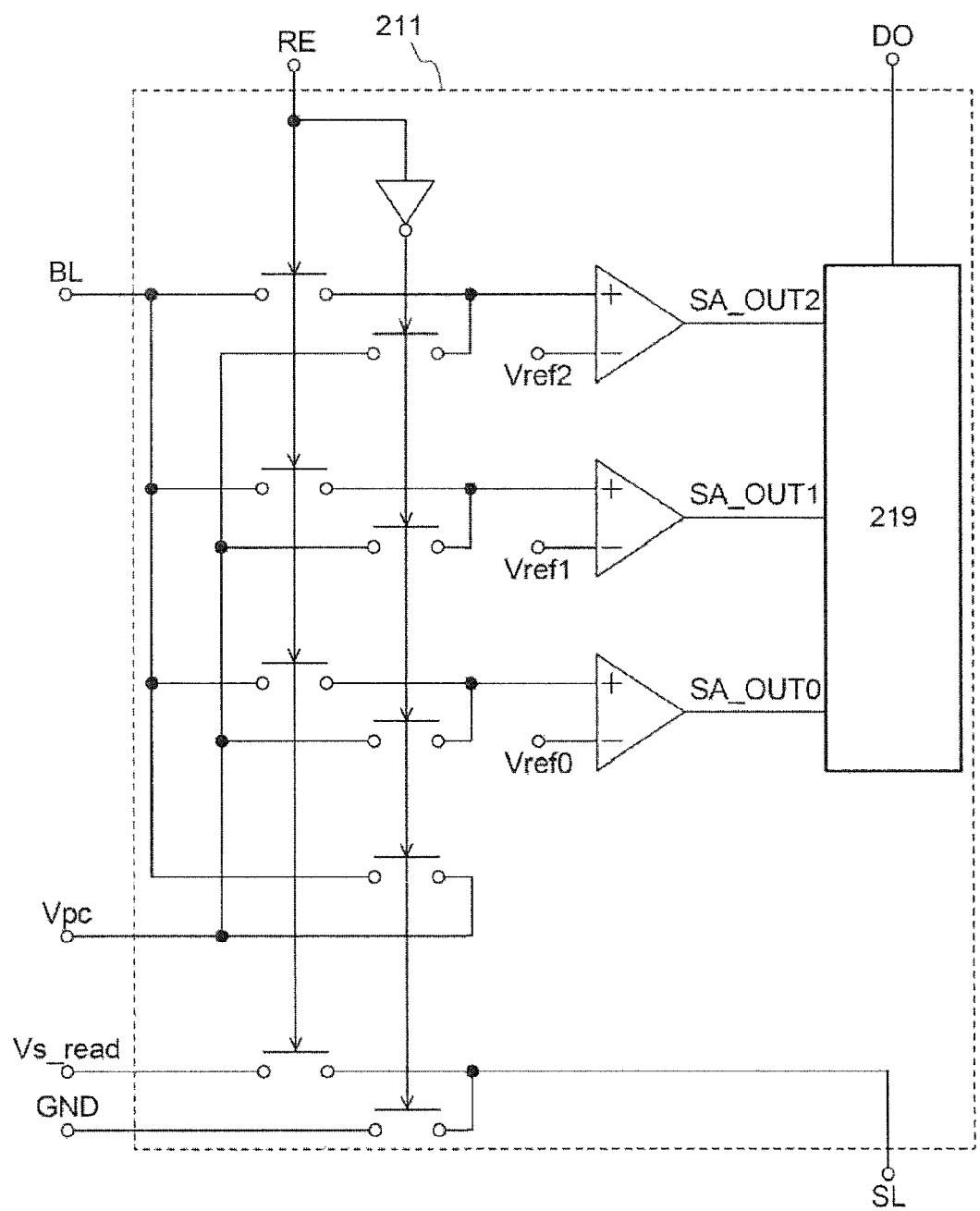
FIG. 14 is a circuit diagram for explaining a driver circuit.

An example of the reading circuit 211 is illustrated in FIG. 14. The reading circuit 211 includes a plurality of sense amplifier circuits, a logic circuit 219, and the like. One input terminal of each of the sense amplifier circuits is connected to the bit line BL or a wiring $V_{pc}$ via a switch. Any of reference potentials $V_{ref0}$, $V_{ref1}$, and $V_{ref2}$ is input to the other input terminal of each of the sense amplifier circuits. An output terminal of each of the sense amplifier circuits is connected to an input terminal of the logic circuit 219, Note that the switches are controlled by a read enable signal (an RE signal).

A state of a memory cell can be read out as a 3-bit digital signal by setting values of each of the reference potentials $V_{ref0}$, $V_{ref1}$, and $V_{ref2}$ so as to satisfy $V_{00}-V_{th}<V_{ref0}<V_{01}-V_{th}<V_{ref1}<V_{10}-V_{th}<V_{ref2}<V_{11}-V_{th}$. For example, in the case of the data "00b", the potential of the bit line BL is $V_{00}-V_{th}$. Here, the potential of the bit line is smaller than any of the reference potentials $V_{ref0}$, $V_{ref1}$, and $V_{ref2}$; therefore, each of outputs SA_OUT0, SA_OUT1, and SA_OUT2 of the sense amplifier circuits becomes "0". Similarly, in the case of the data "01b", the potential of the bit line BL is $V_{01}-V_{th}$, so that the outputs SA_OUT0, SA_OUT1, and SA_OUT2 of the sense amplifier circuits become "1", "0", and "0", respectively. In the case of the data "10b", the potential of the bit line BL is $V_{10}-V_{th}$, whereby the outputs SA_OUT0, SA_OUT1, and SA_OUT2 of the sense amplifier circuits become "1", "1", and "0", respectively. In the case of the data "11b", the potential of the bit line BL is $V_{11}-V_{th}$, so that the outputs SA_OUT0, SA_OUT1, and SA_OUT2 of the sense amplifier circuits become "1", "1", and "1", respectively. After that, using the logic circuit 219 shown in a logic table in Table 2, 2-bit data DO is generated and output from the reading circuit 211.

TABLE 2

| SA_OUT0 | SA_OUT1 | SA_OUT2 | DO1 | DO0 |
|---|---|---|---|---|
| 0 | 0 | 0 | 0 | 0 |
| 1 | 0 | 0 | 0 | 1 |
| 1 | 1 | 0 | 1 | 0 |
| 1 | 1 | 1 | 1 | 1 |

Note that in the reading circuit 211 illustrated here, when the RE signal is de-asserted, the source line SL is connected to GND and 0 V is applied to the source line SL. At the same time, the potential $C_{pc}$ [V] is applied to the bit line BL and a terminal of the sense amplifier circuits connected to the bit line BL. When the RE signal is asserted, $V_{s\_read}$ [V] is applied to the source line SL, whereby a potential reflecting data is charged to the bit line BL. Then, the reading is performed. Note that the potential $V_{pc}$ is set to lower than $V_{00}-V_{th}$. Additionally, $V_{s\_read}$ is set to higher than $V_{11}-V_{th}$.

Note that "potentials of the bit line BL" compared in reading include the potential of a node of input terminals of the sense amplifier circuits connected to the bit line BL through switches. That is, potentials compared in the reading circuit are not necessarily exactly the same as the potentials of the bit line BL.

Figure 21:
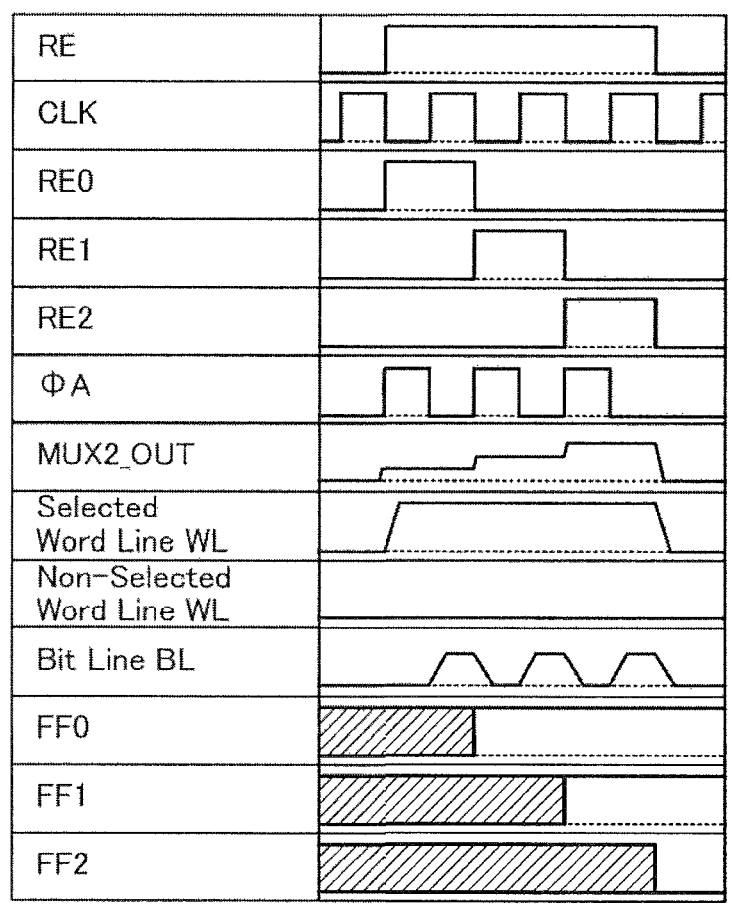
FIG. 21 is a timing chart for explaining operation.

An example of the potential generating circuit 214 is illustrated in FIG. 15. In the potential generating circuit 214, a potential is divided between $V_{dd}$ and GND by resistance, whereby desired potentials can be obtained. Then the generated potentials are output through an analogue buffer 220. In such a manner, the writing potentials $V_{00}$, $V_{01}$, $V_{10}$, and $V_{11}$ and the reference potentials $V_{ref0}$, $V_{ref1}$, and $V_{ref2}$ are generated. Note that a configuration in which $V_{00} < V_{ref0} < V_{01} < V_{ref1} < V_{10} < V_{ref2} < V_{11}$ is illustrated in FIG. 21; however, a potential relation is not limited thereto. Potentials required can be generated as appropriate by adjusting a resistor and nodes to which the reference potentials are connected to. Further, $V_{00}$, $V_{01}$, $V_{10}$, and $V_{11}$ may be generated using a different potential generating circuit from $V_{ref0}$, $V_{ref1}$, and $V_{ref2}$.

Figure 17:
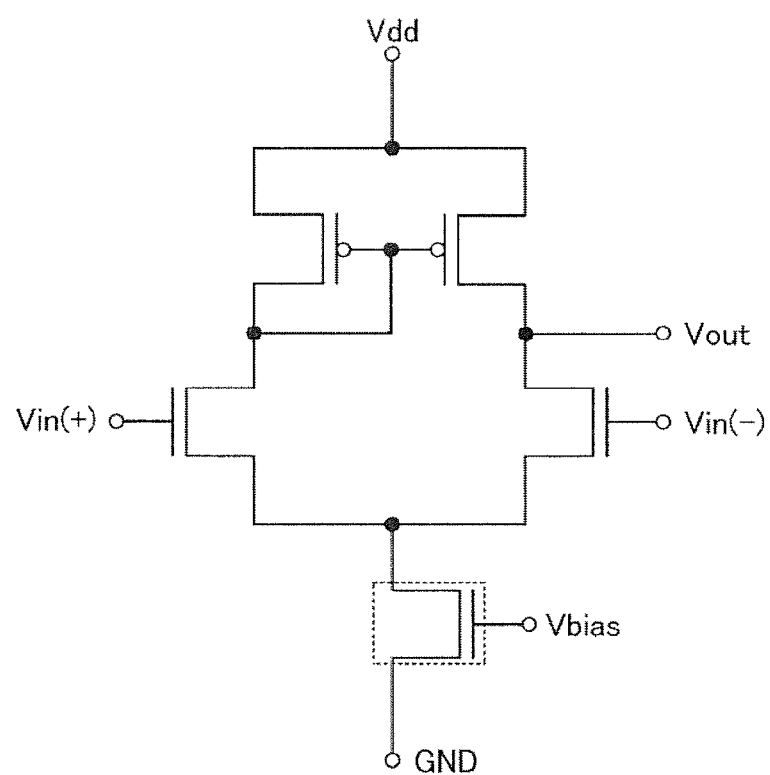
FIG. 17 is a circuit diagram for explaining a semiconductor device.

FIG. 17 illustrates a differential sense amplifier as an example of the sense amplifier circuit. The differential sense amplifier includes input terminals $V_{in}$ (+) and $V_{in}$ (−) and an output terminal $V_{out}$, and amplifies a difference between $V_{in}$ (+) and $V_{in}$ (−). $V_{out}$ is approximately high output when $V_{in}$ (+) > $V_{in}$ (−), and is approximately low output when $V_{in}$ (+) < $V_{in}$ (−).

Figure 18:
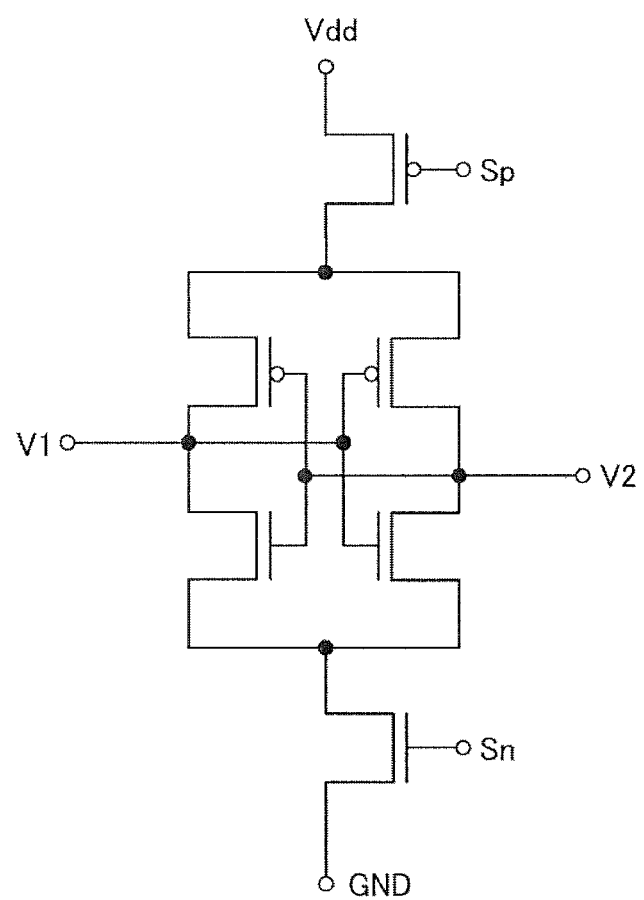
FIG. 18 is a circuit diagram for explaining a semiconductor device.

FIG. 18 illustrates a latch sense amplifier as an example of a sense amplifier circuit. The latch sense amplifier includes input-output terminals V1 and V2 and input terminals of control signals Sp and Sn. First, power supply is stopped setting the signal Sp at high and the signal Sn at low. Next, potentials to be compared are applied to V1 and V2. After that, when power is supplied setting the signal Sp at low and the signal Sn at high, V1 becomes high output and V2 becomes low output when potentials before supplying the power is V1>V2. V1 becomes low output and T2 becomes high output when potentials before supplying the power is V1<V2. In such a manner, a potential difference between V1 and V2 is amplified.

Figure 16A:
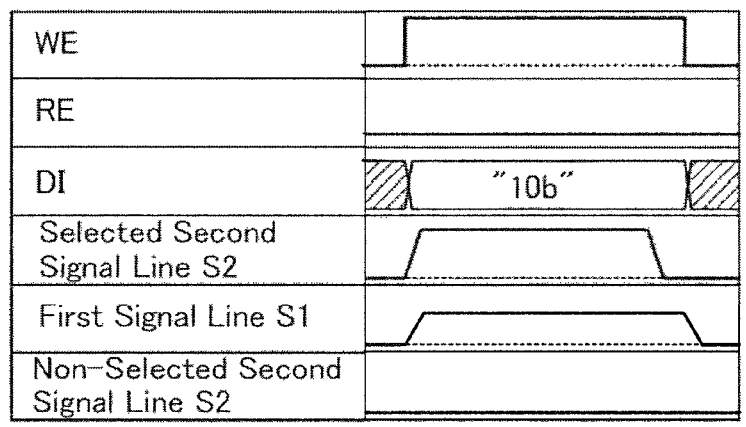
FIGS. 16A and 16B are timing charts for explaining operation.
Figure 16B:
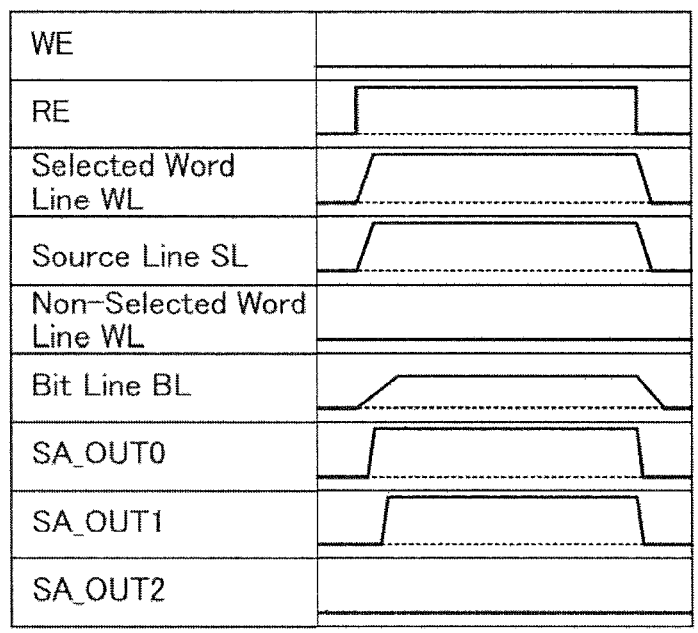

FIG. 16A illustrates an example of a timing chart of writing operation. The case where writing of data "10b" to a memory cell is performed is illustrated in the timing chart in FIG. 16A. The selected second signal line S2 becomes 0 V earlier than the first signal line S1. During the writing period, the potential of the first signal line S1 becomes $V_{10}$. Note that the word line WL, the bit line BL, and the source line SL have 0 V. In addition, FIG. 16B illustrates an example of a timing chart of reading operation. The case where reading of data "10b" is performed from a memory cell is illustrated in the timing chart in FIG. 16B. When the selected word line WL is asserted and the source line SL has $V_{s\_read}$ [V], the bit line BL is charged to $V_{10}-V_{th}$ [V] corresponding to the data "10b" of the memory cell. As a result, SA_OUT0, SA_OUT1, and SA_OUT2 become "1", "1", and "0", respectively. Note that both the first signal line S1 and the second signal line S2 have 0 V.

Here, examples of specific operation potentials (voltages) are described. For example, the following can be obtained: the threshold voltage of the transistor 201 is approximately 0.3 V, the power supply voltage $V_{DD}$ is 2 V, $V_{11}$ is 1.6 V, $V_{10}$ is 1.2 V, $V_{01}$ is 0.8 V, $V_{00}$ is 0V. $V_{ref0}$ is 0.3 V, $V_{ref1}$ is 0.7 V, and $V_{ref2}$ is 1.1 V. The potential $V_{pc}$ is preferably 0 V, for example.

Additionally, in this embodiment, the first signal line S1 is arranged in the bit line BL direction (column direction) and the second signal line S2 is arranged in the word line WL direction (row direction); however, one embodiment of the present invention is not limited thereto. For example, the first signal line S1 may be arranged in the word line WL direction (row direction) and the second signal line S2 may be arranged in the bit line BL direction (column direction). In such a case, the driver circuit to which the first signal line S1 is connected and the driver circuit to which the second signal line S2 is connected may be arranged as appropriate.

In this embodiment, operation of four valued memory cells, that is, the case where writing and reading of any of the four different states are performed in one memory cell is described. However, operation of n valued memory cells, that is, writing and reading of any of arbitrary n different states (n is integer greater than or equal to 2) can be performed by changing a circuit configuration as appropriate.

For example, in an eight-valued memory cell, storage capacity becomes three times as large as a two-valued memory cell. When writing is performed, eight kinds of writing potentials are prepared to determine a potential of node A and eight states are generated. When reading is performed, seven kinds of reference potentials with which the eight states can be distinguished are prepared. One sense amplifier is provided and comparison is performed seven times, so that data can be read out. Further, the number of comparison times may be reduced to three times by feeding back the result of comparison Generally, in a $2^k$-valued memory cells (k is integer greater than or equal to 1), storage capacitor is k times as large as a two-valued memory cell. When writing is performed, $2^k$ kinds of writing potentials to determine a potential of node A are prepared, and a $2^k$ number of states are generated. When reading is performed, $2^k-1$ kinds of reference potentials with which $2^k$ states can be distinguished may be prepared. One sense amplifier is provided and comparison is performed $2^k-1$ times, so that data can be read. Further, the number of comparisons may be reduced to k times by feeding back the result of comparison. In a reading method for driving the source line SL, data can be read in one comparison by providing a $2^k-1$ number of sense amplifiers. Furthermore, a plurality of sense amplifiers can be provided and comparison is performed plural times.

The semiconductor device according to this embodiment can retain data for quite a long time because of low off-state current characteristics of the transistor 202. That is, refresh operation which is necessary in a DRAM and the like is not needed, so that power consumption can be suppressed. In addition, the semiconductor device of this embodiment can be used as a substantial nonvolatile memory device.

Since writing data and the like are performed by switching operation of the transistor 202, high voltage is not needed and there is no problem of deterioration of elements. Further, high-speed operation can be easily realized because writing data and erasing data are performed by turning transistors on or off. Furthermore, direct rewriting of data can be performed by controlling a potential input to a transistor. Accordingly, erasing operation which is necessary in flash memory and the like is not needed, and decrease in operation speed due to erasing operation can be prevented.

Moreover, a transistor using a material other than an oxide semiconductor material can operate at sufficiently high speed; therefore, by using the transistor, memory content can be read at high speed.

The semiconductor device according to this embodiment is a multivalued semiconductor device, so that storage capacity per area can be increased. Therefore, the size of the semiconductor device can be reduced and the semiconductor device can be highly integrated. Additionally, potentials of node which becomes a floating state when writing operation is performed can be directly controlled; thus, threshold voltage can be easily controlled with high accuracy which is required for a multivalued memory element. Therefore, verification of states after writing data which is required to a multivalued memory element can be omitted, and in such a case, time required for writing data can be shortened Embodiment 3

In this embodiment, a circuit configuration and operation of a semiconductor device according to an embodiment of the present invention are described.

In this embodiment, the case where reading operation which is different from that of Embodiment 2 is performed is described with the use of a circuit configuration of a memory element illustrated in FIG. 10. Note that a capacitor 205 is not included in FIG. 10 in some cases. The memory element is a multivalued memory element, and a four-valued memory cell is described in this embodiment. Four states of a memory cell 200 are data "00b", "01b", "10b", and "11b", and potentials of a node A in the four states are $V_{00}$, $V_{01}$, $V_{10}$, and $V_{11}$ ($V_{00} < V_{01} < V_{10} < V_{11}$), respectively.

In the case where writing to the memory cell 200 is performed, a source line SL is set to 0 [V], a word line WL is set to 0 [V], a bit line BL is set to 0 [V], and a second signal line S2 is set to 2 [V]. In the case of writing the data "00b", a first signal line S1 is set to $V_{00}$ [V]. In the case of writing the data "01b", the first signal line S1 is set to $V_{01}$ [V]. In the case of writing the data "10b", the first signal line S1 is set to $V_{10}$ [V]. In the case of writing the data "11b", the first signal line S1 is set to $V_{11}$ [V]. At this time, a transistor 203 is in an off state and a transistor 202 is in an on state. Note that at the end of the writing, the second signal line S2 is set to 0 [V] before the potential of the first signal line S1 is changed, so that the transistor 202 is turned off.

As a result, after writing the data "00b", "01b", "10b", or "11b", the potential of a node connected to a gate electrode of the transistor 201 (hereinafter, referred to as the node A) is approximately $V_{00}$ [V], $V_{01}$ [V], $V_{10}$ [V], or $V_{11}$ [V], respectively. Charge is accumulated in the node A in accordance with the potential of the first signal line S1, and since off current of the transistor 202 is extremely small or substantially 0, the potential of the gate electrode of the transistor 201 is retained for a long time.

Next, in the case where reading of the memory cell 200 is performed, the source line SL is set to 0 V, the word line WL is set to $V_{DD}$, the second signal line S2 is set to 0 V, the first signal line S1 is set to 0 V, and a reading circuit 211 connected to the bit line BL is in an operation state. At this time, the transistor 203 is in an on state and the transistor 202 is in an off state.

As a result, an effective resistance value of the memory cell 200 is determined in accordance with the state of the memory cell 200. As the potential of the node A is increased, the effective resistance value is reduced. The reading circuit can be read out the data "00b", "01b", "10b", and "11b" from a difference between the resistance values. Note that in the case of the data other than the data "00b" in which the potential of the node A is the lowest value, it is preferable that the transistor 201 be in an on state.

Figure 19:
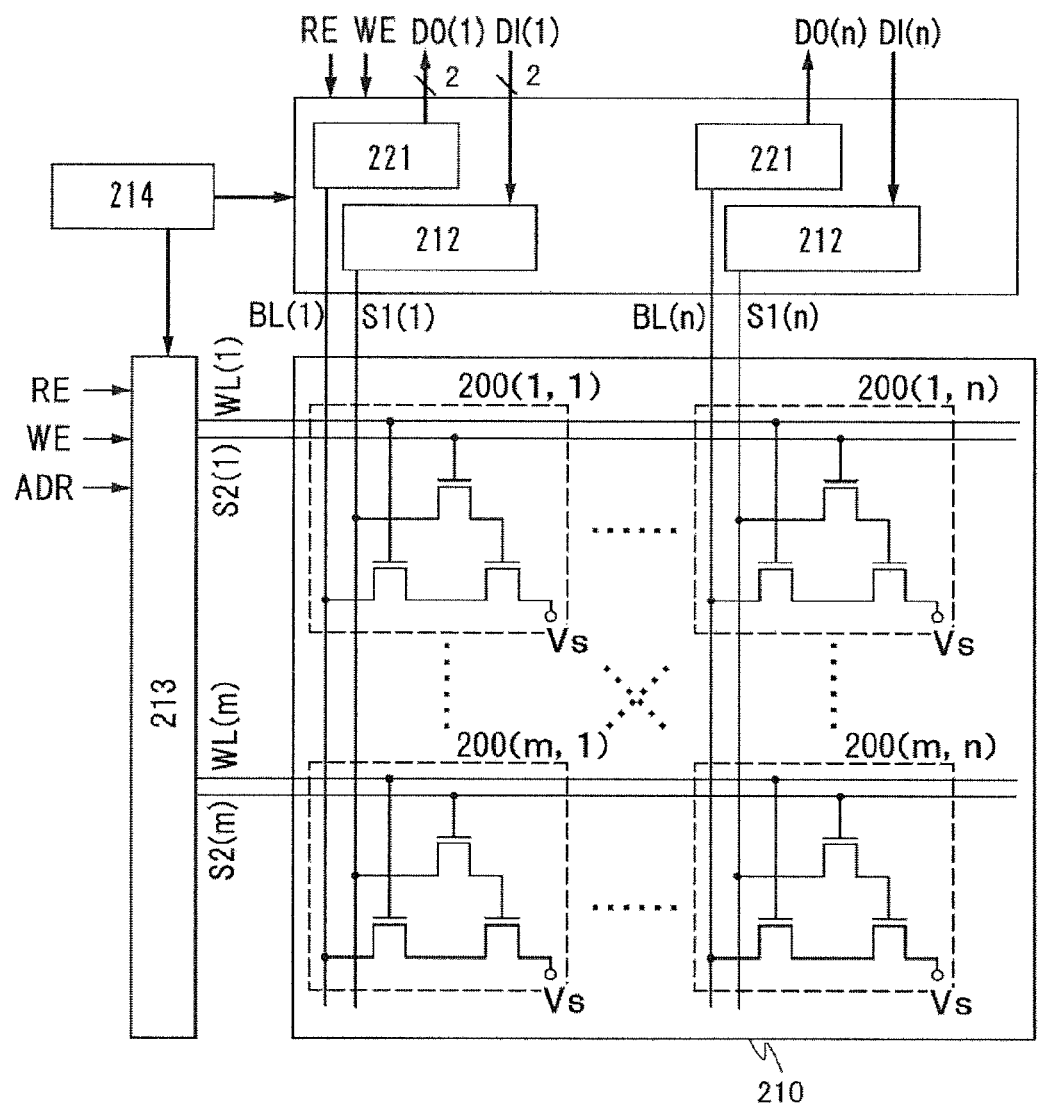
FIG. 19 is a circuit diagram for explaining a semiconductor device.

FIG. 19 illustrates a block circuit diagram of another example of a semiconductor device according to an embodiment of the present invention, which includes memory capacity of m×n bits.

The semiconductor device illustrated in FIG. 19 includes m word lines WL, m second signal lines S2, n bit lines BL, n first signal lines S1, a memory cell array 210 in which the plurality of memory cells 200 (1,1) to 200 (m,n) are arranged in a matrix of in cells (rows) by n cells (columns) (m and n are natural numbers), and peripheral circuits such as reading circuits 221, first signal line driver circuits 212, a driver circuit 213 for the second signal lines and the word lines, and a potential generating circuit 214. A refresh circuit or the like may be provided as another peripheral circuit.

Each of the memory cells, for example, a memory cell 200(i,j) is considered (here, i is an integer greater than or equal to 1 and less than or equal to m and j is an integer greater than or equal to 1 and less than or equal to n). The memory cell 200(i,j) is connected to a bit line BL(j), a first signal line S1 (j), a word line WL (i), a second signal line S2 (i), and a source wiring. In addition, the bit lines BL (1) to BL (n) are connected to the reading circuits 221, the first signal lines S1 (1) to S1 (n) are connected to the first signal line driver circuits 212, the word lines WL (1) to WL (m) and the second signal lines S2 (1) to S2 (m) are connected to the driver circuit 213 for the second signal lines and the word lines.

Note that, the configurations of the potential generating circuit 214, the driver circuit 213 for the second signal lines and the word signal lines, and the first signal line driver circuit 212 may be the same as the configurations of FIG. 15, FIG. 12, and FIG. 13, for example.

Figure 20:
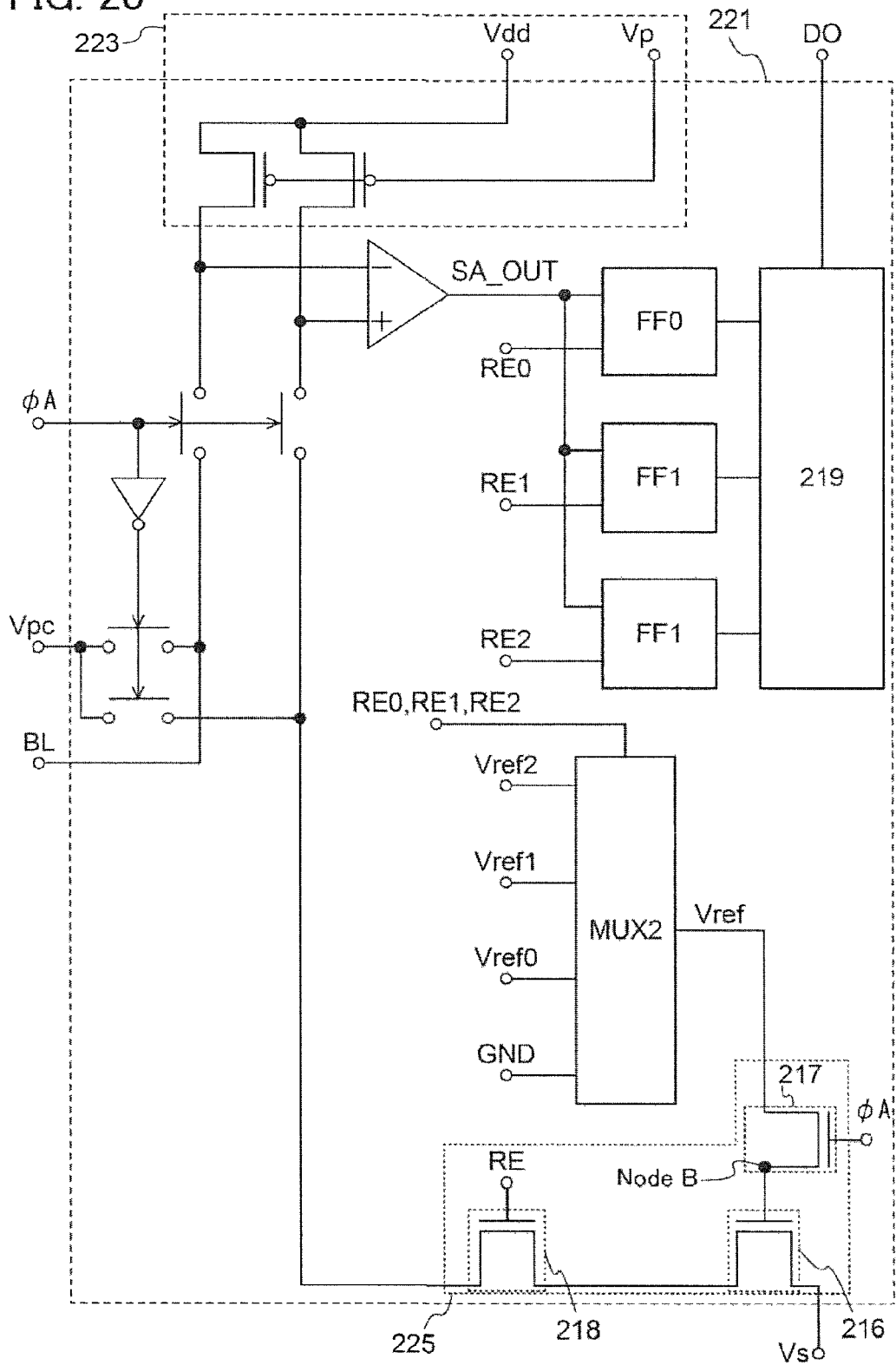
FIG. 20 is a circuit diagram for explaining a driver circuit.

FIG. 20 illustrates an example of the reading circuit 221. The reading circuit 221 includes a sense amplifier circuit, a reference cell 225, a logic circuit 219, a multiplexer (MUX2), flip-flop circuits FF0, FF1, and FF2, a bias circuit 223, and the like. The reference cell 225 includes a transistor 216, a transistor 217, and a transistor 218. The transistor 216, the transistor 217, and the transistor 218 included in the reference cell 225 correspond to the transistor 201, the transistor 202, and the transistor 203 included in the memory cell, respectively, and form the same circuit configuration as the memory cell. It is preferable that the transistor 216 and the transistor 218 be formed using materials other than an oxide semiconductor, and the transistor 217 be formed using an oxide semiconductor. In addition, in the case where the memory cell includes the capacitor 205, it is preferable that the reference cell 225 also includes a capacitor. Two output terminals of the bias circuit 223 are connected to the bit line BL and a drain electrode of the transistor 218 included in the reference cell 225, respectively, via a switch. In addition, the output terminals of the bias circuit 223 are connected to input terminals of the sense amplifier circuit. An output terminal of the sense amplifier circuit is connected to the flip-flop circuits FF0, FF1, and FF2. Output terminals of the flip-flop circuits FF0, FF1, and FF2 are connected to input terminals of the logic circuit 219. Signals RE0, RE1, and RE2, reference potentials $V_{ref0}$, $V_{ref1}$, and $V_{ref2}$, and GND are input to the multiplexer (MUX2). An output terminal of the multiplexer (MUX2) is connected to one of a source electrode and a drain electrode of the transistor 217 included in the reference cell 225. The bit line BL and the drain electrode of the transistor 218 included in the reference cell 225 are connected to a wiring $V_{pc}$ via switches. Note that the switches are controlled by a signal ΦA.

The reading circuit 221 has a structure in which a comparison of the conductance of the memory cell with the conductance of the reference cell 225 is performed. This structure includes one sense amplifier circuit. In this structure, the comparison is performed three times in order to read out the four states. In other words, the comparison of the conductance of the memory cell with the conductance of the reference cell 225 is performed in the case of each of three kinds of reference potentials. The three comparisons are controlled by the signals RE0, RE1, RE2, and ΦA. The multiplexer (MUX2) selects any of the three kinds of reference potentials $V_{ref0}$, $V_{ref1}$, and $V_{ref2}$, and GND in accordance with the values of the signals RE, RE1, and RE2. Performance of the multiplexer (MUX2) is illustrated in Table 3. The flip-flop circuits FF0, FF1, and FF2 are controlled by the signals RE0, RE1, and RE2, respectively, and store the value of an output signal SA_OUT of the sense amplifier.

TABLE 3

| RE0 | RE1 | RE2 | $V_{wL}$ |
|---|---|---|---|
| 0 | 0 | 0 | corresponding to GND |
| 1 | 0 | 0 | corresponding to $V_{ref0}$ |
| 0 | 1 | 0 | corresponding to $V_{ref1}$ |
| 0 | 0 | 1 | corresponding to $V_{ref2}$ |

The values of the reference potentials are determined so as to be $V_{00} < V_{ref0} < V_{01} < V_{ref1} < V_{10} < V_{ref2} < V_{11}$. Thus, the four states can be read out from the results of the three comparisons. The values of the flip-flop circuits FF0, FF1, and FF2 are "0", "0", and "0" in the case of the data "00b". The values of the flip-flop circuits FF0, FF1, and FF2 are "1", "0", and "0" in the case of the data "01b". The values of the flip-flop circuits FF0, FF1, and FF2 are "1", "1", and "0" in the case of the data "10b". The values of the flip-flop circuits FF0, FF1, and FF2 are "1", "1", and "1" in the case of the data "11b". In this manner, the state of the memory cell can be read out as a 3-bit digital signal. After that, with the use of the logic circuit 219 which is represented in a logic value table shown in Table 2, 2-bit data DO is generated and output from the reading circuit.

Note that in the reading circuit illustrated in FIG. 20, when a signal RE is de-asserted, the bit line BL and the reference cell 225 are connected to the wiring $V_{pc}$, so that pre-charge is performed. When the signal RE is asserted, electrical continuity between the bit line BL and the bias circuit 223 and between the reference cell 225 and the bias circuit 223 is established.

Note that the pre-charge is not necessarily performed. In this circuit, it is preferable that the circuits which generate two signals input to the sense amplifier circuit have almost the same structure. For example, it is preferable that the structure of the transistors in the reference cell 225 be the same as the structure of the corresponding transistors in the memory cell. It is preferable that the corresponding transistors in the bias circuit 223 and the switch have the same structure.

A timing chart of the writing operation is the same as FIG. 16A. An example of a timing chart of the reading operation is shown in FIG. 21. FIG. 21 shows a timing chart in the case where the data "10b" is read out from the memory cell. $V_{ref0}$, $V_{ref1}$, and $V_{ref2}$ are input to an output MUX2_OUT of the multiplexer (MUX2) in respective terms in which the signals RE0, RE1, and RE2 are asserted. In a first half of each of the terms, the signal ΦA is asserted and a predetermined potential is applied to a node B of the transistor included in the reference cell 225. In a latter half of each of the terms, the signal ΦA is de-asserted, the predetermined potential is retained in the node B of the transistor included in the reference cell 225 and the drain electrode of the transistor 218 included in the reference cell 225 is connected to the bias circuit 223. Then, a result of the comparison in the sense amplifier circuit is stored in each of the flip-flop circuits FF0, FF1, and FF2. In the case of the data of the memory cell is "10b", the values of the flip-flop circuits FF0, FF1, and FF2 are "1", "1", and "0". Note that the first signal line S1 and the second signal line S2 have 0 V.

Next, a reading circuit which is different from that illustrated in FIG. 20 and a method for reading are described.

Figure 28:
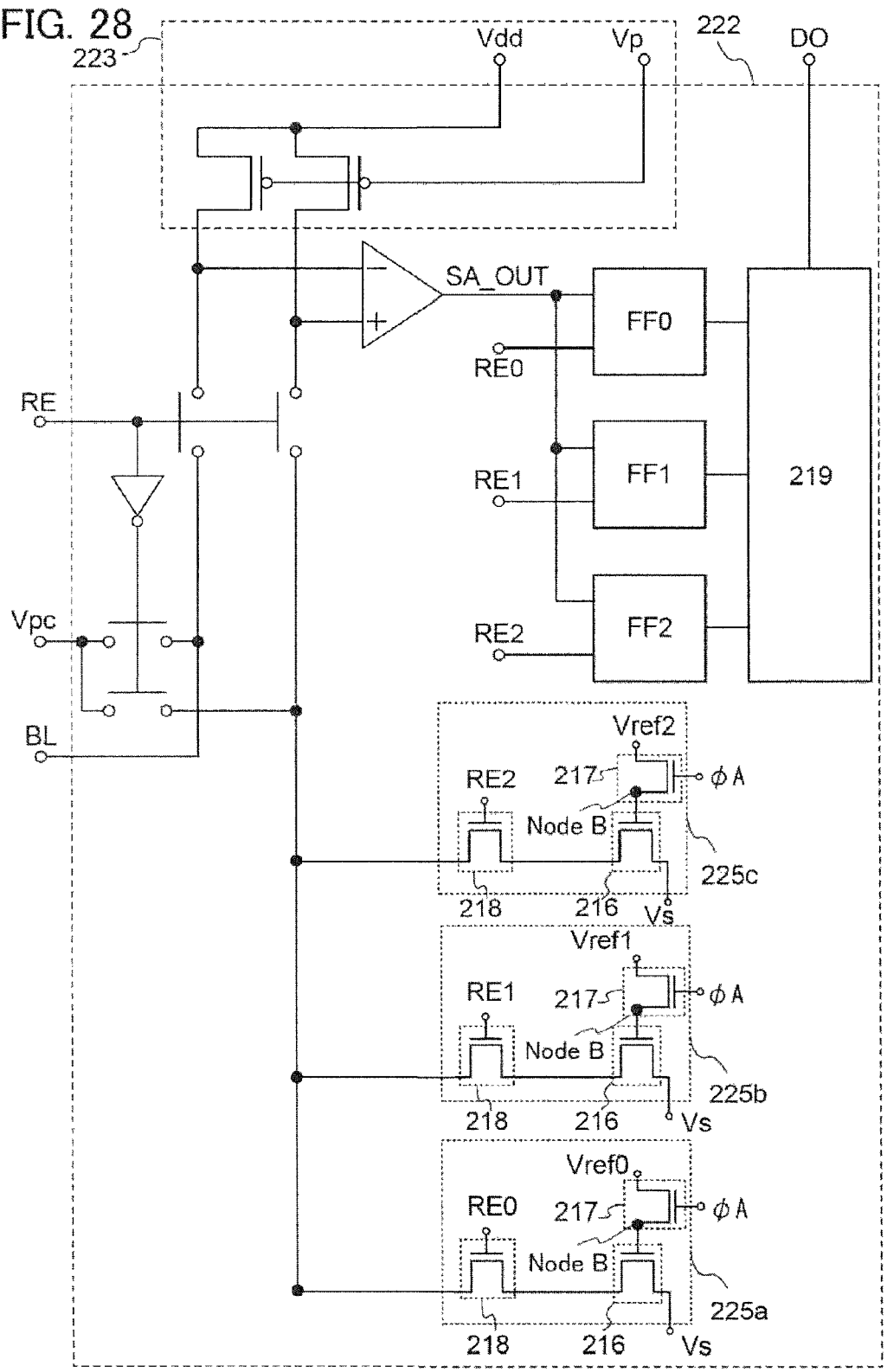
FIG. 28 is circuit diagram for explaining a driver circuit.

FIG. 28 illustrates a reading circuit 222 as an example. The reading circuit 222 includes a sense amplifier circuit, the plurality of reference cells (a reference cell 225a, a reference cell 225b, and a reference cell 225c), the logic circuit 219, the flip-flop circuits FF0, FF1, and FF2, the bias circuit 223, and the like.

The reference cells 225a, 225b, and 225c each include the transistor 216, the transistor 217, and the transistor 218. The transistors 216, 217, and 218 correspond to the transistor 201, 202, and 203, respectively, and form the same circuit configuration as that of the memory cell 200. It is preferable that the transistor 216 and the transistor 218 be formed using materials other than an oxide semiconductor and the transistor 217 be formed using an oxide semiconductor. In addition, in the case where the memory cell includes the capacitor 205, it is preferable that each of the reference cells also includes a capacitor. Two output terminals of the bias circuit 223 are connected to the bit line BL and the drain electrodes of the transistors 218 included in the plurality of reference cells, respectively, via switches. In addition, the output terminals of the bias circuit 223 are connected to input terminals of the sense amplifier circuit. An output terminal of the sense amplifier circuit is connected to the flip-flop circuits FF0, FF1, and FF2. Output terminals of the flip-flop circuits FF0, FF1, and FF2 are connected to input terminals of the logic circuit 219. The bit line BL and the drain electrodes of the transistors 218 included in the plurality of reference cells are connected to a wiring $V_{pc}$ via switches. Note that the switches are controlled by a read enable signal (an RE signal).

The reading circuit 222 has a configuration in which a comparison of the conductance of the memory cell with the conductance of the plurality of reference cells is performed. This configuration includes one sense amplifier circuit. In this structure, the comparison is performed three times in order to read out the four states. That is, the reading circuit 222 has a structure in which the comparison of the conductance of the memory cell with the conductance of each of the three reference cells is performed. The three comparisons are controlled by the signals RE0, RE1, and RE2. $V_{ref0}$, $V_{ref1}$, and $V_{ref2}$ are input to the gate electrode of the transistors 216 of the three respective reference cells. Before reading, the signal ΦA is asserted, all the transistors 217 are turned on, and writing to the reference cells is performed. The writing to the reference cells may be performed once before the reading operation. Needless to say, wiring may be performed once when reading is performed several times, or may be performed every time when reading is performed. In addition, the flip-flop circuits FF0, FF1, and FF2 are controlled by the signals RE0, RE1, and RE2, and store the value of the output signal SA_OUT of the sense amplifier.

The values of the reference potentials are determined so as to be $V_{00}<V_{ref0}<V_{01}<V_{ref1}<V_{10}<V_{ref2}<V_{11}$. Thus, the four states can be read out from the results of the three comparisons. The values of the flip-flop circuits FF0, FF1, and FF2 are "0", "0", and "0" in the case of the data "00b". The values of the flip-flop circuits FF0, FF1, and FF2 are "1", "0", and "0" in the case of the data "01b". The values of the flip-flop circuits FF0, FF1, and FF2 are "1", "1", and "0" in the case of the data "10b". The values of the flip-flop circuits FF0, FF1, and FF2 are "1", "1", and "1" in the case of the data "11b". In this manner, the state of the memory cell can be read out as a 3-bits digital signal. After that, with the use of the logic circuit 219 which is represented in a logic value table shown in Table 2, 2-bit data DO is generated and output from the reading circuit.

Note that in the reading circuit illustrated in FIG. 28, when the RE signal is de-asserted, the bit line BL and the reference cells 225 are connected to the wiring $V_{pc}$ so that pre-charge is performed. When the RE signal is asserted, electrical continuity between the bit line BL and the bias circuit 223 and between the plurality of reference cells 225 and the bias circuit 223 is established.

Note that the pre-charge is not necessarily performed. In this circuit, it is preferable that the circuits which generate signals input to the sense amplifier have almost the same structure. For example, it is preferable that the structure of the transistors in the reference cell be the same as the structure of the corresponding transistors in the memory cell. It is preferable that the corresponding transistor in the bias circuit 223 and the switch have the same structure.

Figure 29:
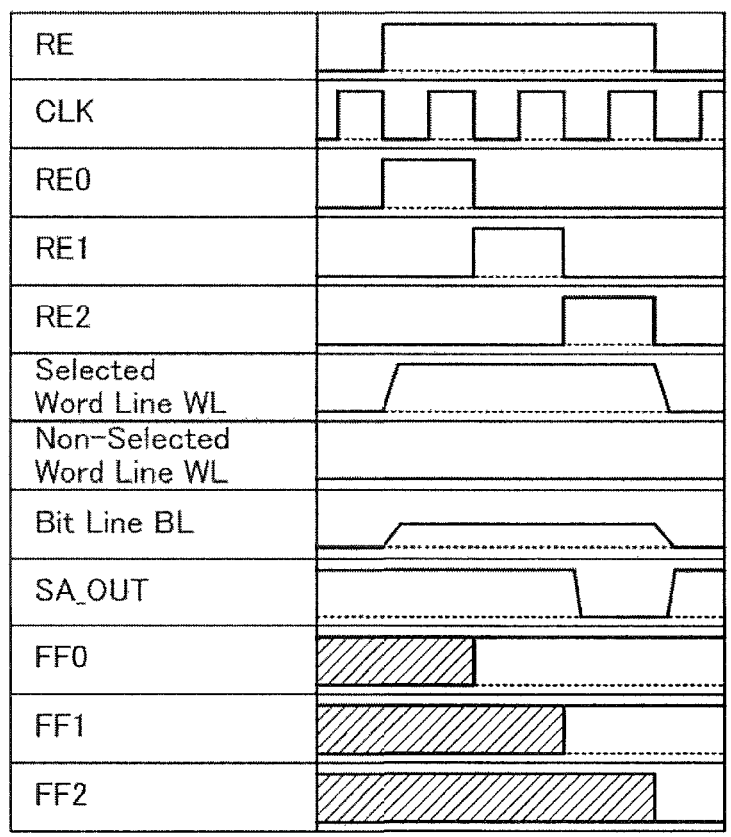
FIG. 29 is a timing chart for explaining operation.

A timing chart of the writing operation is the same as FIG. 16A. An example of a timing chart of the reading operation is shown in FIG. 29. FIG. 29 shows a timing chart in the case where the data "10b" is read out from the memory cell. The reference cell 225a, the reference cell 225b, and the reference cell 225c are selected and connected to the bias circuit 223 in respective terms in which the signals RE0, RE1, and RE2 are asserted. Then, a result of comparison in the sense amplifier circuit is stored in each of the flip-flop circuits FF0, FF1, and FF2. In the case of the data of the memory cell is "10b", the values of the flip-flop circuits FF0, FF1, and FF2 are "1", "1", and "0". Note that the first signal line S1 and the second signal line S2 have 0 V.

Examples of specific operation potentials (voltages) are described. For example, the following can be obtained: the threshold voltage of the transistor 201 is approximately 0.3 V, the power supply potential $V_{DD}$ is 2 V, $V_{11}$ is 1.6 V, $V_{10}$ is 1.2 V, $V_{01}$ is 0.8 V, $V_{00}$ is 0V, $V_{ref0}$ is 0.6 V, $V_{ref1}$ is 1.0 V, and $V_{ref2}$ is 1.4 V. The potential V is preferably 0 V, for example.

Although the first signal line S1 is provided in the bit line BL direction (the column direction) and the second signal line S2 is provided in the word line WL direction (the row direction) in this embodiment, an embodiment of the present invention is not limited thereto. For example, the first signal line S1 may be provided in the word line WL direction (the row direction) and the second signal line S2 may be provided in the bit line BL direction (the column direction). In this case, a driver circuit to which the first signal line S1 is connected and a driver circuit to which the second signal line S2 is connected may be arranged as appropriate.

In this embodiment, the operation of the four-valued memory cell, that is, the case where writing and reading of any of the four different states are performed in one memory cell is described. However, by appropriately changing the circuit configuration, writing and reading of an n-valued memory cell, that is, writing and reading of any of arbitrary n different states(n is an integer of 2 or more) can be performed.

For example, memory capacity of an eight-valued memory cell is three times as large as that of a two-valued memory cell. When writing is performed, eight kinds of writing potentials which determine the potential of the node A are prepared and eight states are generated. When reading is performed, seven kinds of reference potentials with which the eight states can be distinguished are prepared. When the reading is performed, one sense amplifier is provided and comparison is performed seven times, so that data can be read out. In addition, by feedback of results of the comparisons, the number of comparisons can be reduced to three times. In a reading method in which the source line SL is driven, when seven sense amplifiers are provided, data can be read out by performing the comparison once. Further, a configuration in which a plurality of sense amplifiers is provided and the comparison is performed plural times can be employed.

In general, memory capacity of a $2^k$-valued memory cell (k is an integer of 1 or more) is k times as large as that of a two-valued memory cell. When writing is performed, $2^k$ kinds of writing potentials which determine the potential of the node A are prepared and $2^k$ states are generated. When reading is performed, $2^k-1$ kinds of reference potentials with which the $2^k$ states can be distinguished are preferably prepared. One sense amplifier is provided, and data can be read out by performing comparison $2^k-1$ times. In addition, by feedback of the result of the comparison, the number of the comparisons can be reduced to k times. In a reading method in which the source line SL is driven, by providing $2^k-1$ sense amplifiers, reading can be performed by performing the comparison once. In addition, a structure in which a plurality of sense amplifiers is provided and the comparison is performed plural times can be employed.

In the semiconductor device according to this embodiment, data can be retained for extremely long time because of a low-off-current characteristic of the transistor 202. In other words, refresh operation which is needed in a DRAM or the like is not required, so that power consumption can be suppressed. Further, the semiconductor device according to this embodiment can be used as a substantial non-volatile memory device.

Furthermore, writing of data or the like is performed by switching operation of the transistor 202; therefore, high voltage is not needed and there is no problem of degradation of the elements. In addition, writing and erasing of data are performed by turning the transistor on or off; therefore, high-speed operation can be easily obtained. Direct rewriting of data can be performed by controlling a potential input to the transistor. Accordingly, erasing operation which is needed in a flash memory or the like is not required, so that reduction of operation speed due to erasing operation can be suppressed.

In addition, the transistor formed using a material other than an oxide semiconductor can be operated at sufficient high speed; therefore, by using the transistor, stored contents can be read out at high speed.

Since the semiconductor device according to this embodiment is a multivalued semiconductor, memory capacity per unit area can be increased. Accordingly, miniaturization of the semiconductor device and high integration thereof can be achieved. In addition, when writing is performed, the potential of the node to be in a floating state can be controlled directly; therefore, control of the threshold voltage with high accuracy, which is required in a multivalued memory element, can be easily performed. Thus, confirmation of a state after the writing, which is required in a multivalued memory element, can be omitted; therefore, in such a case, time needed for writing can be shortened.

Embodiment 4

In this embodiment, a circuit configuration and operation of a semiconductor device which is different from Embodiment 2 and Embodiment 3 are described as an example.

Figure 22:
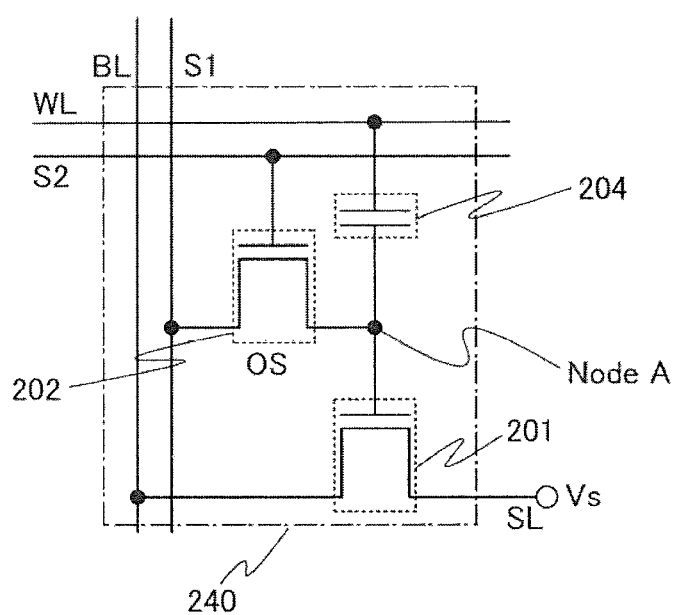
FIG. 22 is a circuit diagram for explaining a memory element.

FIG. 22 illustrates an example of a circuit diagram of a memory cell included in th semiconductor device. A memory cell 240 illustrated in FIG. 22 includes a source line SL, a bit line BL, a first signal line S1, a second signal line S2, a word line WL, a transistor 201, a transistor 202, and a capacitor 204. The transistor 201 is formed using a material other than an oxide semiconductor, and the transistor 202 is formed using an oxide semiconductor.

Here, a gate electrode of the transistor 201, one of a source electrode and a drain electrode of the transistor 202, and one of electrodes of the capacitor 204 are electrically connected to each other. In addition, the source line SL and a source electrode of the transistor 201 are electrically connected to each other. The bit line BL and a drain electrode of the transistor 201 are electrically connected to each other. The first signal line S1 and the other of the source electrode and the drain electrode of the transistor 202 are electrically connected to each other. The second signal line S2 and a gate electrode of the transistor 202 are connected to each other. The word line WL and the other of the electrodes of the capacitor 204 are electrically connected to each other.

Next, operation of the memory cell 240 illustrated in FIG. 22 is described. Here, a four-valued memory cell is employed. Four states of the memory cell 240 are data "00b", "01b", "10b", and "11b", and potentials of a node A in the four states are $V_{00}, V_{01}, V_{10},$ and $V_{11}$ ($V_{00}<V_{01}<V_{10}<V_{11}$), respectively.

In the case where writing to the memory cell 240 is performed, the source line SL is set to 0 [V], the word line WL is set to 0 [V], the bit line BL is set to 0 [V], and the second signal line S2 is set to $V_{DD}$. In the case of writing the data "00b", the first signal line S1 is set to $V_{00}$ [V]. In the case of writing the data "01b", the first signal line S1 is set to $V_{10}$ [V]. In the case of writing the data "10b", the first signal line S1 is set to $V_{10}$ [V]. In the case of writing the data "11b", the first signal line S1 is set to $V_{11}$ [V]. At this time, the transistor 201 is in an off state and the transistor 202 is in an on state. Note that at the end of the writing, the second signal line S2 is set to 0 [V] before the potential of the first signal line S1 is changed, so that the transistor 202 is turned off.

As a result, after the writing of the data "00b", "01b", "10b", or "11b" (the potential of the word line WL is set to 0 V), the potential of a node connected to a gate electrode of the transistor 201 (hereinafter, referred to as the node A) is approximately $V_{00}$ [V], $V_{01}$ [V], $V_{10}$ [V], or $V_{11}$ [V], respectively. Charge is accumulated in the node A in accordance with the potential of the first signal line S1, and since off current of the transistor 202 is extremely small or approximately 0, the potential of the gate electrode of the transistor 201 is retained for a long time.

Next, in the case where reading of the memory cell 240 is performed, the source line SL is set to 0 V, the second signal line S2 is set to 0 V, the first signal line S1 is set to 0 V, and a reading circuit connected to the bit line BL is in an operation state. At this time, the transistor 202 is in an off state.

The, the word line WL is set to $V_{\_WL}$ [V]. The potential of the node A of the memory cell 240 depends on the potential of the word line WL. As the potential of the word line WL is increased, the potential of the node A of the memory cell 240 is increased. For example, the potential of the word line WL applied to the memory cells in the four different states is changed from a low potential to a high potential, the transistor 201 of the memory cell of the data "11b" is turned on first, and then, the memory cell of the data "10b", the memory cell of the data "01b", and the memory cell of the data "00b" are turned on in this order. In other words, by appropriately selecting the potential of the word line WL, the states of the memory cells (that is, the data included in the memory cells) can be distinguished. By appropriately selecting the potential of the word line WL, the memory cell in which the transistor 201 is in an on state is in a low resistance state, and the memory cell in which the transistor 201 is in an off state is in a high resistance state: therefore, when the resistance state is distinguished by the reading circuit, the data "00b", "01b", "10b", and "11b" can be read out.

Figure 23:
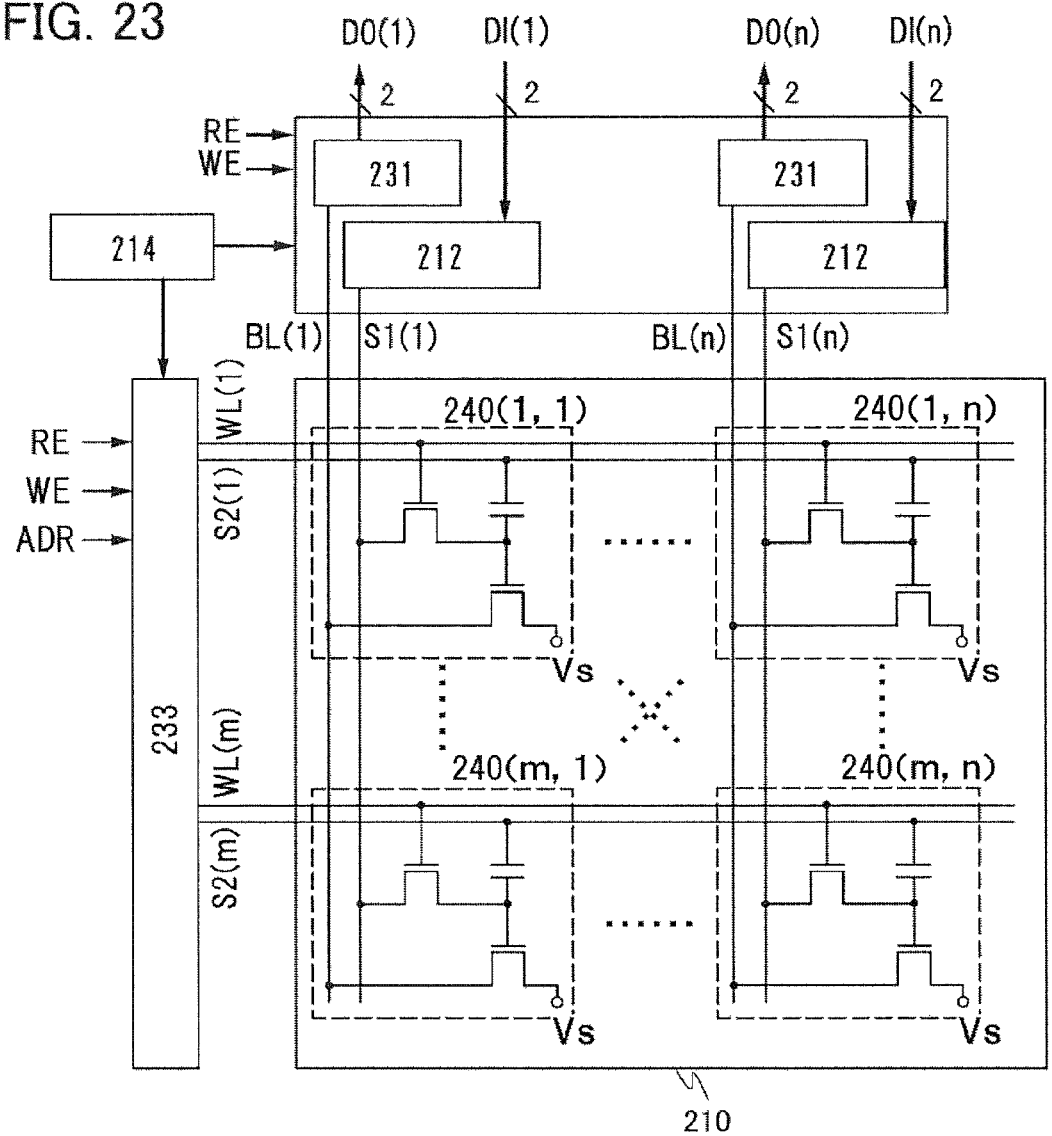
FIG. 23 is a circuit diagram for explaining a semiconductor device.

FIG. 23 illustrates a block circuit diagram of another example of a semiconductor device according to an embodiment of the present invention, which includes memory capacity of m×n bit.

The semiconductor device illustrated in FIG. 23 includes m word lines WL, m second signal lines S2, a bit lines BL, n first signal lines S1, a memory cell allay 210 in which the plurality of memory cells 240(1,1) to 240(m,n) are arranged in a matrix of in cells (rows) by n cells (columns) (in and n are natural numbers), and peripheral circuits such as reading circuits 231, first signal line driver circuits 212, a driver circuit 233 for the second signal lines and the word lines, and a potential generating circuit 214. A refresh circuit or the like may be provided as another peripheral circuit.

Each of the memory cells, for example, a memory cell 240(i,j) is considered (here, i is an integer greater than or equal to 1 and less than or equal to min and j is an integer greater than or equal to 1 and less than or equal to n). The memory cell 240(i,j) is connected to a bit line BL (j), a first signal line S1 (j), a word line WL (i) a second signal line S2 (i), and a source line SL. In addition, the bit lines BL (1) to BL (n) are connected to the reading circuit 231, the first signal lines S1 (1) to S1 (n) are connected to the first signal line driver circuits 212, the word lines WL (i) to WL (m) and the second signal lines S2 (1) to S2 (m) are connected to the driver circuit 233 for the second signal lines S2 and the word lines WL.

Note that the configurations illustrated in FIG. 13 and FIG. 15 can be used for the structures of the first signal line driver circuit 212 and the potential generating circuit 214, respectively.

Figure 24:
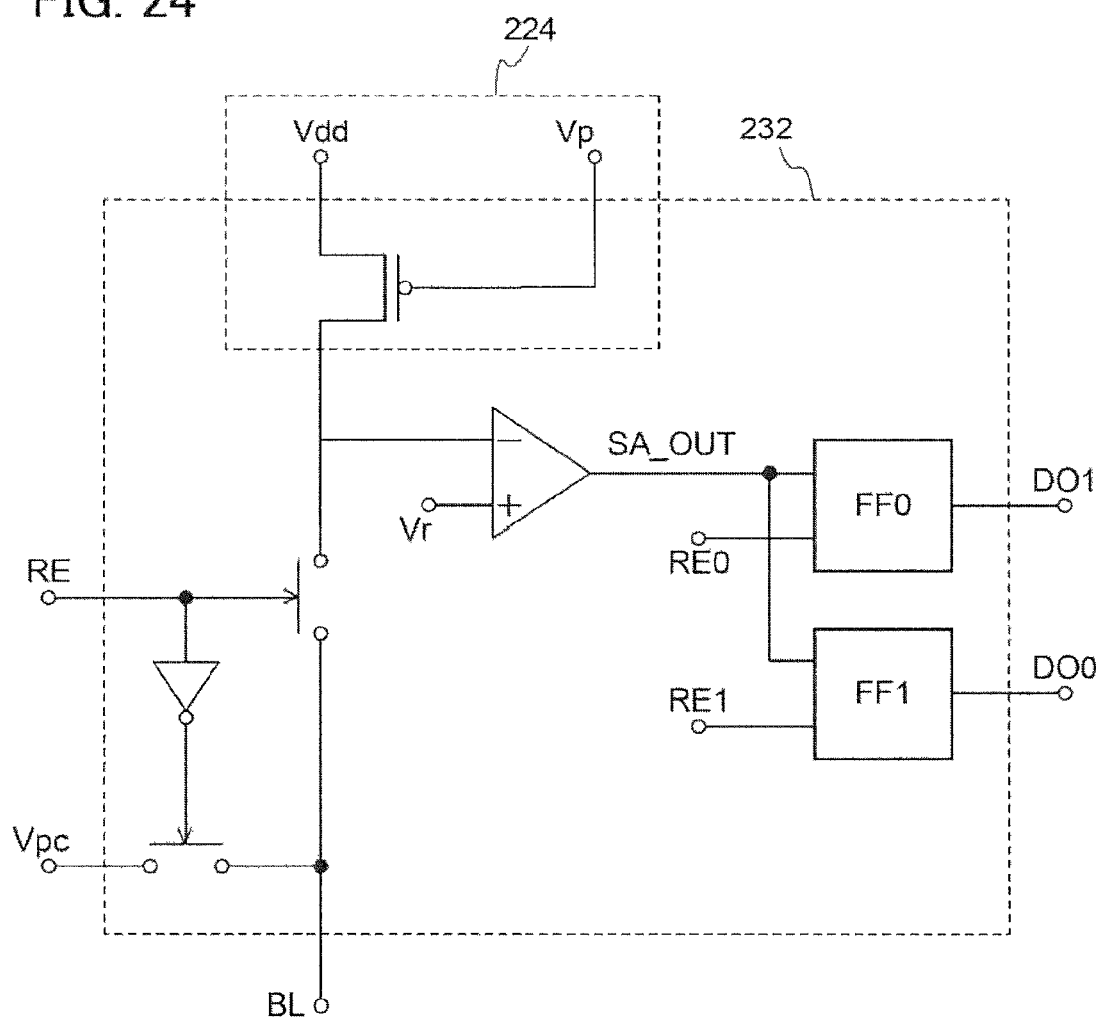
FIG. 24 is a circuit diagram for explaining a driver circuit.

FIG. 24 illustrates an example of the reading circuit. The reading circuit includes a sense amplifier circuit, flip-flop circuits, a bias circuit 224, and the like. The bias circuit 224 is connected to the bit line BL via a switch. Further, the bias circuit 224 is connected to an input terminal of the sense amplifier circuit. A reference potential $V_r$ is input to the other input terminal of the sense amplifier circuit. An output terminal of the sense amplifier circuit is connected to input terminals of flip-flop circuits FF0 and FF1. Note that the switch is controlled by a read enable signal (an RE signal). The reading circuit can read data out by reading out the conductance of a specified memory cell which connected to the bit line BL. Note that reading of the conductance of the memory cell indicates reading of an on or off state of the transistor 201 included in the memory cell.

The reading circuit illustrated in FIG. 24 includes one sense amplifier and performs comparison twice in order to distinguish the four different states. The two comparisons are controlled by signals RE0 and RE1. The flip-flop circuits FF0 and FF1 are controlled by the signals RE0 and RE1, respectively, and store the value of an output signal of the sense amplifier circuit. An output DO[1] of the flip-flop circuit FF0 and an output DO[0] of the flip-flop circuit FF1 are output from the reading circuit.

Note that in the reading circuit illustrated, when the RE signal is de-asserted, the bit line BL is connected to the wiring $V_{pc}$ and pre-charge is performed. When the RE signal is asserted, electrical continuity between the bit line BL and the bias circuit 224 is established. Note that pre-charge is not necessarily performed.

Figure 25:
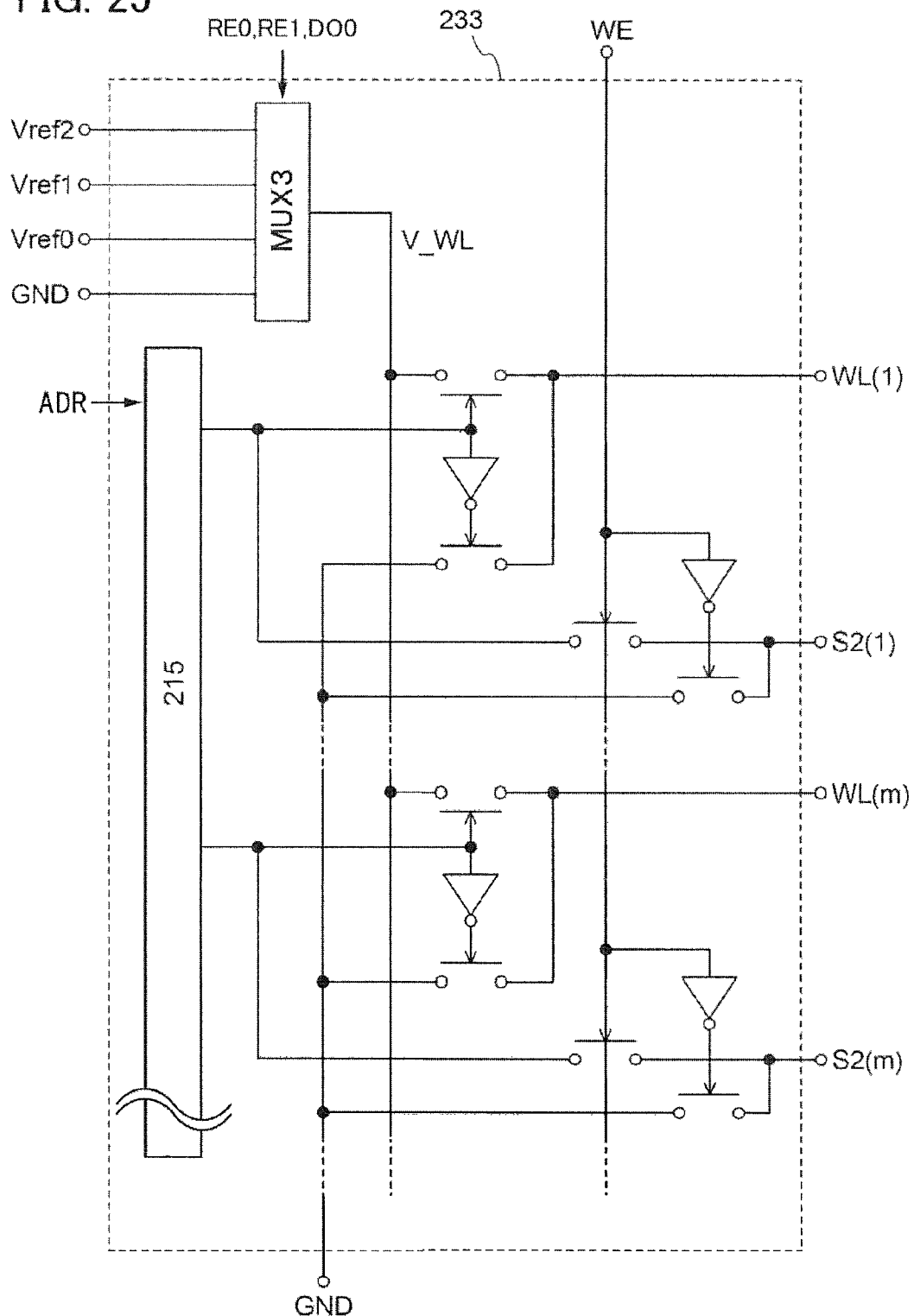
FIG. 25 is a circuit diagram for explaining a driver circuit.

FIG. 25 illustrates the driver circuit 233 for the second signal line S2 and the word line WL, as another example.

In the driver circuit 233 for the second signal line and the word line illustrated in FIG. 25, when an address signal ADR is input, rows specified by the address (a selected row) are asserted, and the other rows (non-selected rows) are dc-asserted. The second signal line S2 is connected to a decoder output when a WE signal is asserted, and connected to GND when the WE signal is de-asserted. The word line WL in the selected row is connected to an output $V_{\_WL}$ of a multiplexer (MUX3) and the word line WL in the non-selected row is connected to GND. The multiplexer (MUX3) selects any of the three kinds of reference potentials $V_{ref0}$, $V_{ref1}$, and $V_{ref2}$ or GND in response to the values of the signals RE0, RE1, and DO. The behavior of the multiplexer (MUX3) is shown in Table 4.

TABLE 4

| RE0 | RE1 | DO[1] | $V_{wL}$ |
|---|---|---|---|
| 0 | 0 | * | corresponding to GND |
| 1 | 0 | * | corresponding to $V_{ref1}$ |
| 0 | 1 | 0 | corresponding to $V_{ref0}$ |
| 0 | 1 | 1 | corresponding to $V_{ref2}$ |

The three kinds of reference potentials $V_{ref0}$, $V_{ref1}$, and $R_{ref2}$ ($V_{ref0}<V_{ref1}<V_{ref2}$) are described. In the case where $V_{ref0}$, is selected as the potential of the word line WL, a potential with which the transistor 201 of the memory cell of the data "00b" is turned off and the transistor 201 of the memory cell of the data "01b" is turned on is selected as $V_{ref0}$. In addition, in the case where $V_{ref1}$ is selected as the potential of the word line WL, a potential with which the transistor 201 of the memory cell of the data "01b" is turned off and the transistor 201 of the memory cell of the data "10b" is turned on is selected as $V_{ref1}$. In addition, in the case where $V_{ref2}$ is selected as the potential of the word line WL, a potential with which the transistor 201 of the memory cell of the data "10b" is turned off and the transistor 201 of the memory cell of the data "11b" is turned on is selected as $V_{ref2}$.

In the reading circuit, reading is performed by the two comparisons. A first comparison is performed using $V_{ref1}$. A second comparison is performed using $V_{ref0}$ when the value of the flip-flop FF0 is "0" which results from comparison with the use of $V_{ref1}$, or using $V_{ref2}$ when the value of the flip-flop FF0 is "1" which results from comparison with the use of $V_{ref1}$. In the above manner, the four states can be read out by the two comparisons.

Figure 26:
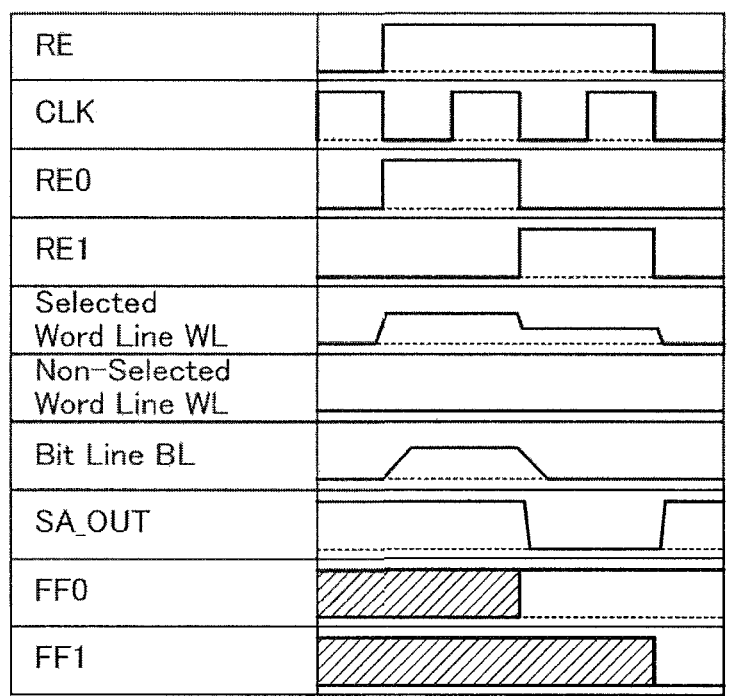
FIG. 26 is a timing chart for explaining operation.

A timing chart of writing operation is the same as FIG. 16A. An example of a timing chart of reading operation is shown in FIG. 26. FIG. 26 shows a timing chart in the case where the data "10b" is read out from the memory cell. $V_{ref1}$ and $V_{ref2}$ are input to the selected respective word lines WL, and the comparison result in the sense amplifier is stored in the flip-flop circuits FF0 and FF1 in respective terms in which the signals RE0, and RE1 are asserted. In the case of the data of the memory cell is "10b", the values of the flip-flop circuits FF0 and FF1 are "1" and "0". Note that the first signal line S1 and the second signal line S2 have 0 V.

Figure 27:
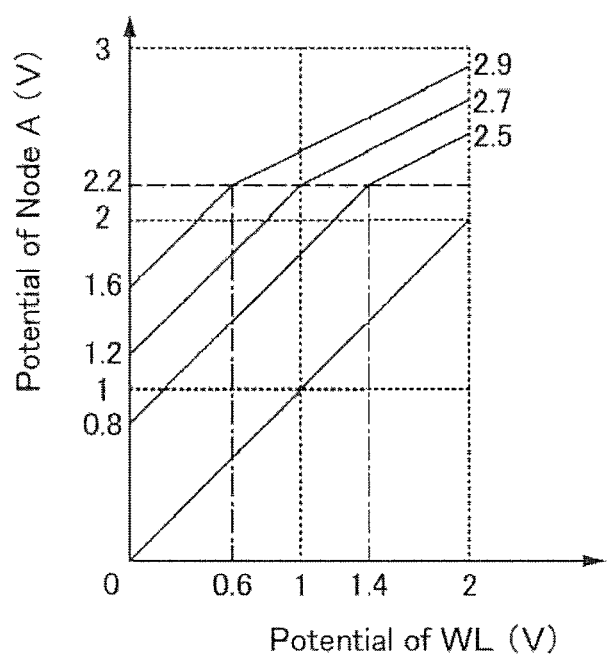
FIG. 27 is a graph showing relation between the potential of a node A and the potential of a word line.

Examples of specific operation potentials (voltages) are described. For example, the threshold voltage $V_{th}$ of the transistor 201 is 2.2 V. The potential of the node A depends on capacitance C1 between the word line WL and the node A and gate capacitance C2 of the transistor 202, and here, for example, C1/C2>>1 when the transistor 202 is in an off state, and C1/C2=1 when the transistor 202 is in an on state. FIG. 27 shows relation between the potential of the node A and the potential of the word line WL in the case where the source line SL has 0V. From FIG. 27, it is found that the reference potentials $V_{ref0}$, $V_{ref1}$, and $V_{ref2}$ are preferably 0.8 V, 1.2 V, and 2.0 V, respectively in the case where when writing is performed, the potential of the node A of the data "00b" is 0V, that of the data "01b" is 0.8 V, that of the data "10b" is 1.2 V, and that of the data "11b" is 1.6 V.

Note that the potential of the node A of the transistor 201 after the writing (the potential of the word line WL is 0 V) is preferably lower than or equal to the threshold voltage of the transistor 201.

Although this embodiment employs the configuration in which the first signal line S1 is provided in the bit line BL direction (the column direction) and the second signal line S2 is provided in the word line WL direction (the row direction), an embodiment is not limited thereto. For example, the first signal line S1 may be provided in the word line WL direction (the row direction) and the second signal line S2 may be provided in the bit line BL direction (the column direction). In this case, a driver circuit to which the first signal line S1 is connected and a driver circuit to which the second signal line S2 is connected may be arranged as appropriate.

In this embodiment, the operation of the four-valued memory cell, that is, the case where writing and reading of any of the four different states is performed on one memory cell is described. By appropriately changing the circuit configuration, writing and reading of an n-valued memory cell, that is, any of arbitrary n different states (n is an integer of 2 or more) can be performed.

For example, memory capacity of an eight-valued memory cell is three times as large as that of a two-valued memory cell. When writing is performed, eight kinds of writing potentials which determine the potential of the node A are prepared and eight states are generated. When reading is performed, seven kinds of reference potentials with which the eight states can be distinguished are prepared. When the reading is performed, one sense amplifier is provided and comparison is performed seven times, so that data can be read out. In addition, by feedback of results of the comparisons, the number of comparisons can be reduced to three times. In a reading method in which the source line SL is driven, when seven sense amplifiers are provided, data can be read out by performing comparison once. Further, a configuration in which a plurality of sense amplifiers is provided and comparison is performed plural times can be employed.

In general, memory capacity of a $2^k$-valued memory cell (k is an integer of 1 or more) is k times as large as that of a two-valued memory cell. When writing is performed, $2^k$ kinds of writing potentials which determine the potential of the node A are prepared and $2^k$ states are generated. When reading is performed, $2^k-1$ kinds of reference potentials with which the $2^k$ states can be distinguished are preferably prepared. One sense amplifier is provided, and data can be read out by performing comparison $2^k-1$ times. In addition, by feedback of the result of the comparison, the number of the comparisons can be reduced to k times. In a reading method in which the source line SL is driven, by providing $2^k-1$ sense amplifiers, reading can be performed by performing the comparison once. In addition, a structure in which a plurality of sense amplifiers is provided and the comparison is performed plural times can be employed.

In the semiconductor device according to this embodiment, data can be retained for extremely long time because of a low-off-current characteristic of the transistor 202. In other words, refresh operation which is needed in a DRAM or the like is not required, so that power consumption can be suppressed. Further, the semiconductor device according to this embodiment can be used as a substantial non-volatile memory device.

Furthermore, writing of data or the like is performed by switching operation of the transistor 202; therefore, high voltage is not needed and there is no problem of degradation of the elements. In addition, writing and erasing of data are performed by turning the transistor on or off; therefore, high-speed operation can be easily obtained. Direct rewriting of data can be performed by controlling a potential input to the transistor. Accordingly, erasing operation which is needed in a flash memory or the like is not required, so that reduction of operation speed due to erasing operation can be suppressed.

In addition, the transistor formed using a material other than an oxide semiconductor can be operated at sufficient high speed; therefore, by using the transistor, stored contents can be read out at high speed.

Since the semiconductor device according to this embodiment is a multivalued semiconductor, memory capacity per unit area can be increased. Accordingly, miniaturization of the semiconductor device and high integration thereof can be achieved. In addition, when writing is performed, the potential of the node to be in a floating state can be controlled directly; therefore, control of the threshold voltage with high accuracy, which is required in a multivalued memory element, can be easily performed. Thus, confirmation of a state after the writing, which is required in a multivalued memory element, can be omitted; therefore, in such a case, time needed for writing can be shortened.

Embodiment 5

In this embodiment, examples of an electronic appliance in which the semiconductor device obtained according to the above embodiment is mounted are described with reference to FIGS. 30A to 30F. The semiconductor device obtained according to the above embodiment can retain data even without supply of power. Degradation incident to writing and erasing is not caused. Therefore, operation speed thereof is high. Thus, with the use of the semiconductor device, an electronic appliance having a novel structure can be provided. Note that the semiconductor device according to the above embodiment is integrated and mounted on a circuit board or the like to be mounted on an electronic appliance.

Figure 30A:
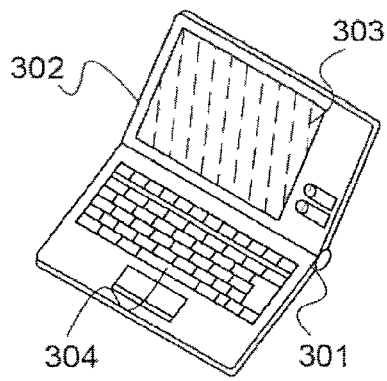
FIGS. 30A to 30 F illustrate electronic appliances.

FIG. 30A illustrates a laptop personal computer which includes the semiconductor device according to the above embodiment and includes a main body 301, a housing 302, a display portion 303, a keyboard 304, and the like. When the semiconductor device according to an embodiment of the present invention is applied to the laptop personal computer, data can be retained even without supply of power. In addition, degradation incident to writing and erasing is not caused. In addition, operation speed thereof is high. Thus, it is preferable that the semiconductor device according to an embodiment of the present invention be applied to the laptop personal computer.

Figure 30D:
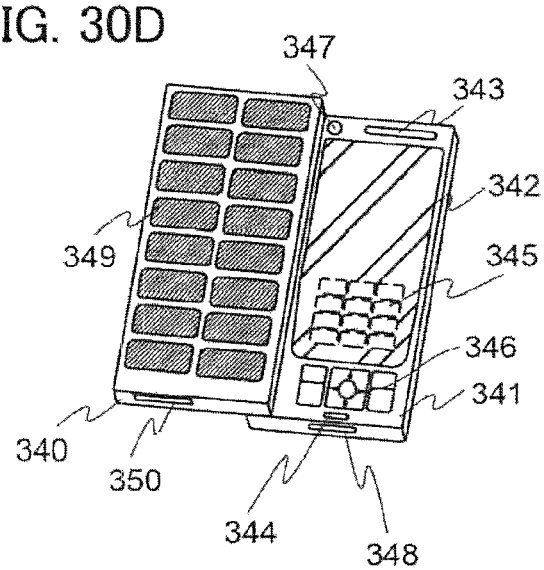
Figure 30B:
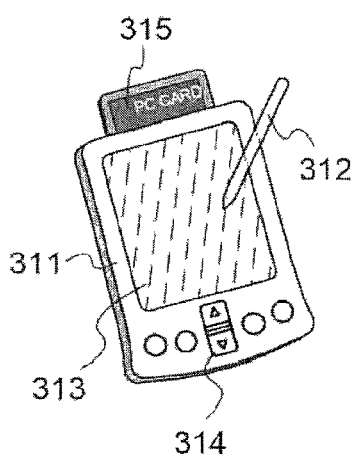

FIG. 30B illustrates a portable information terminal (PDA) which includes the semiconductor device according to the above embodiment and is provided with a main body 311 including a display portion 313, an external interface 315, an operation button 314, and the like. In addition, a stylus 312 is included as an accessory for operation. When the semiconductor device according to an embodiment of the present invention is applied to the PDA, data can be retained even without supply of power. In addition, degradation incident to writing and erasing is not caused. In addition, operation speed thereof is high. Thus, it is preferable that the semiconductor device according to an embodiment of the present invention be applied to the PDA.

Figure 30E:
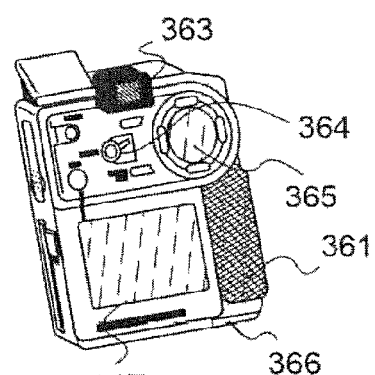
Figure 30C:
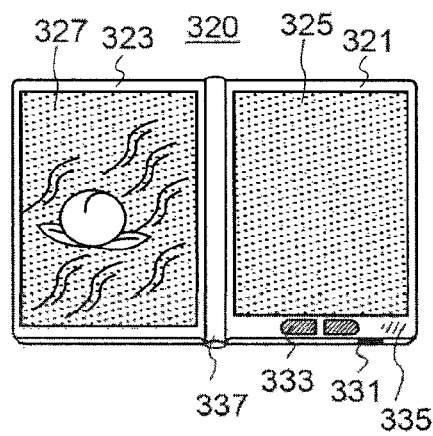

FIG. 30C illustrates an e-book reader 320 as an example of electronic paper including the semiconductor device according to the above embodiment. The e-book reader 320 includes two housings, a housing 321 and a housing 323. The housing 321 and the housing 323 are combined with a hinge 337 so that the e-book reader 320 can be opened and closed with the hinge 337 as an axis. With such a structure, the e-book reader 320 can be used like a paper book. When the semiconductor device according to an embodiment of the present invention is applied to the electronic paper, data can be retained even without supply of power. In addition, degradation incident to writing and erasing is not caused. In addition, operation speed thereof is high. Thus, it is preferable that the semiconductor device according to an embodiment of the present invention be applied to the electronic paper.

A display portion 325 is incorporated in the housing 321 and a display portion 327 is incorporated in the housing 323. The display portion 325 and the display portion 327 may display one image, or may display different images. When the display portions 325 and 327 display different images, for example, a display portion on the right side (the display portion 325 in FIG. 30C) can display text and a display portion on the left side (the display portion 327 in FIG. 30C) can display graphics.

FIG. 30C illustrates an example in which the housing 321 is provided with an operation portion and the like. For example, the housing 321 is provided with a power button 331, operation keys 333, a speaker 335, and the like. Pages can be turned with the operation keys 333. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Further, the e-book reader 320 may have a function of an electronic dictionary.

The e-book reader 320 may be configured to transmit and receive data wirelessly. Through wireless communication, desired book data or the like can be purchased and downloaded from an e-book server.

Note that the electronic paper can be applied to an electronic appliance in any field which can display data. For example, the electronic paper can be used for posters, advertisements in vehicles such as trains, display in a variety of cards such as credit cards, and the like in addition to e-book readers.

FIG. 30D illustrates a mobile phone including the semiconductor device according to the above embodiment. The mobile phone includes two housings, the housing 340 and the housing 341. The housing 341 includes a display panel 342, a speaker 343, a microphone 344, a pointing device 346, a camera lens 347, an external connection terminal 348, and the like. The housing 341 includes a solar cell 349 for charging the mobile phone, an external memory slot 350, and the like. In addition, an antenna is incorporated in the housing 341. When the semiconductor device according to an embodiment of the present invention is applied to the mobile phone, data can be retained even without supply of power. In addition, degradation incident to writing and erasing is not caused. In addition, operation speed thereof is high. Thus, it is preferable that the semiconductor device according to an embodiment of the present invention be applied to the mobile phone.

The display panel 342 is provided with a touch panel function. A plurality of operation keys 345 which are displayed as images is illustrated by dashed lines in FIG. 30D. Note that the mobile phone includes a boosting circuit for raising a voltage output from the solar cell 349 to a voltage which is necessary for each circuit. Further, in addition to the above structure, a structure in which a noncontact IC chip, a small recording device, or the like is incorporated may be employed.

A display direction of the display panel 342 is appropriately changed in accordance with the usage mode. Further, the camera lens 347 is provided on the same surface as the display panel 342, and thus it can be used as a video phone. The speaker 343 and the microphone 344 can be used for videophone, recording, playback, and the like without being limited to verbal communication. Moreover, the housings 340 and 341 in a state where they are developed as illustrated in FIG. 30D can be slid so that one is lapped over the other; therefore, the size of the mobile phone can be reduced, which makes the mobile phone suitable for being carried.

The external connection terminal 348 can be connected to various kinds of cables such as an AC adapter or a USB cable, which enables charging and data communication. Moreover, by inserting a recording medium into the external memory slot 350, the mobile phone can deal with storing and moving a large capacity of data. Further, in addition to the above functions, an infrared communication function, a television reception function, or the like may be provided.

FIG. 30E illustrates a digital camera including the semiconductor device according to the above embodiment. The digital camera includes a main body 361, a display portion (A) 367, an eyepiece 363, an operation switch 364, a display portion (B) 365, a battery 366, and the like. When the semiconductor device according to an embodiment of the present invention is applied to the digital camera, data can be retained even without supply of power. In addition, degradation incident to writing and erasing is not caused. In addition, operation speed thereof is high. Thus, it is preferable that the semiconductor device according to an embodiment of the present invention be applied to the digital camera.

Figure 30F:
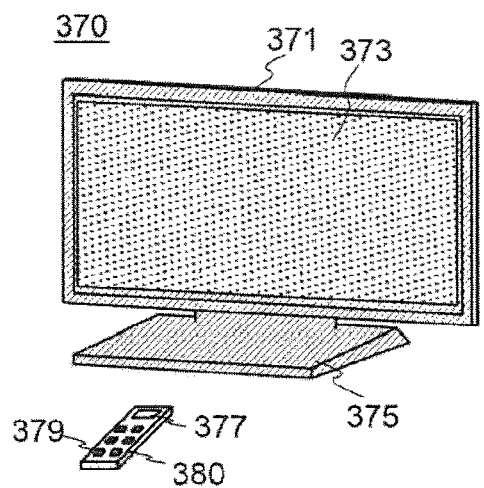

FIG. 30F illustrates a television set including the semiconductor device according to the above embodiment. In the television set 370, a display portion 373 is incorporated in a housing 371. The display portion 373 can display an image. Here, the housing 371 is supported by a stand 375.

The television set 370 can be operated by an operation switch of the housing 371 or a separate remote controller 380. Channels and volume can be controlled by an operation key 379 of the remote controller 380 so that an image displayed on the display portion 373 can be controlled. Furthermore, the remote controller 380 may be provided with a display portion 377 for displaying data output from the remote controller 380. When the semiconductor device according to an embodiment of the present invention is applied to the television set, data can be retained even without supply of power. In addition, degradation incident to writing and erasing is not caused. In addition, operation speed thereof is high. Thus, it is preferable that the semiconductor device according to an embodiment of the present invention be applied to the television set.

Note that the television set 370 is preferably provided with a receiver, a modem, and the like. With the receiver, a general television broadcast can be received. Furthermore, when the television set 370 is connected to a communication network by wired or wireless connection via the modem, one-way (from a transmitter to a receiver) or two-way (between a transmitter and a receiver, between receivers, or the like) data communication can be performed.

The methods and structures described in this embodiment can be combined as appropriate with any of the methods and structures described in the other embodiments.

This application is based on Japanese Patent Application serial no. 2009-255448 filed with Japan Patent Office on Nov. 6, 2009, the entire contents of which are hereby incorporated by reference.

EXPLANATION OF REFERENCE

100: substrate; 102: protective layer; 104: semiconductor region; 106: element isolation insulating layer; 108a: gate insulating layer; 110a: gate electrode; 112: insulating layer; 114: impurity region; 116: channel formation region; 118: sidewall insulating layer; 120: high-concentration impurity region; 122: metal layer; 124: metal compound region; 126: interlayer insulating layer; 128: interlayer insulating layer; 130a: source or drain electrode; 130b: source or drain electrode; 130c: electrode; 132: insulating layer; 134: conductive layer; 136a: electrode; 136b: electrode; 136c: electrode; 136d: gate electrode; 138: gate insulating layer 140: oxide semiconductor layer: 142a: source or drain electrode; 142b: source or drain electrode; 144: protective insulating layer; 146: interlayer insulating layer; 148: conductive layer; 150a: electrode; 150b: electrode; 150c: electrode; 150d: electrode; 150e: electrode; 152: insulating layer; 154a: electrode; 154b: electrode; 154c: electrode; 154d: electrode; 160: transistor; 162: transistor; 200: memory cell; 201: transistor; 202: transistor; 203: transistor; 204: capacitor; 205: capacitor; 210: memory cell array; 211: reading circuit; 212: signal line driver circuit; 213: driver circuit; 214: potential generating circuit; 215: decoder; 216: transistor; 217: transistor; 218: transistor; 219: logic circuit; 220: analogue buffer; 221: reading circuit; 222: reading circuit; 223: bias circuit; 224: bias circuit; 225: reference cell; 225a: reference cell; 225b: reference cell; 225c: reference cell; 231: reading circuit; 232: reading circuit; 233: driver circuit; 240: memory cell; 301: main body; 302: housing; 303: display portion; 304: keyboard; 311: main body; 312: stylus; 313: display portion; 314: operation button; 315: external interface; 320: e-book reader; 321: housing; 323: housing; 325: display portion; 327: display portion; 331: power button; 333: operation key; 335: speaker 337: hinge unit; 340: housing; 341: housing; 342: display panel; 343: speaker; 344: microphone; 345: operation key; 346: pointing device; 347: camera lens; 348: external connection terminal; 349: solar cell; 350: external memory slot; 361: main body; 363: eyepiece; 364: operation switch; 365: display portion B; 366: battery; 367: display portion A; 370: television set; 371: housing; 373: display portion; c375: stand; 377: display portion; 379: operation key; and 380: remote controller.

The invention claimed is:

1. A method for driving a semiconductor device comprising:
   a first line;
   a second line;
   a memory cell;

a first circuit electrically connected to the first line; and
a second circuit electrically connected to the second line,
the method comprising a writing step and a reading step, the writing step comprising steps of:
selecting one of a plurality of writing potentials; and
outputting the one of the plurality of wiring potentials to the first line, and the reading step comprising a step of:
comparing a potential of the second line and a plurality of reference potentials, wherein the memory cell comprises:
a first transistor including a first gate, a first source and a first drain;
a second transistor including a second gate, a second source and a second drain; and
a third transistor including a third gate, a third source and a third drain,
wherein the second transistor includes an oxide semiconductor layer,
wherein the first gate and one of the second source and the second drain are electrically connected to each other,
wherein the first drain and the third source are electrically connected to each other,
wherein the second line and the third drain are electrically connected to each other, and
wherein the first line and the other of the second source and the second drain are electrically connected to each other.

2. The method according to claim 1, wherein the memory cell further comprises a capacitor electrically connected to the first gate.

3. The method according to claim 1, the semiconductor device further comprises a third circuit,
the method further comprising:
generating and supplying the plurality of writing potentials to the first circuit; and
generating and supplying the plurality of reference potentials to the second circuit.

4. The method according to claim 1, wherein the oxide semiconductor layer includes In, Ga and Zn.

5. The method according to claim 1, wherein the oxide semiconductor layer includes a crystal of $In_2Ga_2ZnO_7$.

6. The method according to claim 1, wherein a hydrogen concentration of the oxide semiconductor layer is less than or equal to $5\times10^{19}$ atoms/cm$^3$.

7. The method according to claim 1, wherein off current of the second transistor is less than or equal to $1\times10^{-13}$ A.

8. A method for driving a semiconductor device comprising:
a first line;
a second line;
a memory cell;
a first circuit electrically connected to the first line; and
a second circuit electrically connected to the second line,
the method comprising a writing step and a reading step, the writing step comprising steps of:
selecting one of a plurality of writing potentials; and
outputting the one of the plurality of wiring potentials to the first line, and the reading step comprising a step of:
comparing a potential of the second line and a plurality of reference potentials, wherein the memory cell comprises:
a first transistor including a first gate, a first source and a first drain;
a second transistor including a second gate, a second source and a second drain; and
a capacitor,
wherein the second transistor includes an oxide semiconductor layer,
wherein the first gate and one of the second source and the second drain are electrically connected to each other,
wherein the first gate and one electrode of the capacitor are electrically connected to each other,
wherein the second line and the first drain are electrically connected to each other, and
wherein the first line and the other of the second source and the second drain are electrically connected to each other.

9. The method according to claim 8, wherein the memory cell further comprises a third circuit,
the method further comprising:
generating and supplying the plurality of writing potentials to the first circuit; and
generating and supplying the plurality of reference potentials to the second circuit.

10. The method according to claim 8, wherein the oxide semiconductor layer includes In, Ga and Zn.

11. The method according to claim 8, wherein the oxide semiconductor layer includes a crystal of $In_2Ga_2ZnO_7$.

12. The method according to claim 8, wherein a hydrogen concentration of the oxide semiconductor layer is less than or equal to $5\times10^{19}$ atoms/cm$^3$.

13. The method according to claim 8, wherein off current of the second transistor is less than or equal to $1\times10^{-13}$ A.

14. A method for driving a semiconductor device comprising:
a first line;
a second line;
a third line;
a plurality of memory cells electrically connected to each other in parallel between the second line and the third line;
a first circuit electrically connected to the first line; and
a second circuit electrically connected to the second line,
the method comprising a writing step and a reading step, the writing step comprising steps of:
selecting one of a plurality of writing potentials; and
outputting the one of the plurality of wiring potentials to the first line, and the reading step comprising a step of:
comparing a potential of the second line and a plurality of reference potentials,
wherein one of the plurality of memory cells comprises:
a first transistor including a first gate, a first source and a first drain;
a second transistor including a second gate, a second source and a second drain; and
a capacitor,
wherein the second transistor includes an oxide semiconductor layer,
wherein the first gate and one of the second source and the second drain are electrically connected to each other,
wherein the first gate and one electrode of the capacitor are electrically connected to each other,
wherein the second line and the first drain are electrically connected to each other, and
wherein the first line and the other of the second source and the second drain are electrically connected to each other.

15. The method according to claim 14, wherein the one of the plurality of memory cells further comprises a third circuit,
the method further comprising:
generating and supplying the plurality of writing potentials to the first circuit; and
generating and supplying the plurality of reference potentials to the second circuit.

16. The method according to claim 14, wherein the oxide semiconductor layer includes In, Ga and Zn.

17. The method according to claim 14, wherein the oxide semiconductor layer includes a crystal of $In_2Ga_2ZnO_7$.

18. The method according to claim 14, wherein a hydrogen concentration of the oxide semiconductor layer is less than or equal to $5 \times 10^{19}$ atoms/cm$^3$.

19. The method according to claim 14, wherein off current of the second transistor is less than or equal to $1 \times 10^{-13}$ A.

* * * * *

UNITED STATES PATENT AND TRADEMARK OFFICE
CERTIFICATE OF CORRECTION

PATENT NO. : 8,811,067 B2
APPLICATION NO. : 14/183644
DATED : August 19, 2014
INVENTOR(S) : Shunpei Yamazaki, Jun Koyama and Kiyoshi Kato It is certified that error appears in the above-identified patent and that said Letters Patent is hereby corrected as shown below:

In the Specification

Column 1, Line 18 – after "thereof" insert --.--;

Column 1, Line 36 – after "stored" delete ",";

Column 2, Line 14 – after "increased" replace "," with --.--;

Column 6, Line 35 – after "device" replace ":" with --;--;

Column 8, Line 50 – after "state" replace ":" with --;--;

Column 9, Line 41 – replace "130a" with --130c--;

Column 10, Line 4 – replace "136e" with --136c--;

Column 11, Line 15 – after "conductivity" insert --,--;

Column 14, Line 6 – replace "3D" with --5D--;

Column 14, Line 54 – replace "136e" with --136c--;

Column 15, Line 43 – replace "ease" with --case--;

Column 16, Line 2 – replace "In-Sn-Zn-U" with --In-Sn-Zn-O--;

Column 16, Line 15 – replace "In-Ga-Zn-U" with --In-Ga-Zn-O--;

Column 16, Lines 36-37 – replace "InzO$_3$: Ga$_2$O: ZnO" with --In$_2$O$_3$: Ga$_2$O$_3$: ZnO--;

Column 17, Line 39 – after "layer" insert --,--;

Column 17, Line 56 – after "method" insert --,--;

Column 18, Line 7 – replace "3000°C" with --300°C--;

Column 19, Line 1 – replace "an" with --nm--;

Column 21, Line 56 – replace "2500°C" with --250°C--;

Column 23, Line 55 – after "maximum" replace ":" with --;--;

Column 25, Line 50 – replace "cV" with --eV--;

Column 26, Line 17 – replace "1.00" with --100--;

Signed and Sealed this
Nineteenth Day of May, 2015

Michelle K. Lee
*Director of the United States Patent and Trademark Office*

CERTIFICATE OF CORRECTION (continued)
U.S. Pat. No. 8,811,067 B2

Column 27, Line 27 – replace "50c" with --150c--;

Column 27, Line 28 – replace "150c" with --150e--;

Column 28, Line 30 – after "electrode" replace ";" with --,--;

Column 30, Line 58 – replace "S" with --S1--;

Column 30, Line 58 – replace "o [V]" with --$V_{00}$ [V]--;

Column 31, Line 34 – replace "in" with --m--;

Column 31, Line 47 – after "SL" replace "(a)" with --(n)--;

Column 31, Line 66 to Column 32, Line 1 – replace "dc-asserted" with --de-asserted--;

Column 32, Line 6 – replace "dc-asserted" with --de-asserted--;

Column 32, Line 18 – after "$V_w$" delete ",";

Column 32, Line 44 – after "219" replace "," with --.--;

Column 33, Line 12 – replace "$C_{pc}$" with --$V_{pc}$--;

Column 33, Line 57 – replace "T2" with --V2--;

Column 36, Line 22 – replace "in" with --m--;

Column 37, Line 24 – replace "RE" with --RE0--;

Column 37, Line 55 – after "$V_{pc}$" delete ",";

Column 38, Line 11 – replace "QA" with --$\phi$A--;

Column 38, Line 26 – replace "225e" with --255c--;

Column 39, Line 54 – replace "V" with --$V_{pc}$--;

Column 40, Line 50 – after "off" replace ":" with --;--;

Column 41, Line 65 – replace "V—WL" with --$V_{WL}$--;

Column 42, Line 15 – after "state" replace ":" with --;--;

Column 42, Line 23 – before "bit" replace "a" with --n--;

Column 42, Line 26 – after "of" replace "in" with --m--;

Column 42, Line 26 – replace "(in" with --(m--;

Column 42, Line 34 – replace "min" with --m--;

Column 42, Line 37 – after "WL (i)" insert --,--;

Column 42, Line 41 – replace "WL (i)" with --WL (1)--; and

Column 43, Lines 17-18 – replace "dc-asserted" with --de-asserted--.